(12) United States Patent
Wakita et al.

(10) Patent No.: US 12,271,830 B2
(45) Date of Patent: Apr. 8, 2025

(54) LEARNED MODEL GENERATING METHOD, ABNORMALITY FACTOR ESTIMATING DEVICE, SUBSTRATE PROCESSING DEVICE, ABNORMALITY FACTOR ESTIMATING METHOD, LEARNING METHOD, LEARNING DEVICE, AND LEARNING DATA GENERATING METHOD

(71) Applicant: SCREEN Holdings Co., Ltd., Kyoto (JP)

(72) Inventors: Asuka Wakita, Kyoto (JP); Naoki Sawazaki, Kyoto (JP); Takashi Ota, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 1079 days.

(21) Appl. No.: 17/185,981

(22) Filed: Feb. 26, 2021

(65) Prior Publication Data
US 2021/0304032 A1   Sep. 30, 2021

(30) Foreign Application Priority Data
Mar. 24, 2020   (JP) .................. 2020-052983

(51) Int. Cl.
*G06N 5/04*   (2023.01)
*G06N 20/00*   (2019.01)
*H01L 21/67*   (2006.01)

(52) U.S. Cl.
CPC ............... *G06N 5/04* (2013.01); *G06N 20/00* (2019.01); *H01L 21/67253* (2013.01)

(58) Field of Classification Search
CPC ................................................. H01L 21/67253
See application file for complete search history.

(56) References Cited

U.S. PATENT DOCUMENTS

| | | |
|---|---|---|
| 7,257,457 B2 | 8/2007 | Imai et al. |
| 9,135,103 B2 | 9/2015 | Huang et al. |
| 10,041,844 B1 | 8/2018 | Brady et al. |
| 10,650,910 B2 | 5/2020 | Jeong et al. |

(Continued)

FOREIGN PATENT DOCUMENTS

| | | |
|---|---|---|
| CN | 1476051 | 2/2004 |
| CN | 109558293 | 4/2019 |

(Continued)

*Primary Examiner* — Nathan L Laughlin
(74) *Attorney, Agent, or Firm* — JCIPRNET

(57) ABSTRACT

A learned model generating method includes: acquiring learning data; and generating a learned model for estimating a factor of an abnormality of a processing target substrate after processing using a processing fluid by performing machine learning of the learning data. The learning data includes a feature quantity and abnormality factor information. The abnormality factor information represents a factor of an abnormality of a learning target substrate after processing using the processing fluid. The feature quantity includes first feature quantity information representing a feature of a time transition of section data in time series data representing a physical quantity of an object used by a (Continued)

substrate processing device that processes the learning target substrate using the processing fluid. The first feature quantity information is represented using times.

19 Claims, 23 Drawing Sheets

(56) References Cited

U.S. PATENT DOCUMENTS

| | | |
|---|---|---|
| 10,795,346 B2 | 10/2020 | Yennie et al. |
| 10,817,394 B2 | 10/2020 | Oba |
| 10,969,773 B2 | 4/2021 | Yennie et al. |
| 11,039,226 B2 | 6/2021 | Fleishman |
| 11,049,743 B2 | 6/2021 | Oka |
| 11,099,105 B2 | 8/2021 | Naohara et al. |
| 11,574,821 B2 | 2/2023 | Sasaki |
| 11,592,800 B2 | 2/2023 | Yoshida et al. |
| 11,598,007 B2 | 3/2023 | Akashi et al. |
| 2003/0023340 A1 | 1/2003 | Kitamoto et al. |
| 2006/0206229 A1 | 9/2006 | Kitamoto et al. |
| 2006/0241803 A1 | 10/2006 | Kitamoto et al. |
| 2007/0010906 A1 | 1/2007 | Abe |
| 2007/0095799 A1 | 5/2007 | Matsuzawa et al. |
| 2009/0059217 A1* | 3/2009 | Okita ............... G03F 7/70991 356/237.5 |
| 2017/0103174 A1 | 4/2017 | Kim et al. |
| 2018/0286720 A1 | 10/2018 | Takenaga et al. |
| 2019/0121237 A1 | 4/2019 | Nurani et al. |
| 2019/0171181 A1 | 6/2019 | Nurani et al. |
| 2019/0242789 A1 | 8/2019 | Naohara et al. |
| 2019/0252224 A1 | 8/2019 | Oka |
| 2020/0082245 A1 | 3/2020 | Hao et al. |
| 2021/0018902 A1 | 1/2021 | Yennie et al. |
| 2021/0225673 A1* | 7/2021 | Wei ................... H01L 21/67161 |

FOREIGN PATENT DOCUMENTS

| | | |
|---|---|---|
| CN | 110164746 | 8/2019 |
| CN | 110515351 | 11/2019 |
| CN | 110800087 | 2/2020 |
| CN | 110880462 | 3/2020 |
| JP | H06328034 | 11/1994 |
| JP | H07182011 | 7/1995 |
| JP | H0832281 | 2/1996 |
| JP | H10309509 | 11/1998 |
| JP | 2003022116 | 1/2003 |
| JP | 2004172204 | 6/2004 |
| JP | 2004186445 * | 7/2004 |
| JP | 2005142467 | 6/2005 |
| JP | 2006228911 | 8/2006 |
| JP | 2008041939 | 2/2008 |
| JP | 2010093047 | 4/2010 |
| JP | 2011181666 | 9/2011 |
| JP | 2012150721 | 8/2012 |
| JP | 2018107338 | 7/2018 |
| JP | 2018163978 | 10/2018 |
| JP | 2019140193 | 8/2019 |
| JP | 2019531890 | 11/2019 |
| JP | 2020031083 | 2/2020 |
| KR | 20110001109 | 1/2011 |
| KR | 20170023770 | 3/2017 |
| KR | 20190096271 | 8/2019 |
| TW | 201841549 | 11/2018 |
| TW | 201946136 | 12/2019 |
| TW | 202002120 | 1/2020 |
| WO | 2020055555 | 3/2020 |

* cited by examiner

| lot identification information | | |
|---|---|---|
| substrate identification information | | |
| YD: abnormality factor | YD1: first abnormality factor | Y101:landing defect |
| | | Y102:liquid scattering at time of nozzle switching |
| | | Y103:instable flow rate |
| | | Y104:density variation |
| | | Y105:mixing instability |
| | | Y106:coating defect |
| | | Y107:liquid fall |
| | | Y108:mixing |
| | | Y109:collection defect |
| | YD2: second abnormality factor | Y201:flow rate control valve defect |
| | | Y202:valve defect |
| | | Y203:pump pulsation |
| | | Y204:source pressure variation |
| | | Y205:flow rate meter defect |
| | | Y206:recipe defect |
| | | Y207:parameter mistake |

FIG. 17

| | | |
|---|---|---|
| lot identification information | | |
| substrate identification information | | |
| IF2: output information | QD1: first abnormality factor | Q101:landing defect |
| | | Q102:liquid scattering at time of nozzle switching |
| | | Q103:instable flow rate |
| | | Q104:density variation |
| | | Q105:mixing instability |
| | | Q106:coating defect |
| | | Q107:liquid fall |
| | | Q108:mixing |
| | | Q109:collection defect |
| | QD2: second abnormality factor | Q201:flow rate control valve defect |
| | | Q202:valve defect |
| | | Q203:pump pulsation |
| | | Q204:source pressure variation |
| | | Q205:flow rate meter defect |
| | | Q206:recipe defect |
| | | Q207:parameter mistake |

FIG. 23

LEARNED MODEL GENERATING METHOD, ABNORMALITY FACTOR ESTIMATING DEVICE, SUBSTRATE PROCESSING DEVICE, ABNORMALITY FACTOR ESTIMATING METHOD, LEARNING METHOD, LEARNING DEVICE, AND LEARNING DATA GENERATING METHOD

CROSS-REFERENCE TO RELATED APPLICATION

Priority is claimed on Japanese Patent Laid-Open No. 2020-052983, filed Mar. 24, 2020 under 35 U.S.C. 119, the content of which is incorporated herein by reference.

BACKGROUND

Technical Field

The present disclosure relates to a learned model generating method, an abnormality factor estimating device, a substrate processing device, an abnormality factor estimating method, a learning method, a learning device, and a learning data generating method.

Description of Related Art

An abnormality diagnosis system disclosed in a patent literature (Japanese Patent Laid-Open No. 2012-150721) detects an abnormality that has occurred in a resist coating/developing processing device and estimates a cause of the abnormality.

The abnormality diagnosis system is connected to sensors that are installed in a plurality of process processing devices using wires. The sensors output time series data that changes with respect to time to the abnormality diagnosis system. For example, the sensors are pressure sensors, temperature sensors, flow rate sensors, liquid level sensors, position sensors, torque sensors, or speed sensors.

The abnormality diagnosis system is composed of a data storage part, a data collecting part, an abnormality detecting part, a determination data generating part, and a diagnosis part.

In the data storage part, time series data, abnormality data, determination data, and model data are stored.

The data collecting part collects time series data that changes with time from the sensors installed in the plurality of process processing devices and stores the time series data in the data storage part. For example, the time series data is pressures, temperatures, flow rates, liquid levels, positions, torques or speeds that change with time.

The abnormality detecting part detects abnormal data that is abnormal time series data by comparing the time series data collected by the data collecting part with upper and lower variation threshold data.

The determination data generating part divides the abnormal data detected by the abnormality detecting part into a plurality of monitoring sections for each time series on the basis of the determination condition data, determines whether or not a plurality of determination conditions is satisfied in each of the monitoring sections, generates determination data formed from a combination of determination results, and stores the generated determination data in the data storage part as determination data.

The diagnosis part collates the determination data generated by the determination data generating part with model data corresponding to the determination data, thereby estimating a cause of an abnormality of the process processing device.

The model data is a result of a case in which time series data in which a specific variation trend occurs for each cause of the abnormality is determined using determination conditions at the time of generating the determination data and is stored in advance. In addition, a threshold, a range, and the like of each determination condition are determined for each monitoring section.

However, in the abnormality diagnosis system disclosed in the patent literature, there are cases in which a cause of the abnormality of the process processing device cannot be estimated with a high accuracy depending on the model data and an accuracy of the determination condition. In such cases, an inspection engineer needs to identify a cause of the abnormality of the process processing device by analyzing the time series data.

However, the time series data is very complex, and it is difficult for an inspection engineer to find regularity. In addition, the time series data has many parameters, and an analysis target is enormous. Thus, there are cases in which a long time is required for identifying a factor of the abnormality of the process processing device depending on the skill and the experience of an inspection engineer. As a result, there are cases in which a long time is required also for identifying a factor of the abnormality of a substrate processed by the process processing device.

SUMMARY

According to one aspect of the present disclosure, there is provided a learned model generating method including: acquiring learning data; and generating a learned model for estimating a factor of an abnormality of a processing target substrate after processing using a processing fluid by performing machine learning of the learning data. The learning data includes a feature quantity and abnormality factor information. The abnormality factor information represents a factor of an abnormality of a learning target substrate after processing using the processing fluid.
The feature quantity includes first feature quantity information representing a feature of a time transition of section data in time series data representing a physical quantity of an object used by a substrate processing device that processes the learning target substrate using the processing fluid. The first feature quantity information is represented using times.

In the learned model generating method according to the present disclosure, it is preferable that the abnormality factor information includes at least one of first abnormality factor information and second abnormality factor information. It is preferable that the first abnormality factor information is information relating to the processing fluid at the time of processing the learning target substrate using the substrate processing device. It is preferable that the second abnormality factor information is information relating to a component of the substrate processing device.

In the learned model generating method according to the present disclosure, it is preferable that the first feature quantity information includes at least one of first information, second information, third information, fourth information, fifth information, and sixth information. It is preferable that the first information is information representing a state of the physical quantity when the physical quantity increases toward a target value. It is preferable that the second information is information representing an overshoot of the physical quantity. It is preferable that the third information is information representing variations of the physical quantity. It is preferable that the fourth information is information representing the state of the physical quantity when the physical quantity decreases from the target value. It is preferable that, when the substrate processing device uses at least two different objects, the fifth information is information representing an overlap between the physical quantity of one object out of the two objects and the physical quantity of the other object. It is preferable that the sixth information is information representing a time interval on a time axis between the one object and the other object.

In the learned model generating method according to the present disclosure, it is preferable that the object is the processing fluid. It is preferable that the physical quantity represents a physical quantity of the processing fluid inside a discharge pipe that discharges the processing fluid.

In the learned model generating method according to the present disclosure, it is preferable that the object is the processing fluid. It is preferable that the physical quantity represents a flow rate of the processing fluid, a temperature of the processing fluid, or a density of the processing fluid.

In the learned model generating method according to the present disclosure, it is preferable that the object is a substrate holding part that rotates the learning target substrate, an arm that moves a nozzle discharging the processing fluid toward the learning target substrate, a guard that receives the processing fluid scattered from the learning target substrate, or a valve that controls a flow of the processing fluid. In a case in which the object is the substrate holding part, it is preferable that the physical quantity represents a quantity relating to an operation and/or a state of the substrate holding part. In a case in which the object is the arm, it is preferable that the physical quantity represents a quantity relating to an operation and/or a state of the arm. In a case in which the object is the guard, it is preferable that the physical quantity represents a quantity relating to an operation and/or a state of the guard. In a case in which the object is the valve, it is preferable that the physical quantity represents a quantity relating to an operation and/or a state of the valve.

In the learned model generating method according to the present disclosure, it is preferable that the object includes a blocking plate that covers an upper face of the learning target substrate with a gap interposed therebetween. In a case in which the object is the blocking plate, it is preferable that the physical quantity represents a quantity relating to an operation and/or a state of the blocking plate.

In the learned model generating method according to the present disclosure, it is preferable that the feature quantity further includes second feature quantity information. It is preferable that the second feature quantity information is processing order information representing an order of processing for a predetermined number of learning target substrates configuring one lot or lot interval information representing a time interval from the end of processing of a lot to the start of processing of a next lot.

According to another aspect of the present disclosure, there is provided an abnormality factor estimating device that estimates a factor of an abnormality of a processing target substrate after processing using a processing fluid. The abnormality factor estimating device includes a storage part and an estimation part. The storage part is configured to store a learned model that is constructed by performing machine learning of learning data. The estimation part is configured to input input information to the learned model and acquire output information from the learned model. The learning data includes a feature quantity and abnormality factor information. The abnormality factor information represents a factor of an abnormality of the learning target substrate after processing using the processing fluid. The feature quantity includes first feature quantity information representing a feature of a time transition of section data in time series data representing a physical quantity of an object used by a substrate processing device that processes the learning target substrate using the processing fluid, and the first feature quantity information is represented using times. The input information includes first input information representing a feature of a time transition of section data in the time series data representing a physical quantity of an object used by the substrate processing device that processes the processing target substrate using the processing fluid, and the first input information is represented using times. The output information represents a factor of an abnormality of the processing target substrate after processing using the processing fluid.

In the abnormality factor estimating device according to the present disclosure, it is preferable that the abnormality factor information includes at least one of first abnormality factor information and second abnormality factor information. It is preferable that the first abnormality factor information is information relating to the processing fluid at the time of processing the learning target substrate using the substrate processing device. It is preferable that the second abnormality factor information is information relating to a component of the substrate processing device that processes the learning target substrate. It is preferable that the output information includes at least one of first output information and second output information. It is preferable that the first output information is information relating to the processing fluid at the time of processing the processing target substrate using the substrate processing device. It is preferable that the second output information is information relating to a component of the substrate processing device that processes the processing target substrate.

In the abnormality factor estimating device according to the present disclosure, it is preferable that each piece of the first feature quantity information and the first input information includes at least one of first information, second information, third information, fourth information, fifth information, and sixth information. It is preferable that the first information is information representing a state of the physical quantity when the physical quantity increases toward a target value. It is preferable that the second information is information representing an overshoot of the physical quantity. It is preferable that the third information is information representing variations of the physical quantity. It is preferable that the fourth information is information representing the state of the physical quantity when the physical quantity decreases from the target value. When the substrate processing device uses at least two different objects, it is preferable that the fifth information is information representing an overlap between the physical quantity of one object out of the two objects and the physical quantity of the other object. It is preferable that the sixth information is information representing a time interval on a time axis between the one object and the other object.

In the abnormality factor estimating device according to the present disclosure, it is preferable that the object is the processing fluid. It is preferable that the physical quantity represents a physical quantity of the processing fluid inside a discharge pipe that discharges the processing fluid.

In the abnormality factor estimating device according to the present disclosure, it is preferable that the object is the processing fluid. It is preferable that the physical quantity represents a flow rate of the processing fluid, a temperature of the processing fluid, or a density of the processing fluid.

In the abnormality factor estimating device according to the present disclosure, it is preferable that the object used by the substrate processing device that processes the learning target substrate is a substrate holding part that rotates the learning target substrate, an arm that moves a nozzle discharging the processing fluid toward the learning target substrate, a guard that receives the processing fluid scattered from the learning target substrate, or a valve that controls a flow of the processing fluid. It is preferable that the object used by the substrate processing device processing the processing target substrate is a substrate holding part that rotates the processing target substrate, an arm that moves a nozzle discharging the processing fluid toward the processing target substrate, a guard that receives the processing fluid scattered from the processing target substrate, or a valve that controls a flow of the processing fluid. In a case in which the object is the substrate holding part, it is preferable that the physical quantity represents a quantity relating to an operation and/or a state of the substrate holding part. In a case in which the object is the arm, it is preferable that the physical quantity represents a quantity relating to an operation and/or a state of the arm. In a case in which the object is the guard, it is preferable that the physical quantity represents a quantity relating to an operation and/or a state of the guard. Inn a case in which the object is the valve, it is preferable that the physical quantity represents a quantity relating to an operation and/or a state of the valve.

In the abnormality factor estimating device according to the present disclosure, it is preferable that the object used by the substrate processing device that processes the learning target substrate includes a blocking plate that covers an upper face of the learning target substrate with a gap interposed therebetween. It is preferable that the object used by the substrate processing device that processes the processing target substrate includes a blocking plate that covers an upper face of the processing target substrate with a gap interposed therebetween. In a case in which the object is the blocking plate, it is preferable that the physical quantity represents a quantity relating to an operation and/or a state of the blocking plate.

In the abnormality factor estimating device according to the present disclosure, it is preferable that the feature quantity further includes second feature quantity information. It is preferable that the second feature quantity information is processing order information representing an order of processing for a predetermined number of learning target substrates configuring one lot or lot interval information representing a time interval from the end of processing of a lot to the start of processing of a next lot. It is preferable that the input information further includes second input information relating to the processing target substrate. It is preferable that the second input information is processing order information representing an order of processing for a predetermined number of processing target substrates configuring one lot or lot interval information representing a time interval from the end of processing of a lot to the start of processing of a next lot.

According to yet another aspect of the present disclosure, there is provided a substrate processing device including: the abnormality factor estimating device described above and a processing device configured to process a substrate.

According to yet another aspect of the present disclosure, there is provided an abnormality factor estimating method for estimating a factor of an abnormality of a processing target substrate after processing using a processing fluid.

The abnormality factor estimating method includes: acquiring input information; and inputting the input information to a learned model that is constructed by performing machine learning of learning data and acquiring output information from the learned model. The learning data includes a feature quantity and abnormality factor information. The abnormality factor information represents a factor of an abnormality of a learning target substrate after processing using the processing fluid. The feature quantity includes feature quantity information representing a feature of a time transition of section data in time series data representing a physical quantity of an object used by a substrate processing device that processes the learning target substrate using the processing fluid, and the feature quantity information is represented using times. The input information includes information representing a feature of a time transition of section data in the time series data representing the physical quantity of the object used by the substrate processing device that processes the processing target substrate using the processing fluid, and the information is represented using times. The output information represents a factor of an abnormality of the processing target substrate after processing using the processing fluid.

According to yet another aspect of the present disclosure, there is provided a learning method including: acquiring learning data; and performing machine learning of the learning data. The learning data includes a feature quantity and abnormality factor information. The abnormality factor information represents a factor of an abnormality of a learning target substrate after processing using a processing fluid. The feature quantity includes feature quantity information representing a feature of a time transition of section data in time series data representing a physical quantity of an object used by a substrate processing device that processes the learning target substrate using the processing fluid. The feature quantity information is represented using times.

According to yet another aspect of the present disclosure, there is provided a learning device including a storage part and a learning part.

The storage part is configured to store learning data. The learning part is configured to performing machine learning of the learning data.

The learning data includes a feature quantity and abnormality factor information. The abnormality factor information represents a factor of an abnormality of a learning target substrate after processing using a processing fluid. The feature quantity includes feature quantity information representing a feature of a time transition of section data in time series data representing a physical quantity of an object used by a substrate processing device that processes the learning target substrate using the processing fluid. The feature quantity information is represented using times.

According to yet another aspect of the present disclosure, there is provided a learning data generating method including: acquiring at least one piece of section data from time series data representing a physical quantity of an object used by a substrate processing device that processes a learning target substrate using a processing fluid; calculating feature quantity information representing a feature of a time transition of the section data; and performing control of a storage part such that the feature quantity information is stored in association with abnormality factor information. The abnormality factor information represents a factor of an abnormality of the learning target substrate after processing using the processing fluid. The feature quantity information is represented using times. The feature quantity information and the abnormality factor information configure learning data that is a target for machine learning.

BRIEF DESCRIPTION OF THE DRAWINGS

FIG. 17 is a diagram illustrating abnormality factor information according to this embodiment.

FIG. 23 is a diagram illustrating output information according to this embodiment.

DESCRIPTION OF THE EMBODIMENTS

Figure 1:
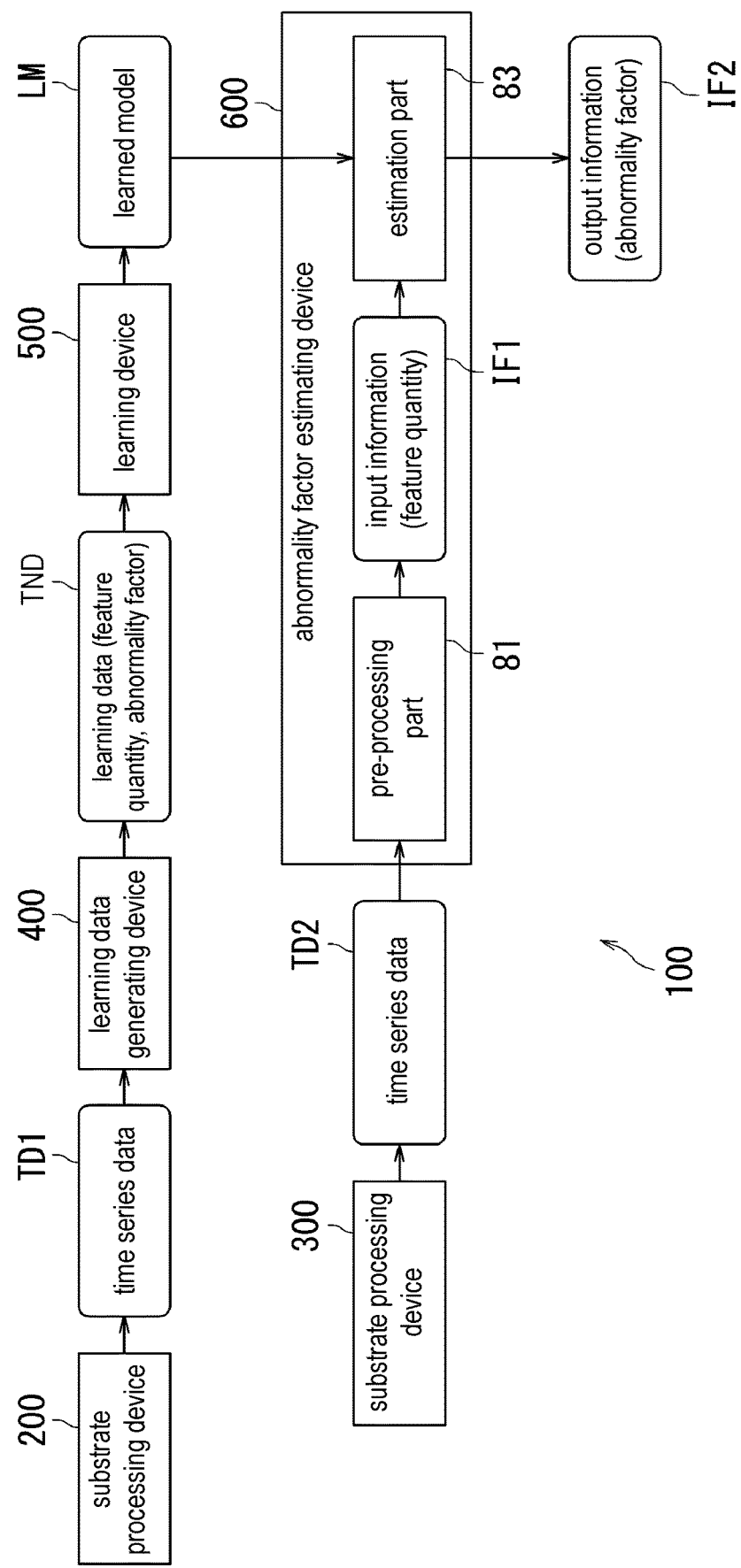
FIG. 1 is a block diagram illustrating a substrate processing system according to an embodiment of the present disclosure.

The disclosure provides a learned model generating method, an abnormality factor estimating device, a substrate processing device, an abnormality factor estimating method, a learning method, a learning device, and a learning data generating method capable of identifying a factor of the abnormality of a processing target substrate after processing using a processing fluid with high accuracy and capable of shortening a time required when a factor of the abnormality is identified.

Hereinafter, an embodiment of the present disclosure will be described with reference to the drawings. In the drawings, the same reference signs will be assigned to the same or corresponding parts, and description thereof will not be repeated. In the drawings, for easy understanding, an X axis, a Y axis, and a Z axis are appropriately illustrated. The X axis, the Y axis, and the Z axis are orthogonal to each other, the X axis and the Y axis are parallel to a horizontal direction, and the Z axis is parallel to a vertical direction. "Plan view" represents a target seen from above in the vertical direction.

A substrate processing system 100 according to an embodiment of the present disclosure will be described with reference to FIGS. 1 to 22. First, the substrate processing system 100 will be described with reference to FIG. 1.

FIG. 1 is a diagram illustrating the substrate processing system 100. As illustrated in FIG. 1, the substrate processing system 100 according to this embodiment includes a substrate processing device 200, a substrate processing device 300, a learning data generating device 400, a learning device 500, and an abnormality factor estimating device 600.

The substrate processing device 200 processes a learning target substrate using a processing fluid. For example, the processing fluid is a processing liquid or a processing gas. The substrate processing device 200 is a sheet type in which one learning target substrate is processed each time. A learning target substrate has an approximate disc shape.

The substrate processing device 300 processes a processing target substrate using a processing fluid. For example, the processing fluid is a processing liquid or a processing gas. The composition of the processing fluid used by the substrate processing device 300 is the same as that of the processing fluid used by the substrate processing device 200. The configuration of the processing target substrate is the same as that of the learning target substrate. The substrate processing device 300 is a sheet type in which one processing target substrate is processed each time. The processing target substrate has an approximate disc shape.

Hereinafter, a learning target substrate may be referred to as a "learning target substrate W1," and a processing target substrate may be referred to as a "processing target substrate W2." When the learning target substrate W1 and the processing target substrate W2 do not need to be distinguished from each other in description, the learning target substrate W1 and the processing target substrate W2 may be referred to as "substrate W."

For example, the substrate W is a semiconductor wafer, a substrate for a liquid crystal display device, a substrate for plasma display, a substrate for field emission display (FED), a substrate for an optical disc, a substrate for a magnetic disk, a substrate for a magneto-optical disk, a substrate for a photomask, a ceramic substrate, or a substrate for a solar cell.

In description presented here, the processing fluid is not particularly limited as long as it is a fluid that is in contact with the substrate W. For example, a processing liquid serving as the processing fluid is a liquid medicine or a rinse liquid.

For example, the liquid medicine is dilute hydrofluoric (DHF), hydrofluoric acid (HF), nitrohydrofluoric acid (a mixed liquid of hydrofluoric acid and nitric acid (HNO3)), buffered hydrogen fluoride (BHF), ammonium fluoride, HFEG (a mixed liquid of hydrofluoric acid and ethylene glycol), phosphoric acid (H3PO4), sulfuric acid, acetic acid, nitric acid, hydrochloric acid, ammonia water, hydrogen peroxide water, organic acid (for example, citric acid, oxalic acid), organic alkali (for example, TMAH: tetramethyl ammonium hydroxide), sulfuric acid hydrogen peroxide mixture liquid (SPM), ammonia hydrogen peroxide mixture liquid (SC1), hydrochloric acid hydrogen peroxide water mixture liquid (SC2), isopropyl alcohol (IPA), surfactant, or corrosion inhibitor.

For example, the rinse liquid is deionized water, carbonated water, electrolytic ionic water, hydrogen water, ozonated water, or hydrochloric acid water having dilution concentration (for example, about 10 ppm to 100 ppm).

For example, the processing gas as the processing fluid is a reactant gas acting with a liquid attached to the substrate W or the substrate W or an inert gas. For example, the reactant gas is an ozone gas, fluorine gas, a gas containing hydrogen fluoride, or a gas including IPA. For example, the inert gas is nitrogen, helium, or argon.

The substrate processing device 200 outputs time series data TD1. The time series data TD1 represents a physical quantity of an object used by the substrate processing device 200. For example, the object is a processing fluid or a component of the substrate processing device 200. The component includes not only a hardware component but also a software component. Details of the object and the physical quantity will be described below.

The learning data generating device 400 generates learning data TND on the basis of the time series data TD1. Then, the learning data generating device 400 outputs the learning data TND. The learning data TND is a target for machine learning using the learning device 500. The learning data TND includes a feature quantity relating to the processing of the learning target substrate W1 and abnormality factor information relating to the processing of the learning target substrate W1. The abnormality factor information represents factors of abnormalities of the learning target substrate W1 after processing using the processing fluid. The feature quantity is an explanatory variable, and the abnormality factor information is an objective variable. Details of the feature quantity and the abnormality factor information will be described below.

The learning device 500 generates a learned model LM by performing machine learning of the learning data TND. Then, the learning device 500 outputs the learned model LM. The learned model LM estimates factors of abnormalities of the processing target substrate W2 after processing using the processing fluid in the substrate processing device 300. More specifically, the learned model LM is a computer program performing arithmetic operations from an input to an output. The computer program configuring the learned model LM includes a plurality of parameters (for example, a plurality of weighting coefficients) used for arithmetic operations.

The substrate processing device 300 outputs time series data TD2. The time series data TD2 represents physical quantities of an object used by the substrate processing device 300. For example, the object is a processing fluid or a component of the substrate processing device 300. The component includes not only a hardware component but also a software component. Details of the object and the physical quantities will be described below.

In the definition of the time series data TD2, an object used by the substrate processing device 300 corresponds to an object used by the substrate processing device 200. Thus, the configuration of the object used by the substrate processing device 300 is the same as the configuration of the object used by the substrate processing device 200. In the definition of the time series data TD2, the physical quantity of the object used by the substrate processing device 300 corresponds to the physical quantity of the object used by the substrate processing device 200. Thus, the physical quantity of the object used by the substrate processing device 300 is the same as the physical quantity of the object used by the substrate processing device 200.

The abnormality factor estimating device 600 estimates a factor of an abnormality of the processing target substrate W2 after processing using the processing fluid in the substrate processing device 300 on the basis of the time series data TD2 using the learned model LM.

More specifically, the abnormality factor estimating device 600 includes a pre-processing part 81 and an estimation part 83.

The pre-processing part 81 generates input information IF1 on the basis of the time series data TD2. Then, the pre-processing part 81 outputs the input information IF1. The input information IF1 includes a feature quantity relating to the processing of the processing target substrate W2. The feature quantity is an explanatory variable. The feature quantity of the input information IF1 is information that corresponds to the feature quantity of the learning data TND. Details of the feature quantity will be described below.

The estimation part 83 inputs the input information IF1 to the learned model LM. Then, the learned model LM estimates a factor of an abnormality of the processing target substrate W2 after processing using the processing fluid in the substrate processing device 300 on the basis of the feature quantity included in the input information IF1 and outputs output information IF2. The estimation part 83 acquires the output information IF2 from the learned model LM and outputs the output information IF2. The output information IF2 includes abnormality factor information relating to the processing of the processing target substrate W2. The abnormality factor information represents a factor of an abnormality of the processing target substrate W2 after processing using the processing fluid. The abnormality factor information is an objective variable. The abnormality factor information of the output information IF2 is information that corresponds to the abnormality factor information of the learning data TND. Details of the abnormality factor information will be described below.

As described above with reference to FIG. 1, according to this embodiment, the learning device 500 performs machine learning. Thus, the learning device 500 can find a regularity from time series data TD1 that is very complex and has an enormous analysis target and generate a learned model LM having high accuracy. Then, the abnormality factor estimating device 600 causes the learned model LM to output the output information IF2 including the abnormality factor information by inputting input information IF1 including the feature quantity based on the time series data TD2 to the learned model LM. Thus, a factor of an abnormality of the processing target substrate W2 after processing using the processing fluid can be identified with high accuracy, and a time required for identifying the factor of the abnormality can be shortened.

Here, in description presented here, an "object" represents "an object used by the substrate processing device 200" or "an object used by the substrate processing device 300." In addition, "a physical quantity" represents "a physical quantity of an object." Details of the "object" and the "physical quantity" will be described below Next, the substrate processing device 200 will be described with reference to FIGS. 2 to 7. A substrate W that is processed by the substrate processing device 200 is a "learning target substrate W1." The configuration and the operation of the substrate processing device 300 are similar to those of the substrate processing device 200. Thus, description of the substrate processing device 200 presented with reference to FIGS. 2 to 7 can be incorporated in the description of the substrate processing device 300. In this case, a substrate W processed by the substrate processing device 300 is a "processing target substrate W2."

Figure 2:
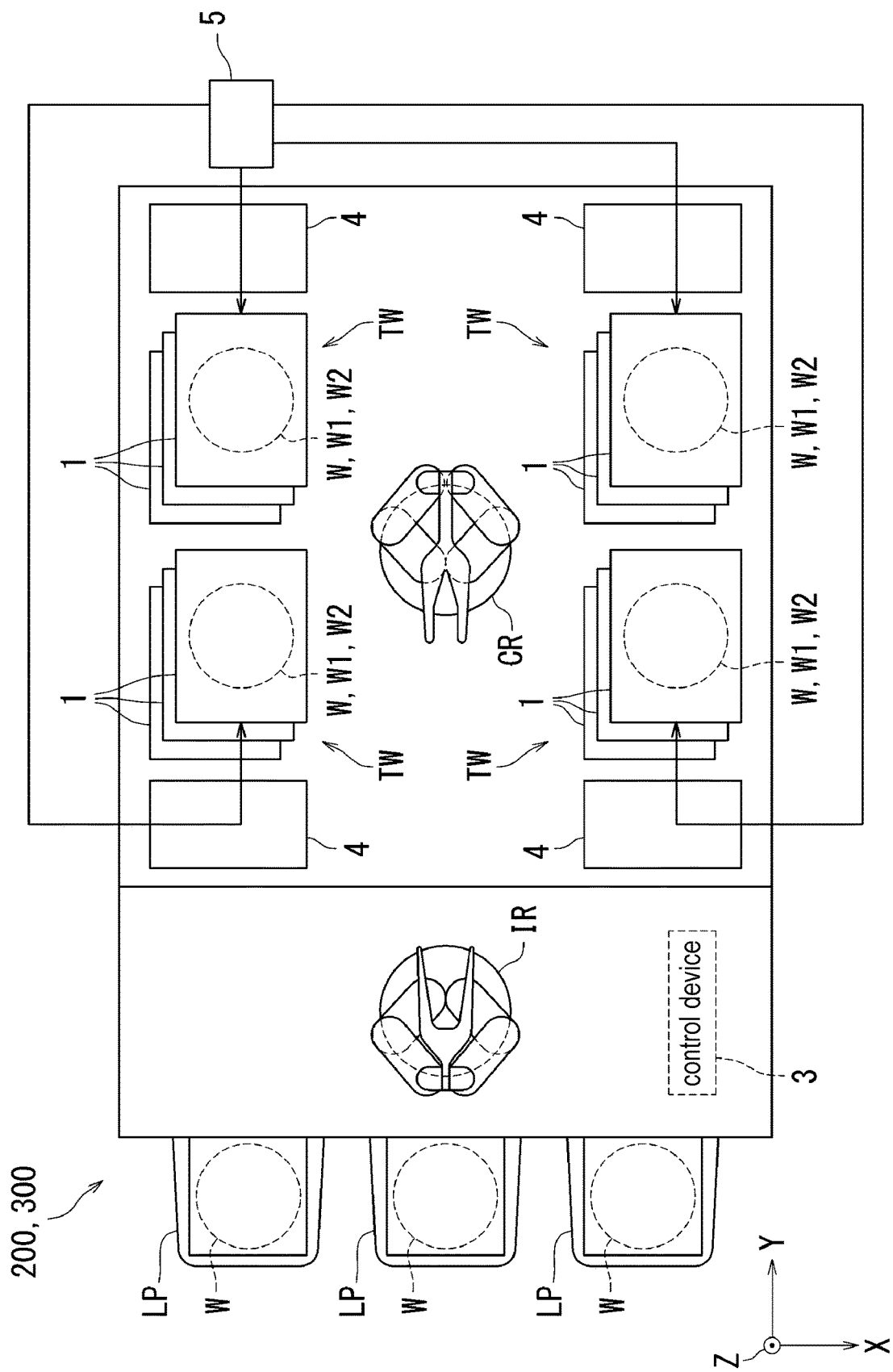
FIG. 2 is a schematic plan view illustrating a substrate processing device according to this embodiment.

FIG. 2 is a schematic plan view illustrating the substrate processing device 200. As illustrated in FIG. 2, the substrate processing device 200 includes a plurality of load ports LP, an indexer robot IR, a center robot CR, a plurality of processing devices 1, a control device 3, a plurality of processing fluid boxes 4, and a processing fluid cabinet 5. The control device 3 controls the load ports LP, the indexer robot IR, the center robot CR, and the processing device 1.

Each of the load ports LP houses a plurality of substrates W with being stacked. The indexer robot IR conveys substrates W between the load ports LP and the center robot CR. The center robot CR conveys a substrate W between the indexer robot IR and the processing device 1. Each of the processing devices 1 processes a substrate W by supplying a processing fluid to the substrate W. Each of the processing fluid boxes 4 houses a fluid device. The processing fluid cabinet 5 houses the processing fluid.

More specifically, the plurality of the processing devices 1 form a plurality of towers TW (in this embodiment, four towers TW) disposed to surround the center robot CR in the plan view. Each of the towers TW includes a plurality of processing devices (in this embodiment, three processing devices 1) that are vertically stacked. The plurality of processing fluid boxes 4 respectively correspond to the plurality of towers TW. The processing fluid inside the processing fluid cabinet 5 is supplied through one processing fluid box 4 to all the processing devices 1 included in the tower TW corresponding to the processing fluid box 4.

Figure 3:
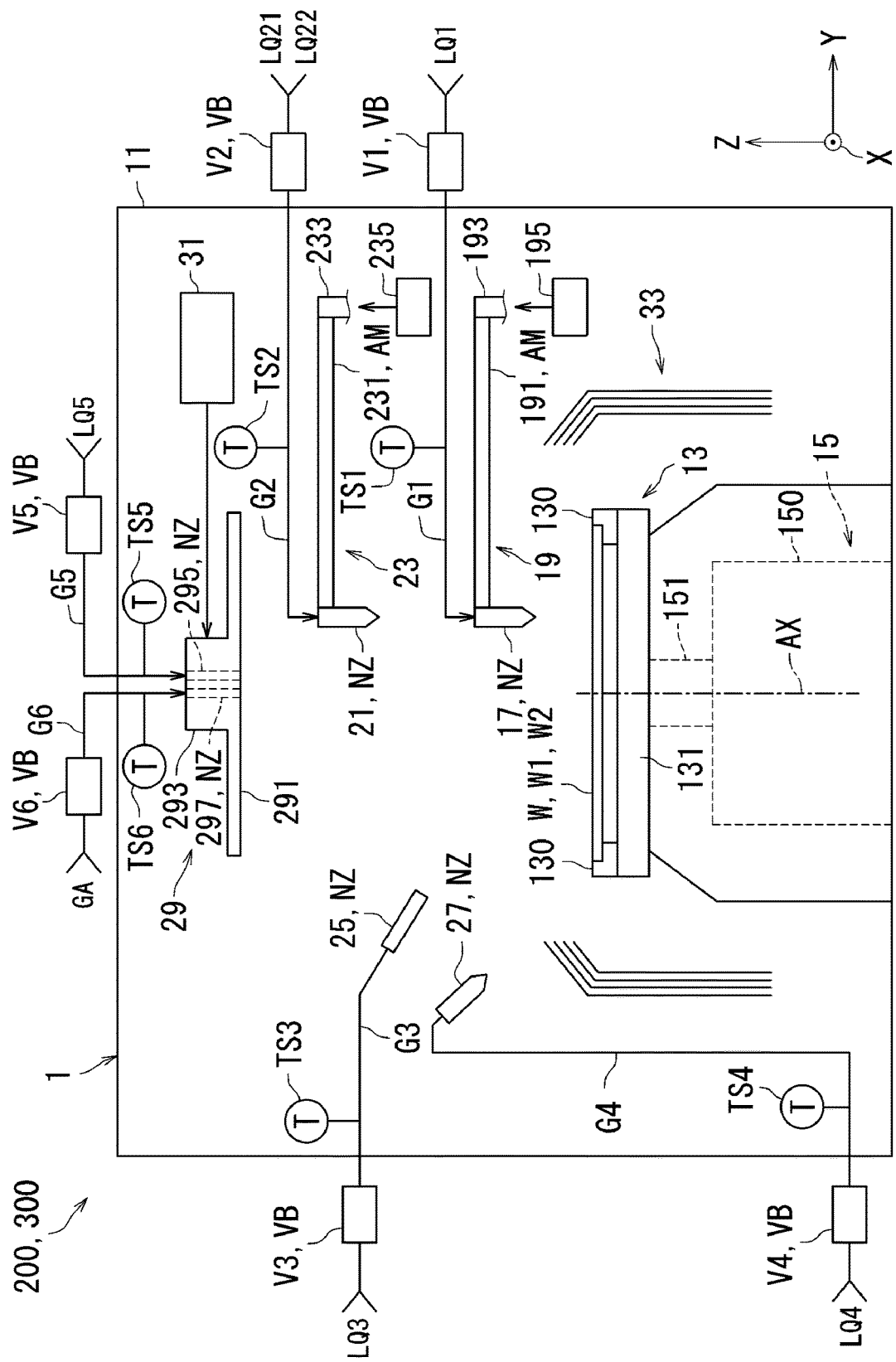
FIG. 3 is a schematic cross-sectional view illustrating a processing device of a substrate processing device according to this embodiment.

FIG. 3 is a schematic cross-sectional view illustrating the processing device 1. As illustrated in FIG. 3, the processing device 1 processes a substrate W using a processing fluid. More specifically, the processing device 1 is a sheet type in which one substrate W is processed each time.

In FIG. 3, as examples of the processing fluid, a processing liquid LQ1, a mixture liquid of a processing liquid LQ21 and a processing liquid LQ22, a processing liquid LQ3, a processing liquid LQ4, a processing liquid LQ5, and an inert gas GA are illustrated. The processing liquid LQ21 and the processing liquid LQ22 are different from each other. For example, each of the processing liquids LQ1 to LQ5, LQ21, and LQ22 is the liquid medicine or the rinse liquids described above as an example. For example, the inert gas GA is the inert gas described above as an example. In addition, the substrate processing device 200 further includes fluid supply parts V1, V2, V3, V4, V5, and V6, pipes G1, G2, G3, G4, G5, and G6, and temperature sensors TS1, TS2, TS3, TS4, TS5, and TS6 for each processing device 1.

The processing device 1 includes a chamber 11, a spin chuck 13, a spin motor 15, a nozzle 17, a nozzle moving part 19, a nozzle 21, a nozzle moving part 23, a nozzle 25, a nozzle 27, a fluid supply unit 29, a unit operating part 31, and a plurality of guards 33 (in this embodiment, four guards 33).

The chamber 11 has an approximate box shape. The chamber 11 houses the substrate W, the spin chuck 13, the spin motor 15, the nozzle 17, the nozzle moving part 19, the nozzle 21, the nozzle moving part 23, the nozzle 25, the nozzle 27, the fluid supply unit 29, the unit operating part 31, the plurality of guards 33, and the temperature sensors TS1 to TS6. In addition, the chamber 11 houses a part of each of the pipes G1, G2, G3, G4, G5, and G6.

The spin chuck 13 rotates with a substrate W held. The spin chuck 13 corresponds to an example of "a substrate holding part." More specifically, the spin chuck 13 rotates a substrate W around a rotation axial line AX while horizontally holding the substrate W inside the chamber 11.

The spin chuck 13 includes a plurality of chuck members 130 and a spin base 131. The plurality of chuck members 130 are disposed in the spin base 131. The plurality of chuck members 130 holds a substrate W in a horizontal posture. The spin base 131 has an approximate disc shape and supports the plurality of chuck members 130 in a horizontal posture. The spin motor 15 rotates the spin base 131 around the rotation axial line AX. Thus, the spin base 131 rotates around the rotation axial line AX. As a result, the substrate W held in the plurality of chuck members 130 disposed in the spin base 131 rotates around the rotation axial line AX. More specifically, the spin motor 15 includes a motor main body 150 and a shaft 151. The shaft 151 is combined in the spin base 131. The motor main body 150 rotates the spin base 131 by rotating the shaft 151.

The nozzle 17 discharges the processing liquid LQ1 toward a substrate W during rotation of the substrate W. The pipe G1 supplies the processing liquid LQ1 to the nozzle 17. The fluid supply part V1 adjusts supply of the processing liquid LQ1 to the nozzle 17. The temperature sensor TS1 detects a temperature of the processing liquid LQ1 flowing through the pipe G1 and outputs a detection signal indicating the temperature. For example, the temperature sensor TS1 includes a thermocouple.

The nozzle moving part 19 moves the nozzle 17 in an approximately vertical direction and an approximately horizontal direction. More specifically, the nozzle moving part 19 includes an arm 191, a rotation shaft 193, and a nozzle moving mechanism 195. The arm 191 extends in an approximately horizontal direction. The nozzle 17 is disposed at a front end of the arm 191. The arm 191 is combined in the rotation shaft 193. The rotation shaft 193 extends in an approximately vertical direction. The nozzle moving mechanism 195 rotates the arm 191 along an approximately horizontal plane by rotating the rotation shaft 193 around a rotation axis line in an approximately vertical direction. As a result, the nozzle 17 moves along an approximately horizontal plane. In addition, the nozzle moving mechanism 195 raises or lowers the arm 191 by raising or lowering the rotation shaft 193 in an approximately vertical direction. As a result, the nozzle 17 moves in an approximately vertical direction. For example, the nozzle moving mechanism 195 includes a ball screw mechanism and an electric motor that applies a drive force to the ball screw mechanism.

The nozzle 21 discharges the mixture liquid of the processing liquid LQ21 and the processing liquid LQ22 toward a substrate W during rotation of the substrate W. The pipe G2 supplies the mixture liquid to the nozzle 21. The fluid supply part V2 adjusts supply of the mixture liquid to the nozzle 21. The temperature sensor TS2 detects a temperature of the mixture liquid flowing through the pipe G2 and outputs a detection signal indicating the temperature. For example, the temperature sensor TS2 includes a thermocouple.

The nozzle moving part 23 moves the nozzle 21 in an approximately vertical direction and an approximately horizontal direction. More specifically, the nozzle moving part 23 includes an arm 231, a rotation shaft 233, and a nozzle moving mechanism 235. The arm 231 extends in an approximately horizontal direction. The nozzle 21 is disposed at a front end of the arm 231. The arm 231 is combined in the rotation shaft 233. The rotation shaft 233 extends in an approximately vertical direction. The nozzle moving mechanism 235 rotates the arm 231 along an approximately horizontal plane by rotating the rotation shaft 233 around a rotation axis line in an approximately vertical direction. As a result, the nozzle 21 moves along an approximately horizontal plane. In addition, the nozzle moving mechanism 235 raises or lowers the arm 231 by raising or lowering the rotation shaft 233 in an approximately vertical direction. As a result, the nozzle 21 moves in an approximately vertical direction. For example, the nozzle moving mechanism 235 includes a ball screw mechanism and an electric motor that applies a drive force to the ball screw mechanism.

The nozzle 25 discharges the processing liquid LQ3 toward a substrate W during rotation of the substrate W. The pipe G3 supplies the processing liquid LQ3 to the nozzle 25. The fluid supply part V3 adjusts supply of the processing liquid LQ3 to the nozzle 25. The temperature sensor TS3 detects a temperature of the processing liquid LQ3 flowing through the pipe G3 and outputs a detection signal indicating the temperature. For example, the temperature sensor TS3 includes a thermocouple.

The nozzle 27 discharges the processing liquid LQ4 toward the chuck member 130 during rotation of the substrate W. The pipe G4 supplies the processing liquid LQ4 to the nozzle 27. The fluid supply part V4 adjusts supply of the processing liquid LQ4 to the nozzle 27. The temperature sensor TS4 detects a temperature of the processing liquid LQ4 flowing through the pipe G4 and outputs a detection signal indicating the temperature. For example, the temperature sensor TS4 includes a thermocouple.

The fluid supply unit 29 is positioned above the spin chuck 13. The fluid supply unit 29 includes a blocking plate 291, a spindle 293, a nozzle 295, and a nozzle 297.

For example, the blocking plate 291 is an approximate disc shape. The blocking plate 291 is disposed such that a lower face of the blocking plate 291 is approximately horizontal. The blocking plate 291 is disposed such that a center axial line of the blocking plate 291 is positioned on the rotation axial line AX. A lower face of the blocking plate 291 faces a substrate W that is held in the spin chuck 13. The blocking plate 291 is connected to a lower end of the spindle 293 in a horizontal posture.

The unit operating part 31 raises or lowers the fluid supply unit 29 between a close position and a retreat position. The close position indicates a position at which the blocking plate 291 is lowered and becomes close to an upper face of the substrate W with a predetermined gap interposed therebetween. At the close position, the blocking plate 291 covers the surface of the substrate W and blocks an upper side of the surface of the substrate W. In other words, at the close position, the blocking plate 291 faces the surface of the substrate W and covers the upper side of the surface of the substrate W. The retreat position is disposed on the upper side of the close position and represents a position at which the blocking plate 291 is raised and is separated from the substrate W. In FIG. 3, the blocking plate 291 is located at the retreat position. The unit operating part 31 rotates the fluid supply unit 29 at the close position. For example, the unit operating part 31 includes a ball screw mechanism and a lifting/lowering motor that applies a drive force to the ball screw mechanism. For example, the lifting/lowering motor is a servo motor. For example, the unit operating part 31 includes a motor and a transmission mechanism that transmits rotation of the motor to the fluid supply unit 29.

The nozzles 295 and 297 of the fluid supply unit 29 are disposed inside of the blocking plate 291 and the spindle 293. A tip end of the nozzle 295 and a tip end of the nozzle 297 are exposed from the lower face of the blocking plate 291.

In a case in which the fluid supply unit 29 is located at the close position, the nozzle 295 discharges the processing liquid LQ5 to the rotating substrate W. The pipe G5 is connected to the nozzle 295. The pipe G5 supplies the processing liquid LQ5 to the nozzle 295. The fluid supply part V5 adjusts supply of the processing liquid LQ5 to the nozzle 295. The temperature sensor TS5 detects a temperature of the processing liquid LQ5 flowing through the pipe G5 and outputs s detection signal indicating the temperature. For example, the temperature sensor TS5 includes a thermocouple.

In a case in which the fluid supply unit 29 is located at the close position, the nozzle 297 discharges the inert gas GA to the rotating substrate W. The pipe G6 is connected to the nozzle 297. The pipe G6 supplies the inert gas GA to the nozzle 297. The fluid supply part V6 adjusts supply of the inert gas GA to the nozzle 297. The temperature sensor TS6 detects a temperature of the inert gas GA flowing through the pipe G6 and outputs a detection signal indicating the temperature. For example, the temperature sensor TS6 includes a thermocouple.

Each of the plurality of guards 33 has an approximately cylindrical shape. Each of the plurality of guards 33 receives the processing fluid (the processing liquid LQ1, the mixture liquid of the processing liquid LQ21 and the processing liquid LQ22, the processing liquid LQ3, or the processing liquid LQ5) discharged from the substrate W. Each of the plurality of guards 33 can be risen or lowered.

Figure 4A:
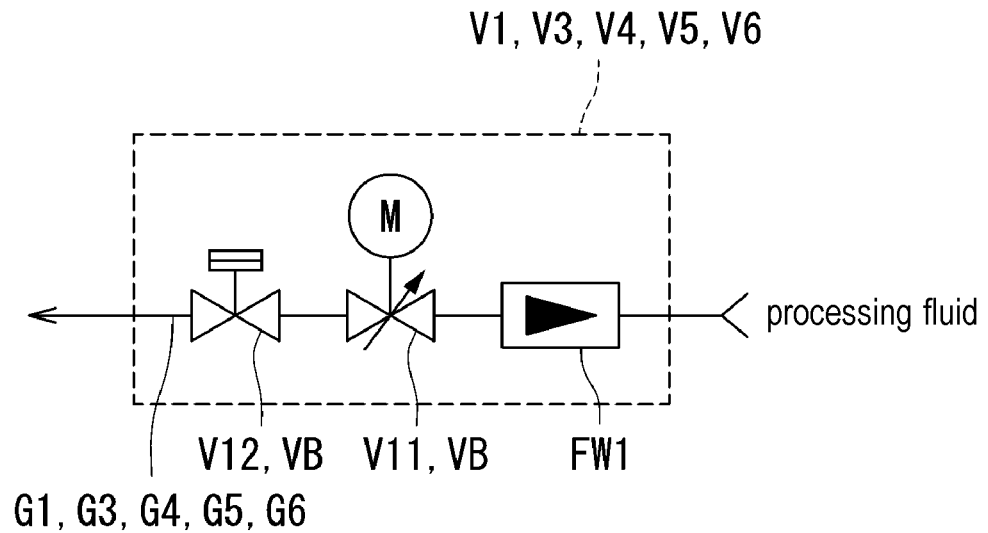
FIG. 4A is a diagram illustrating a fluid supply part according to this embodiment.

FIG. 4A is a diagram illustrating the fluid supply part V1. The configurations of the fluid supply parts V3 to V6 are similar to the configuration of the fluid supply part V1. Thus, in description of the fluid supply parts V3 to V6, FIG. 4A will be appropriately referred to, and reference signs assigned to components of the fluid supply part V1 will be appropriately used.

As illustrated in FIG. 4A, the fluid supply part V1 includes a flow rate meter FW1, a flow rate control valve V11, and a supply valve V12. The flow rate meter FW1, the flow rate control valve V11, and the supply valve V12 are inserted into the pipe G1. The flow rate meter FW1 detects a flow rate of a processing fluid (in the example illustrated in FIG. 3, the processing liquid LQ1) flowing through the pipe G1 and outputs a detection signal indicating the flow rate. The flow rate control valve V11 adjusts a flow rate of a processing fluid that flows through the pipe G1. For example, the flow rate control valve V11 is a motor needle valve. The supply valve V12 performs switching between start of supply and stop of supply of a processing fluid for the nozzle 17 by opening or closing the pipe G1. For example, the supply valve V12 is a relief valve.

Figure 4B:
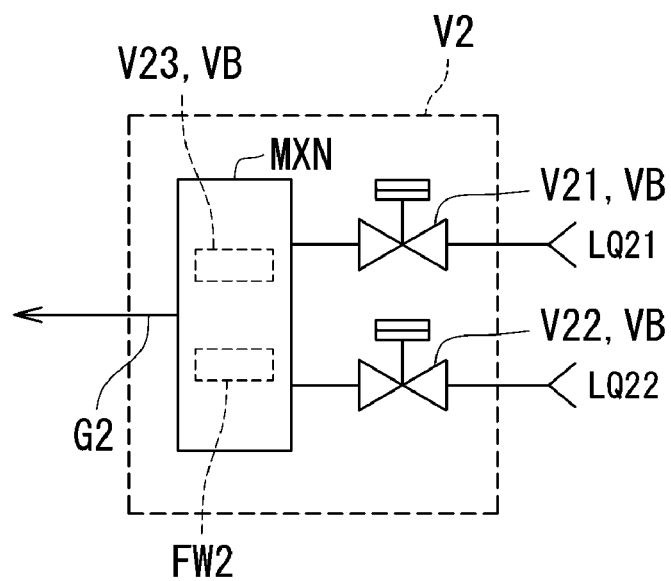
FIG. 4B is a diagram illustrating another fluid supply part according to this embodiment.

FIG. 4B is a diagram illustrating the fluid supply part V2. As illustrated in FIG. 4B, the fluid supply part V2 includes a valve V21, a valve V22, and a mixing part MXN. The valve V21 performs switching between start of supply and stop of supply of the processing liquid LQ21 for the mixing part MXN. The valve V22 performs switching between start of supply and stop of supply of the processing liquid LQ22 for the mixing part MXN. The mixing part MXN mixes the processing liquid LQ21 and the processing liquid LQ22 and supplies the mixture liquid to the pipe G2 and the nozzle 21. More specifically, the mixing part MXN includes a mixing valve V23 and a flow rate meter FW2. The mixing valve V23 mixes the processing liquid LQ21 and the processing liquid LQ22. The flow rate meter FW2 detects a flow rate of the mixture liquid and outputs a detection signal. The processing liquid LQ21 is, for example, sulfuric acid, and the processing liquid LQ22 is, for example, hydrogen peroxide water.

Hereinafter, the nozzles 17, 21, 25, 27, 295, and 297 illustrated in FIGS. 3 to 4B may be collectively referred to as a "nozzle NZ." The valves V11, V12, V21, V22, and V23 may be collectively referred to as a "valve VB." The arms 191 and 231 may be collectively referred to as an "arm AM."

Figure 5:
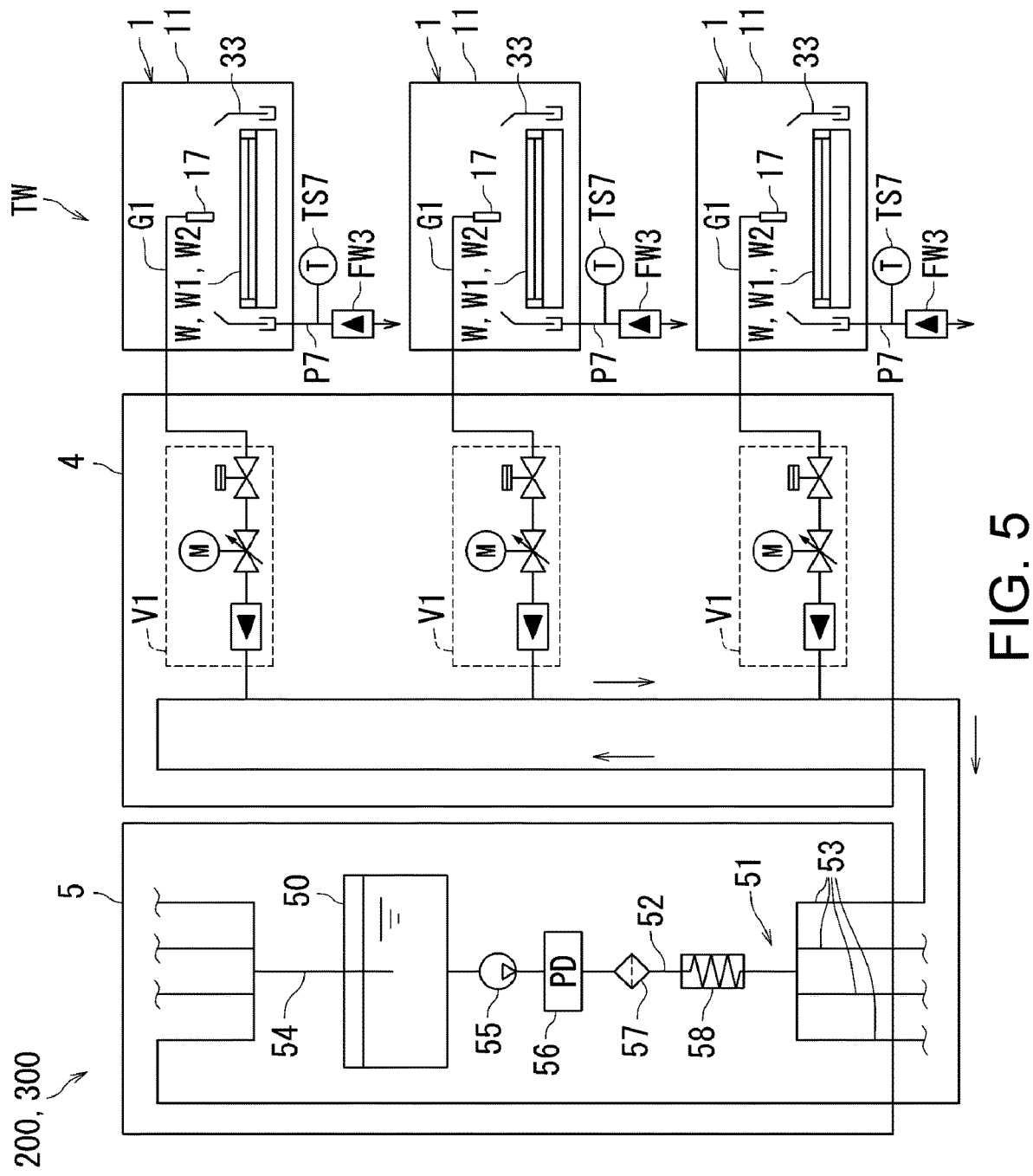
FIG. 5 is a diagram illustrating a substrate processing device according to this embodiment.

FIG. 5 is a diagram illustrating the substrate processing device 200. In FIG. 5, for simplification of the drawing, components relating to a processing fluid (in the example illustrated in FIG. 3, the processing liquid LQ1) supplied to the pipe G1 will be described. The configurations of components relating to processing fluids supplied to the pipes G2 to G6 are similar to the configurations of the components relating to the processing fluid supplied to the pipe G1. Thus, in description of the components relating to the processing fluids supplied to the pipes G2 to G6, reference signs assigned to the components relating to the processing fluid supplied to the pipe G1 will be appropriately used by appropriately referring to FIG. 5.

As illustrated in FIG. 5, the substrate processing device 200 includes the pipe G1 and the fluid supply part V1 for each processing device 1 in each tower TW. The fluid supply part V1 is housed in the processing fluid box 4 corresponding to the tower TW. A part of each pipe G1 is housed in the chamber 11, and a part of each pipe G1 is housed in the processing fluid box 4.

In addition, the substrate processing device 200 further includes a processing fluid tank 50, a circulation pipe 51, a pump 55, a pulse damper 56, a filter 57, and a temperature controller 58. The processing fluid tank 50, the pump 55, the pulse damper 56, the filter 57, and the temperature controller 58 are housed in the processing fluid cabinet 5. A part of the circulation pipe 51 is housed in the processing fluid cabinet 5, and a part of the circulation pipe 51 is housed in the processing fluid box 4.

The processing fluid tank 50 stores a processing fluid (in the example illustrated in FIG. 3, the processing liquid LQ1). The circulation pipe 51 includes an upstream pipe 52 extending from the processing fluid tank 50 to a downstream, a plurality of individual pipes 53 branching from the upstream pipe 52, and a downstream pipe 54 extending from each individual pipe 53 to the processing fluid tank 50.

An upstream end of the upstream pipe 52 is connected to the processing fluid tank 50. A downstream end of the downstream pipe 54 is connected to the processing fluid tank 50. The upstream end of the upstream pipe 52 corresponds to an upstream end of the circulation pipe 51, and the downstream end of the downstream pipe 54 corresponds to a downstream end of the circulation pipe 51. Each of the individual pipes 53 extends from the downstream end of the upstream pipe 52 to the upstream end of the downstream pipe 54.

Each of the plurality of the individual pipes 53 corresponds to a plurality of towers TW. Three pipes G1 corresponding to three processing devices 1 included in one tower TW are connected to one individual pipe 53.

The pump 55 transmits a processing fluid disposed inside the processing fluid tank 50 to the circulation pipe 51. The pulse damper 56 inhibits pulsation of a processing fluid transmitted from the pump 55. The filter 57 eliminates a foreign matter from the processing fluid flowing through the circulation pipe 51. The temperature controller 58 controls the temperature of the processing fluid disposed inside the processing fluid tank 50. For example, the temperature controller 58 is a heater that heats a processing fluid.

The pump 55, the pulse damper 56, the filter 57, and the temperature controller 58 are disposed in the upstream pipe 52. The processing fluid disposed inside the processing fluid tank 50 is transmitted to the upstream pipe 52 by the pump 55 and flows from the upstream pipe 52 to a plurality of the individual pipes 53. The processing fluids disposed inside the individual pipes 53 flow to the downstream pipe 54 and return to the processing fluid tank 50 from the downstream pipe 54. The processing fluid is heated by the temperature controller 58 and is maintained at a regulated temperature. Thus, the temperature of the processing fluid circulating in the circulation pipe 51 is maintained at a regulated temperature. Then, the processing fluid maintained at the regulated temperature inside the circulation pipe 51 is supplied to the pipe G1.

In addition, the substrate processing device 200 further includes a plurality of discharge pipes P7, a plurality of temperature sensors TS7, and a plurality of flow rate meters FW3. The plurality of discharge pipes P7 is disposed in correspondence with a plurality of processing devices 1. The discharge pipe P7 is connected to the processing device 1 and discharges a processing fluid (in the example illustrated in FIG. 3, the processing liquid LQ1) received by the guard 33 to the outside of the processing device 1. The flow rate meter FW3 is inserted into the discharge pipe P7. The flow rate meter FW3 detects a flow rate of the processing fluid flowing through the discharge pipe P7 and outputs a detection signal that indicates the flow rate. In addition, the temperature sensor TS7 detects a temperature of the processing fluid flowing through the discharge pipe P7 and outputs a detection signal that indicates the temperature. For example, the temperature sensor TS7 includes a thermocouple.

Figure 6:
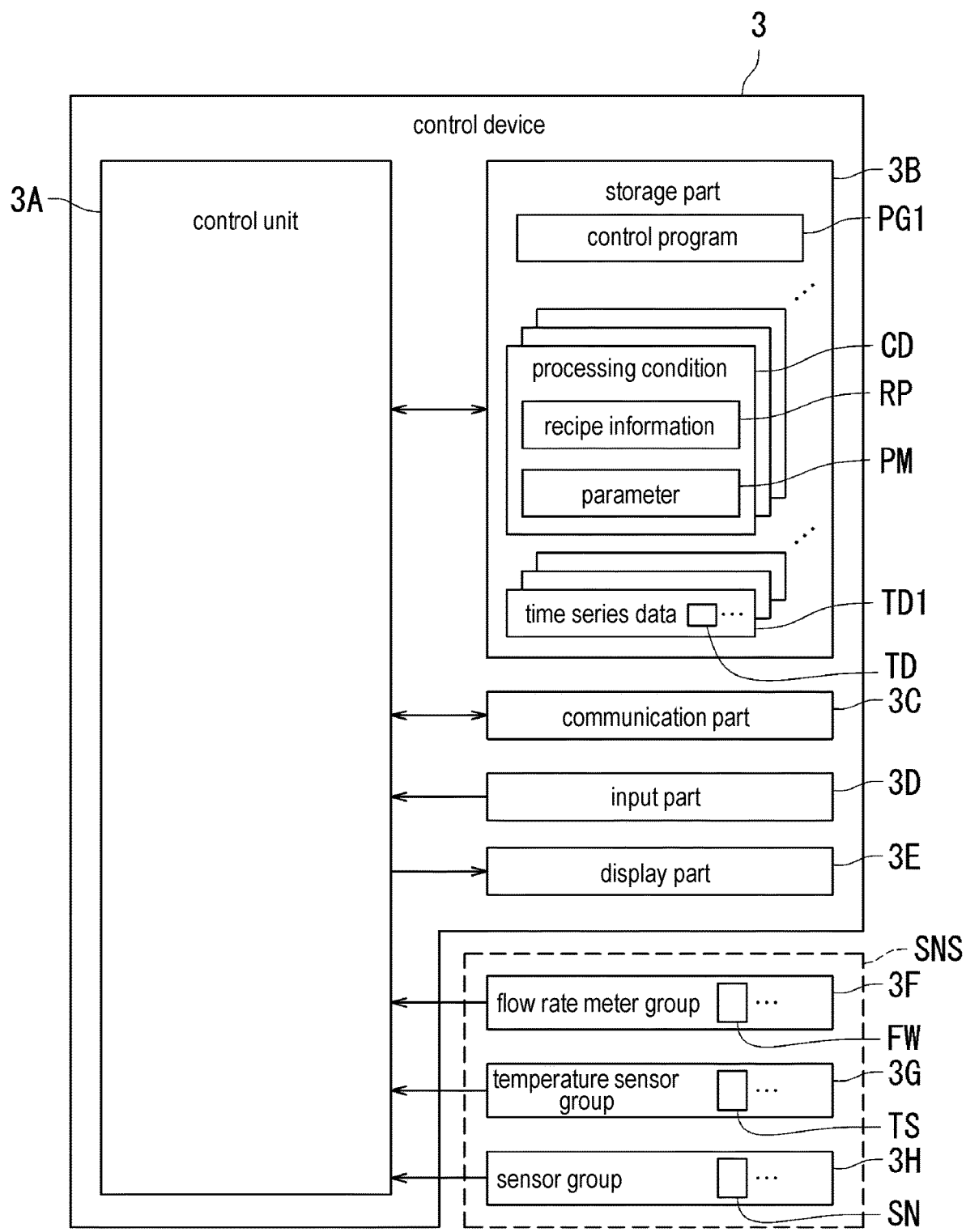
FIG. 6 is a block diagram illustrating a control device of the substrate processing device according to this embodiment.

Next, the control device 3 of the substrate processing device 200 will be described with reference to FIG. 6. FIG. 6 is a block diagram illustrating the control device 3. For example, the control device 3 is a computer. As illustrated in FIG. 6, the control device 3 includes a control part 3A, a storage part 3B, a communication part 3C, an input part 3D, and a display part 3E.

The control part 3A includes processors such as a central processing unit (CPU) and a graphics processing unit (GPU). The storage part 3B includes a storage device and stores data and computer programs. The processor of the control part 3A executes a computer program stored by the storage device of the storage part 3B and controls each component of the substrate processing device 200.

For example, the storage part 3B includes a main storage device such as a semiconductor memory and an auxiliary storage device such as a semiconductor memory or a hard disk drive. The storage part 3B may include a removable medium such as an optical disc. For example, the storage part 3B is a non-transitory computer-readable storage medium.

More specifically, the storage part 3B stores a control program PG1 and a plurality of pieces of processing condition information CD. The control part 3A controls each component of the substrate processing device 200 on the basis of at least one of pieces of the processing condition information CD by executing the control program PG1. Each of the plurality of pieces of processing condition information CD is information that represents a processing condition of the substrate W. Each of the plurality of pieces of processing condition information CD includes recipe information RP and a plurality of pieces of parameter information PM. The recipe information RP regulates processing details and a processing order of the substrate W. Each of the plurality of pieces of parameter information PM is a setting value for realizing processing according to the recipe information RP and represents a setting value for a component of the substrate processing device 200. The recipe information RP and the parameter information PM are software components of the substrate processing device 200.

The communication part 3C is connected to a network and communicates with external devices. In this embodiment, the network, for example, includes the Internet, a local area network (LAN), a public telephone network, and a short-distance wireless network. The communication part 3C is a communicator and, for example, is a network interface controller.

The input part 3D is an input device that is used for inputting various kinds of information to the control part 3A. For example, the input part 3D is a keyboard, a pointing device, or a touch panel.

The display part 3E displays an image. For example, the display part 3E is a liquid crystal display or an organic electroluminescence display.

The control part 3A acquires time series data TD1 from a detection system group SNS and stores the time series data TD1 in the storage part 3B. In this case, the control part 3A stores the time series data TD1 in the storage part 3B in association with lot identification information, substrate identification information, processing order information (hereinafter, referred to as "processing order information XA"), and lot interval information (hereinafter, referred to as "lot interval information XB"). The lot identification information is information that is used for identifying a lot (for example, a lot number). A lot represents a processing unit of the substrate W. One lot is configured by a predetermined number of substrates W. The substrate identification information is information that is used for identifying a substrate W. The processing order information XA is information that represents an order of processing for a predetermined number of substrates W configuring one lot. The lot interval information XB is information that represents a time interval from the end of processing of a lot to the start of processing of a next lot.

The time series data TD1 represents a physical quantity of an object that is used by the substrate processing device 200. The detection system group SNS is provided in the substrate processing device 200. The detection system group SNS detects a physical quantity of an object used by the substrate processing device 200 in a period from the start of processing to the end of processing of the substrate W and outputs a detection signal representing the physical quantity to the control part 3A for each processing of one substrate W.

Then, the control part 3A stores a physical quantity represented by a detection signal output from the detection system group SNS in the period from the start of processing to the end of processing of the substrate W in the storage part 3B as time series data TD1 in association with a time for each processing of one substrate W.

Each of a plurality of pieces of time series data TD1 includes at least one piece of individual time series data TD. In this embodiment, each of the plurality of pieces of time series data TD1 includes one or a plurality of pieces of individual time series data TD. One piece of individual time series data TD is time series data representing a physical quantity of one object.

In this embodiment, "an object used by the substrate processing device 200" is "a processing fluid" and/or "a component of the substrate processing device 200." The "component" may be configured by one member or may be configured by a plurality of members. In a case in which the object used by the substrate processing device 200 is a processing fluid, for example, "a physical quantity of the object used by the substrate processing device 200" is "a flow rate of the processing fluid," "a temperature of the processing fluid," or "a density of the processing fluid." In a case in which the object used by the substrate processing device 200 is a component of the substrate processing device 200, for example, "a physical quantity of the object used by the substrate processing device 200" is "a physical quantity representing an operation and/or a state of the component."

More specifically, the detection system group SNS includes a flow rate meter group 3F, a temperature sensor group 3G, and a sensor group 3H.

The flow rate meter group 3F includes a plurality of flow rate meters FW. Each of the plurality of flow rate meters FW detects a flow rate of the processing fluid in a period from the start of processing to the end of processing of the substrate W and outputs a detection signal representing the flow rate for each processing of one substrate W. Then, the control part 3A stores a flow rate represented by the detection signal output from each flow rate meter FW in the period from the start of processing to the end of processing of the substrate W in the storage part 3B as time series data TD1 in association with a time for each processing of one substrate W. In this case, one of pieces of the individual time series data TD is time series data representing a flow rate of a processing fluid supplied to one nozzle NZ at the time of discharging the processing fluid.

The plurality of flow rate meters FW includes a plurality of flow rate meters FW1, a plurality of flow rate meters FW2, and a plurality of flow rate meters FW3 (FIGS. 3 and 4). In addition, the plurality of flow rate meters FW may further include one or more other flow rate meters. In such a case, the flow rate meter may be disposed at an arbitrary position (for example, a pipe) in the substrate processing device 200.

The temperature sensor group 3G includes a plurality of temperature sensors TS. Each of the plurality of temperature sensors TS detects a temperature of a processing fluid in the period from the start of processing to the end of processing of the substrate W and outputs a detection signal representing the temperature for each processing of one substrate W. Then, the control part 3A stores the temperature represented by the detection signal output from each temperature sensor TS in the period from the start of processing to the end of processing of the substrate W in the storage part 3B as time series data TD1 in association with a time for each processing of one substrate W. In this case, one piece of individual time series data TD is time series data representing temperatures of the processing fluid supplied to one nozzle NZ at the time of discharging the processing fluid.

The plurality of temperature sensors TS includes a plurality of temperature sensors TS1, a plurality of temperature sensors TS2, a plurality of temperature sensors TS3, a plurality of temperature sensors TS4, a plurality of temperature sensors TS5, a plurality of temperature sensors TS6, and a plurality of temperature sensors TS7 (FIG. 3). In addition, the plurality of temperature sensors TS may further include one or more other temperature sensors. In such a case, the temperature sensors may be disposed at arbitrary positions (for example, the pipe, the processing fluid tank 50, or the chamber 11) in the substrate processing device 200.

The sensor group 3H includes a plurality of sensors SN. Each of the plurality of sensors SN detects a physical quantity representing an operation and/or a state of a component used by the substrate processing device 200 in the period from the start of processing to the end of processing of the substrate W and outputs a detection signal representing the physical quantity of the operation and/or the state of the component for each processing of one substrate W. Then, the control part 3A stores the physical quantity representing the operation and/or the state of the component represented by the detection signal output from each sensor SN in the period from the start of processing to the end of processing of the substrate W in the storage part 3B as time series data TD1 in association with a time for each processing of one substrate W. In this case, one piece of individual time series data TD is time series data of a physical quantity representing an operation and/or a state of one component.

For example, the component used by the substrate processing device 200 is the spin chuck 13 that rotates the substrate W, the arm AM that moves the nozzle NZ discharging a processing fluid toward the substrate W, the blocking plate 291 that covers the upper face of the substrate W with a gap interposed therebetween, the guard 33 that receives a processing fluid scattering from the substrate W, or the valve VB that controls the flow of a processing fluid.

In a case in which the component used by the substrate processing device 200 is the spin chuck 13, a physical quantity of the spin chuck 13 represents a quantity relating to an operation and/or a state of the spin chuck 13. For example, the physical quantity represents the number of revolutions of the spin chuck 13. Thus, the sensor SN detects the number of revolutions of the spin chuck 13 and outputs a detection signal representing the number of revolutions. In this case, the sensor SN detects the number of revolutions of the spin chuck 13 optically, electrically, or mechanically. The number of revolutions of the spin chuck 13 represents the number of revolutions of the substrate W. In addition, the sensor SN may detect the number of revolutions of the spin motor 15. In such a case, the component used by the substrate processing device 200 is the spin motor 15, and a physical quantity of the spin motor 15 is the number of revolutions of the spin motor 15.

In a case in which the component used by the substrate processing device 200 is the arm AM, a physical quantity of the arm AM represents a quantity relating to the operation and/or the state of the arm AM. For example, the physical quantity is information that represents a position or a displacement of the arm AM in a case in which a scanning processing using the nozzle NZ is executed. The scanning process is a process in which the substrate W is processed using a processing fluid while the nozzle NZ moves a discharge position of the processing fluid in a radial direction of the substrate W. In this case, the sensor SN detects a position or a displacement of the arm AM and outputs a detection signal representing the position or the displacement. In this case, the sensor SN detects a position or a displacement of the arm AM optically, electrically, or mechanically.

In a case in which the component used by the substrate processing device 200 is the blocking plate 291, a physical quantity of the blocking plate 291 represents a quantity relating to the operation and/or the state of the blocking plate 291. For example, the physical quantity is information representing a position in a vertical direction of the blocking plate 291, information representing a displacement, or information representing the number of revolutions. In this case, the sensor SN detects the position, the displacement, or the number of revolutions of the blocking plate 291 and outputs a detection signal representing the position, the displacement, or the number of revolutions. In this case, the sensor SN detects the position, the displacement, or the number of revolutions of the blocking plate 291 optically, electrically, or mechanically.

In a case in which the component used by the substrate processing device 200 is the guard 33, a physical quantity of the guard 33 represents a quantity relating to the operation and/or the state of the guard 33. For example, the physical quantity is information that represents the position or the displacement of the guard 33. In this case, the sensor SN detects the position or the displacement of the guard 33 and outputs a detection signal representing the position or the displacement. In this case, the sensor SN detects the position or the displacement of the guard 33 optically, electrically, or mechanically.

In a case in which the component used by the substrate processing device 200 is the valve VB, a physical quantity of the valve VB represents a quantity relating to the operation and/or the state of the valve VB. For example, the physical quantity is information representing a degree of opening of the valve VB. In this case, the sensor SN detects the degree of opening of the valve VB and outputs a detection signal representing the degree of opening. In this case, the sensor SN detects the degree of opening of the valve VB optically, electrically, or mechanically. The degree of opening represents a degree with which the valve VB is open.

The plurality of sensors SN may include a plurality of density sensors. In such a case, the plurality of density sensors directly or indirectly detects densities of a processing fluid in a period from the start of processing to the end of processing of the substrate W and outputs detection signals representing the densities for each processing of one substrate W. Then, the control part 3A stores the densities represented by the detection signals output from the density sensors in the period from the start of processing to the end of processing of the substrate W in the storage part 3B as time series data TD1 in association with a time for each processing of one substrate W. In this case, one piece of individual time series data TD is time series data representing densities of a processing fluid supplied to one nozzle NZ at the time of discharging the processing fluid. The density may be represented using a specific gravity of a processing fluid. In such a case, the density sensor detects a specific gravity of the processing fluid. The density sensor may be disposed in the pipe or may be disposed in the processing fluid tank 50.

The control part 3A, for example, performs control of the communication part 3C such that the time series data TD1 is transmitted to the learning data generating device 400. As a result, the communication part 3C transmits the time series data TD1 to the learning data generating device 400 through a network.

For example, the control part 3A performs control of the display part 3E such that the time series data TD1 is displayed. As a result, the display part 3E displays the time series data TD1.

Figure 7:
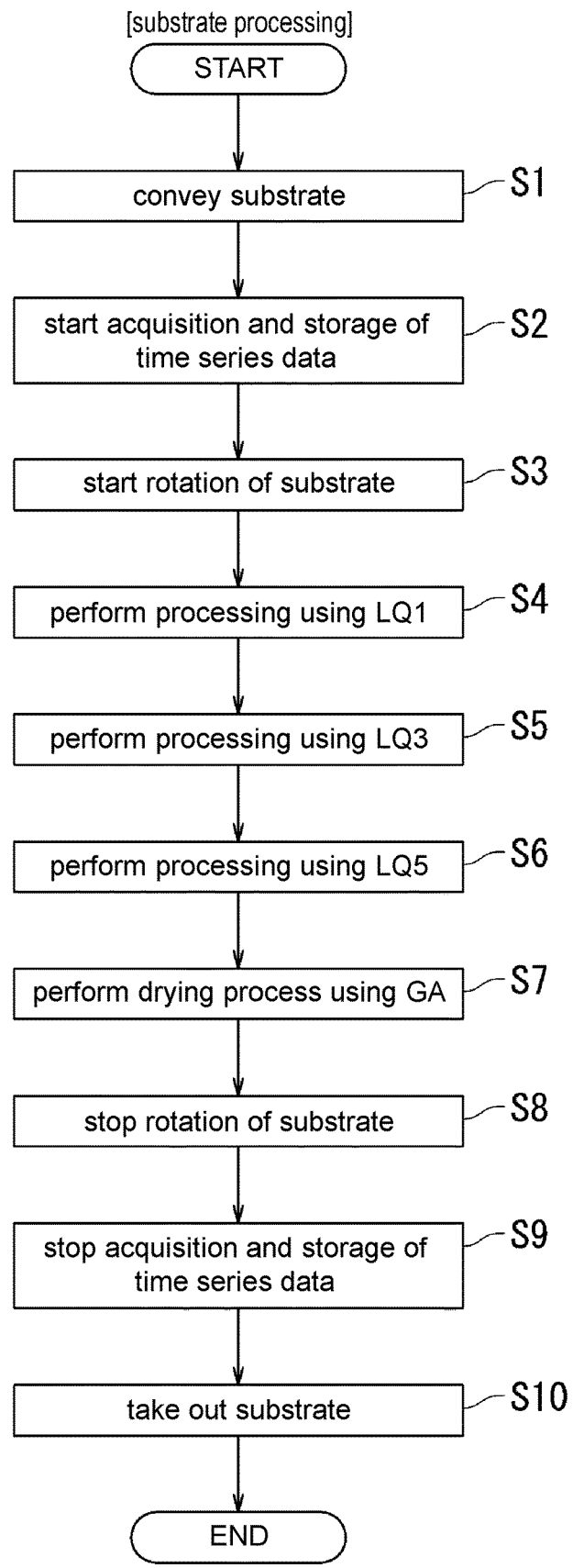
FIG. 7 is a flowchart illustrating a substrate processing method according to this embodiment.

Next, a substrate processing method executed by the substrate processing device 200 will be described with reference to FIGS. 2, 3, 6, and 7. FIG. 7 is a flowchart illustrating a substrate processing method according to this embodiment. As illustrated in FIG. 7, the substrate processing method includes Steps S1 to S10. The substrate processing method is executed for each substrate W by the substrate processing device 200.

As illustrated in FIG. 7, in Step S1, the center robot CR of the substrate processing device 200 illustrated in FIG. 2 conveys a substrate W to the processing device 1. In the processing device 1 illustrated in FIG. 3, the chuck members 130 of the spin chuck 13 hold the substrate W.

Next, in Step S2, the control part 3A of the control device 3 illustrated in FIG. 6 starts to acquire and store time series data TD1 from the detection system group SNS.

Next, in Step S3, the spin chuck 13 starts to rotate the substrate W.

Next, in Step S4, the nozzle 17 of the processing device 1 processes the substrate W by discharging a processing liquid LQ1 to the surface of the substrate W.

Next, in Step S5, the nozzle 25 of the processing device 1 washes out the processing liquid LQ1 from the substrate W by discharging a processing liquid LQ3 to the surface of the substrate W.

Next, in Step S6, the nozzle 295 of the processing device 1 replaces the processing liquid LQ3 with a processing liquid LQ5 by discharging the processing liquid LQ5 to the surface of the substrate W and dries the substrate W.

Next, in Step S7, the nozzle 297 of the processing device 1 discharges an inert gas GA to the surface of the substrate W and dries the substrate W.

Next, in Step S8, the spin chuck 13 of the processing device 1 stops the rotation of the substrate W, and the chuck members 130 open the substrate W.

Next, in Step S9, the control part 3A of the control device 3 stops acquisition and storage of time series data TD1 from the detection system group SNS.

Next, in Step S10, the center robot CR of the substrate processing device 200 takes out the substrate W from the processing device 1.

As above, the substrate processing device 200 executes Steps S1 to S10, and the processing of one substrate W ends.

In description presented with reference to FIGS. 2 to 7, relating to the substrate processing device 200, "the substrate W" can be rephrased with "a learning target substrate W1." In addition, in the description presented with reference to FIGS. 2 to 7, "the substrate processing device 200" can be rephrased with "a substrate processing device 300," "the time series data TD1" can be rephrased with "time series data TD2," and "the substrate W" can be rephrased with "a processing target substrate."

Figure 8:
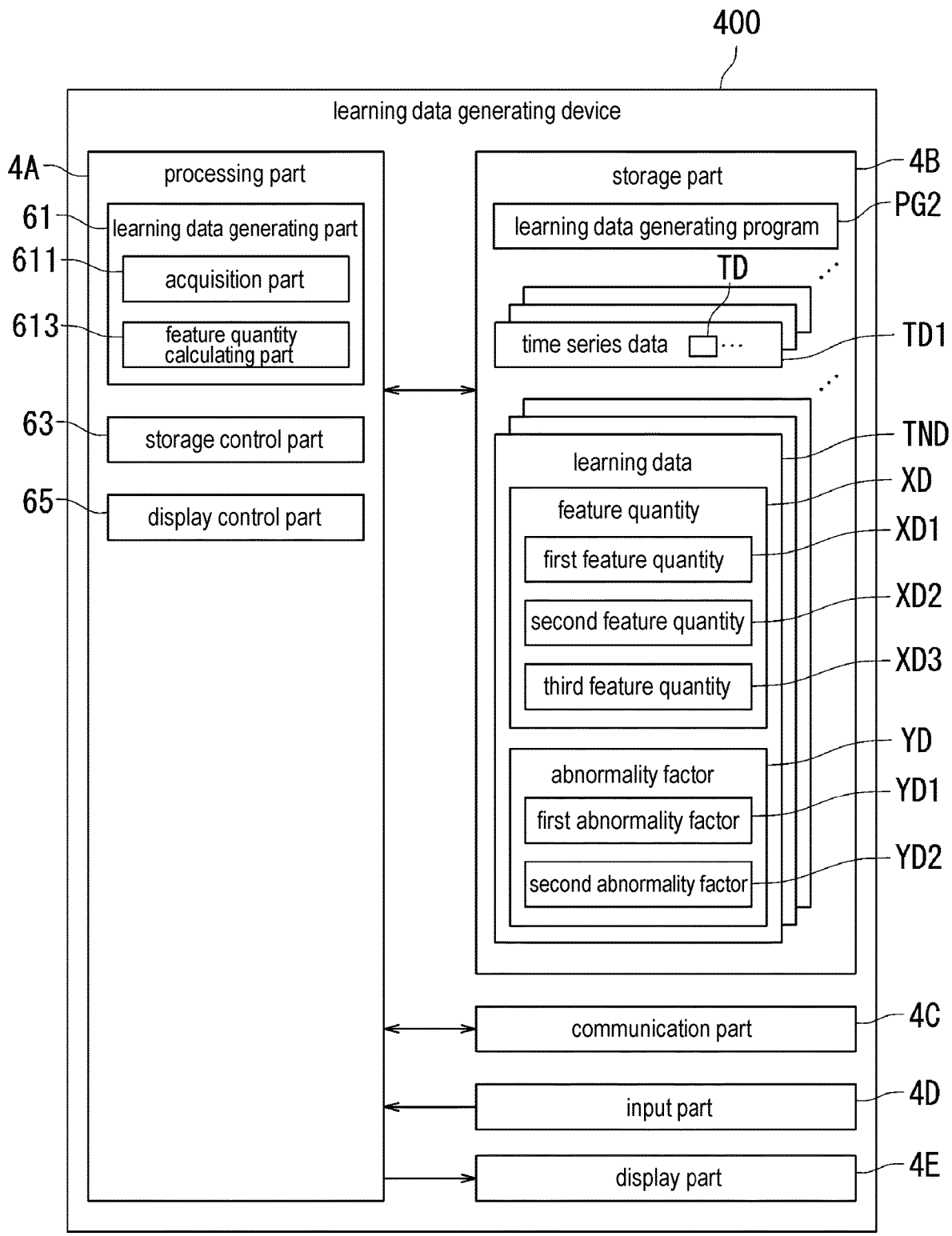
FIG. 8 is a block diagram illustrating a learning data generating device according to this embodiment.

Next, the learning data generating device 400 will be described with reference to FIGS. 8 to 18. First, the learning data generating device 400 will be described with reference to FIG. 8. For example, the learning data generating device 400 is a computer. FIG. 8 is a block diagram illustrating the learning data generating device 400. As illustrated in FIG. 8, the learning data generating device 400 includes a processing part 4A, a storage part 4B, a communication part 4C, an input part 4D, and a display part 4E.

The processing part 4A includes processors such as a CPU and a GPU. The storage part 4B includes a storage device and stores data and computer programs. The processor of the processing part 4A executes a computer program stored by the storage device of the storage part 4B and executes various processes. For example, the storage part 4B, similar to the storage part 3B, includes a main storage device and an auxiliary storage device and may include a removable medium. For example, the storage part 4B is a non-transitory computer-readable storage medium.

More specifically, the storage part 4B stores a learning data generation program PG2. The processing part 4A functions as a learning data generating part 61, a storage control part 63, and a display control part 65 by executing the learning data generation program PG2. In other words, the processing part 4A includes a learning data generating part 61, a storage control part 63, and a display control part 65. The learning data generating part 61 includes an acquisition part 611 and a feature quantity calculating part 613.

The communication part 4C is connected to a network and communicates with an external device. The communication part 4C is a communicator and, for example, is a network interface controller.

The input part 4D is an input device that is used for inputting various kinds of information to the processing part 4A. For example, the input part 4D is a keyboard and a pointing device or a touch panel.

The display part 4E displays an image. For example, the display part 4E is a liquid crystal display or an organic electroluminescence display.

Subsequently, the processing part 4A will be described with reference to FIG. 8. The learning data generating part 61 of the processing part 4A generates learning data TND on the basis of the time series data TD1. The learning data TND is a target for machine learning. Then, the storage control part 63 performs control of the storage part 4B such that the learning data TND is stored. As a result, the storage part 4B stores the learning data TND in association with the lot identification information and the substrate identification information. For example, one piece of learning data TND is generated for at least one piece of time series data TD1 that is acquired when one learning target substrate W1 is processed.

The learning data TND includes a feature quantity XD relating to processing of the learning target substrate W1 and abnormality factor information YD relating to the processing of the learning target substrate W1. The feature quantity XD includes first feature quantity information XD1. The feature quantity XD may include second feature quantity information XD2 and/or third feature quantity information XD3. In this embodiment, the feature quantity XD includes the first feature quantity information XD1, the second feature quantity information XD2, and the third feature quantity information XD3

More specifically, the acquisition part 611 of the learning data generating part 61 acquires a plurality of pieces of time series data TD1 from the substrate processing device 200. In this case, the lot identification information, the substrate identification information, the processing order information XA, and the lot interval information XB are attached to the time series data TD1. For example, the acquisition part 611 acquires a plurality of pieces of time series data TD1 from the substrate processing device 200 through a network and the communication part 4C.

Then, the storage part 4B stores each of the pieces of the time series data TD1 in association with the lot identification information, the substrate identification information, the processing order information XA, and the lot interval information XB.

In addition, the acquisition part 611 acquires at least one piece of section data from the time series data TD1. In this embodiment, the acquisition part 611 acquires a plurality of pieces of section data from the time series data TD1. The section data is data in a time section including a period in which a feature part of a time transition of the time series data appears and is data of a part of the time series data TD1.

Then, the feature quantity calculating part 613, for each piece of section data, calculates first feature quantity information XD1 on the basis of the section data. The first feature quantity information XD1 represents a feature of the time transition of the section data. The first feature quantity information XD1 is represented using times. The first feature quantity information XD1 corresponds to one example of "feature quantity information." Details of the first feature quantity information XD1 will be described below.

The input part 4D receives a plurality of pieces of abnormality factor information YD from a user.

Then, the storage control part 63 labels the first feature quantity information XD1 with the abnormality factor information YD. More specifically, the storage control part 63 performs control of the storage part 4B such that the first feature quantity information XD1 is stored in association with the abnormality factor information YD. As a result, the storage part 4B stores the first feature quantity information XD1 in association with the abnormality factor information YD. The abnormality factor information YD represents factors of abnormalities of the learning target substrate W1 after processing using a processing fluid.

In addition, the storage control part 63 labels the second feature quantity information XD2 with the abnormality factor information YD. More specifically, the storage control part 63 performs control of the storage part 4B such that the second feature quantity information XD2 is stored in association with the abnormality factor information YD. As a result, the storage part 4B stores the second feature quantity information XD2 in association with the abnormality factor information YD. The second feature quantity information XD2 is processing order information XA representing an order of processing for a predetermined number of learning target substrates W1 configuring one lot or lot interval information XB representing a time interval from the end of processing of a lot to the start of processing of a next lot.

In addition, the storage control part 63 labels the third feature quantity information XD3 with the abnormality factor information YD. More specifically, the storage control part 63 performs control of the storage part 4B such that the third feature quantity information XD3 is stored in association with the abnormality factor information YD. As a result, the storage part 4B stores the third feature quantity information XD3 in association with the abnormality factor information YD. The third feature quantity information XD3 is section data, object information (hereinafter, referred to as "object information IDA"), or physical quantity information (hereinafter, referred to as "physical quantity information IDB"). The section data is section data that is acquired from the time series data TD1 by the acquisition part 611.

The object information IDA is information that is used for identifying an object used by the substrate processing device 200. In a case in which the object is a "processing fluid," the object information IDA is information used for identifying a "processing fluid." In a case in which the object is "a component of the substrate processing device," the object information IDA is information that is used for identifying the "component."

The physical quantity information IDB is information that is used for identifying a type of a physical quantity of an object used by the substrate processing device 200. In a case in which the object is "a processing fluid," the physical quantity information IDB is information indicating that the type of physical quantity is "a flow rate of the processing fluid," information indicating that the type of physical quantity is "a temperature of the processing fluid," or information indicating that the type of physical quantity is "a density of the processing fluid." In a case in which the object is "a component," the physical quantity information IDB is information indicating that the type of physical quantity is "a physical quantity relating to the operation and/or the state of the component." For example, in a case in which the object is the "component," the physical quantity information IDB is information indicating that the type of physical quantity is "the number of revolutions of the component," "a position of the component," "a displacement of the component," or "a degree of opening of the component."

As described with reference to FIG. 8 as above, the storage part 4B stores the first feature quantity information XD1, the second feature quantity information XD2, and the third feature quantity information XD3 in association with the abnormality factor information YD.

In other words, the storage control part 63 labels the feature quantity XD with the abnormality factor information YD. More specifically, the storage control part 63 performs control of the storage part 4B such that the feature quantity XD is stored in association with the abnormality factor information YD. As a result, the storage part 4B stores the feature quantity XD and the abnormality factor information YD as learning data TND. In other words, the feature quantity XD and the abnormality factor information YD configure the learning data TND. For example, one piece of learning data TND includes a feature quantity XD calculated on the basis of at least one piece of time series data TD1 acquired when one learning target substrate W1 is processed and the abnormality factor information YD associated with the feature quantity XD.

The abnormality factor information YD includes at least one of first abnormality factor information YD1 and second abnormality factor information YD2. In this embodiment, the abnormality factor information YD includes the first abnormality factor information YD1 and the second abnormality factor information YD2.

The first abnormality factor information YD1 is information relating to a processing fluid at the time of processing the learning target substrate W1 that is performed by the substrate processing device 200 and is information indicating factors of abnormalities of the learning target substrate W1 after processing using the processing fluid. The second abnormality factor information YD2 is information relating to a component of the substrate processing device 200 and is information that indicates factors of abnormalities of the learning target substrate W1 after processing using the processing fluid. The input part 4D receives a plurality of pieces of first abnormality factor information YD1 and a plurality of pieces of second abnormality factor information YD2 from a user. Then, the storage control part 63 labels the first feature quantity information XD1 to the third feature quantity information XD3 with the first abnormality factor information YD1 and second abnormality factor information YD2. More specifically, the storage control part 63 performs control of the storage part 4B such that the first feature quantity information XD1 to the third feature quantity information XD3 are stored in association with the first abnormality factor information YD1 and the second abnormality factor information YD2. As a result, the storage part 4B stores the first feature quantity information XD1 to the third feature quantity information XD3 in association with the first abnormality factor information YD1 and the second abnormality factor information YD2

In addition, the display control part 65 performs control of the display part 4E such that the time series data TD1 or the learning data TND is displayed. As a result, the display part 4E displays the time series data TD1 or the learning data TND.

Next, the time series data TD1 will be described with reference to FIGS. 8 and 9. In this description, an example in which a physical quantity of an object used by the substrate processing device 200 is "a flow rate of a processing fluid" will be assumed. As the "processing fluid," the processing liquid LQ1, the processing liquid LQ3, the processing liquid LQ5, and the inert gas GA will be described as examples.

Figure 9:
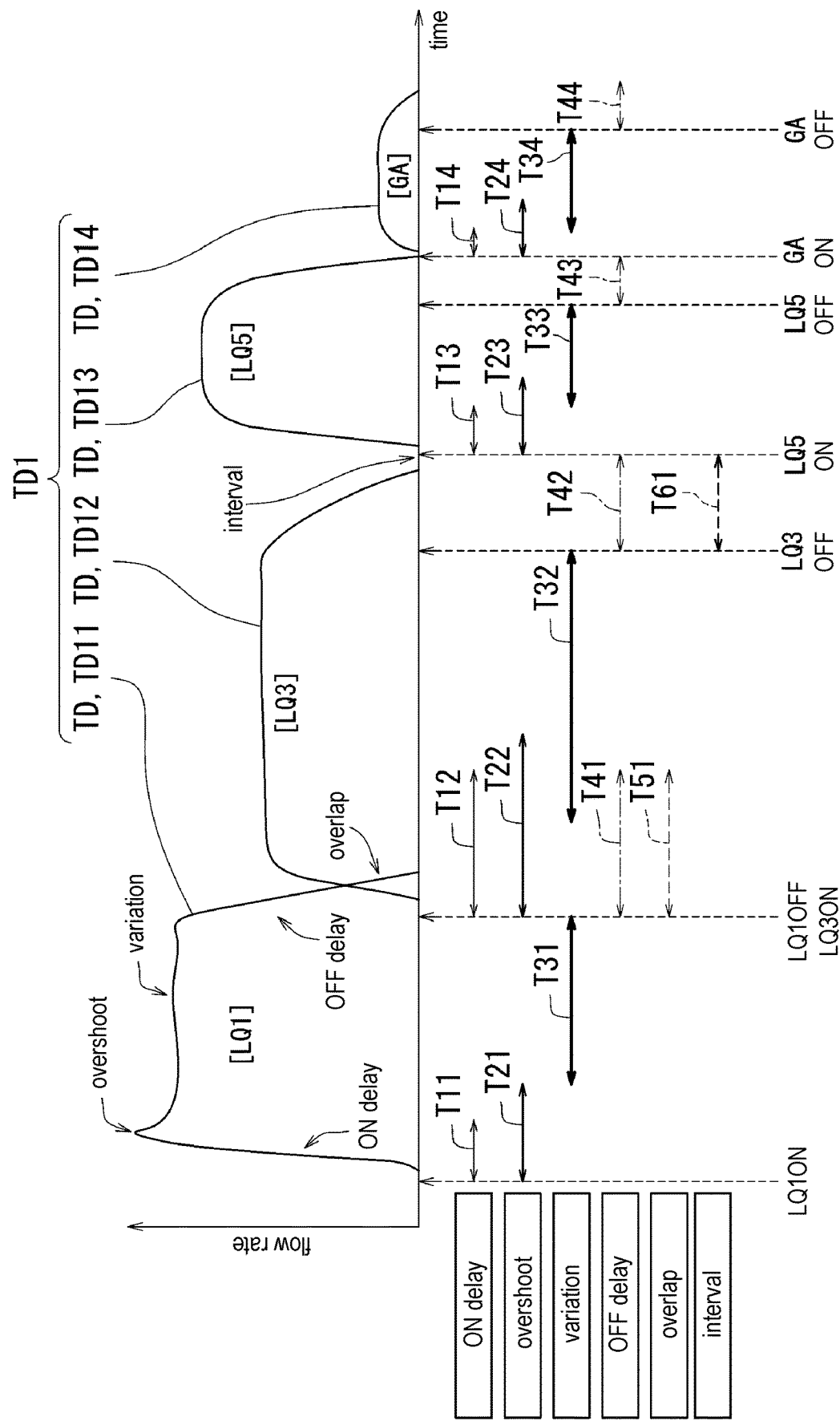
FIG. 9 is a graph illustrating an example of time series data according to this embodiment.

FIG. 9 is a graph illustrating an example of the time series data TD1. In FIG. 9, the horizontal axis represents the time, and the vertical axis represents a flow rate of the processing fluid.

As illustrated in FIG. 9, the time series data TD1 includes individual time series data TD11, individual time series data TD12, individual time series data TD13, and individual time series data TD14 as the individual time series data TD. The individual time series data TD11 is a flow rate of the processing liquid LQ1 supplied to the nozzle 17 at that time of discharging the processing liquid LQ1 and represents a flow rate detected by the flow rate meter FW1 of the fluid supply part V1. The individual time series data TD12 is a flow rate of the processing liquid LQ3 supplied to the nozzle 25 at that time of discharging the processing liquid LQ3 and represents a flow rate detected by the flow rate meter FW1 of the fluid supply part V3. The individual time series data TD13 is a flow rate of the processing liquid LQ5 supplied to the nozzle 295 at that time of discharging the processing liquid LQ5 and represents a flow rate detected by the flow rate meter FW1 of the fluid supply part V5. The individual time series data TD14 is a flow rate of the inert gas GA supplied to the nozzle 297 at that time of discharging the inert gas GA and represents a flow rate detected by the flow rate meter FW1 of the fluid supply part V6.

As illustrated in FIGS. 8 and 9, the acquisition part 611 acquires section data of each of time sections T11 to T14, section data of each of time sections T21 to T24, section data of each of time sections T31 to T34, section data of each of time sections T41 to T44, and section data of each of time sections T51 and T61 from the time series data TD1.

Hereinafter, "section data" may be collectively referred to as "section data SX."

The time sections T11 to T14, T21 to T24, T31 to T34, T41 to T44, T51, and T61 are sections that include feature parts of a time transition of the time series data TD1. For example, the time sections T11 to T14, T21 to T24, T31 to T34, T41 to T44, T51, and T61 are common to a plurality of pieces of time series data TD1 for a plurality of learning target substrates W1. For example, the time sections T11 to T14, T21 to T24, T31 to T34, T41 to T44, T51, and T61 are common to all the pieces of the time series data TD1 for all the learning target substrates W1.

The time sections T11 to T14 represent periods in which there is a possibility that a first feature part of the time transition of the time series data TD1 (the individual time series data TD) appears. The first feature part is an on-delay part. The on-delay part is a part that represents a flow rate until it reaches a target value after the flow rate increases from the start of discharge of the processing fluid in the time series data TD1 (the individual time series data TD). The on-delay part represents a delay until the flow rate of the processing fluid reaches a target value when the flow rate of the processing fluid increases toward the target value. In FIG. 9, "at the time of start of discharge control" of the processing fluid is described as "processing liquid LQ1 on," "processing liquid LQ3 on," "processing liquid LQ5 on," and "inert gas GA on." "At the time of start of discharge control" represents a time when the control part 3A outputs an opening instruction signal to the supply valve V12 (FIG. 4A). The opening instruction signal is a signal for an instruction for opening the supply valve V12 (valve on signal). Here, "at the time of start of discharge control" may be referred to as "at the time of start of discharge control tx."

The time sections T21 to T24 represent periods in which there is a possibility that a second feature part of the time transition of the time series data TD1 (the individual time series data TD) appears. The second feature part is an overshoot part. The overshoot part is a part in which the flow rate passes through and exceeds a target value after it increases from the start of discharge of the processing fluid in the time series data TD1 (the individual time series data TD).

The time sections T31 to T34 represent periods in which there is a possibility that a third feature part of the time transition of the time series data TD1 (the individual time series data TD) appears. The third feature part is a variation part. The variation part is a part in which the flow rate upwardly and downwardly varies near the target value in the time series data TD1 (the individual time series data TD).

The time sections T41 to T44 represent periods in which there is a possibility that a fourth feature part of the time transition of the time series data TD1 (the individual time series data TD) appears. The fourth feature part is an off-delay part. The off-delay part is a part that represents a flow rate until it reaches a lower limit target value (for example, zero) after the flow rate decreases from the stop of discharge of the processing fluid in the time series data TD1 (the individual time series data TD). The off-delay part represents a delay until the flow rate of the processing fluid reaches the lower limit target value when the flow rate of the processing fluid decreases toward the lower limit target value (for example, zero). In FIG. 9, "at the time of stop of discharge control" of the processing fluid is described as "processing liquid LQ1 off," "processing liquid LQ3 off," "processing liquid LQ5 off," and "inert gas GA off." "At the time of stop of discharge control" represents a time when the control part 3A outputs a closing instruction signal to the supply valve V12 (FIG. 4A). The closing instruction signal is a signal for an instruction for closing of the supply valve V12 (a valve off signal). Hereinafter, "at the time of stop of discharge control" may be referred to as "at the time of stop of discharge control ty."

The time section T51 represents a period in which there is a possibility that a fifth feature part of the time transition of the time series data TD1 (the individual time series data TD11 and TD12) appears. The fifth feature part is an overlapping part. The overlapping part is an overlapping part with respect to time between the individual time series data TD11 and the individual time series data TD12 that are adjacent to each other in the time series data TD1. In other words, the overlapping part is a part in which flow rates of two different processing fluids overlap each other with respect to time in the time series data TD1.

The time section T61 represents a period in which there is a possibility that a sixth feature part of the time transition of the time series data TD1 (the individual time series data TD12 and the individual time series data TD13) appears. The sixth feature part is an interval part. The interval part is a part in which intervals of the individual time series data TD12 and the individual time series data TD13, which are adjacent to each other, in the time series data TD1 come across with respect to time. In other words, the interval part is a part in which intervals of two different processing fluids in the time series data TD1 come across with respect to time.

Next, an on-delay part, an overshoot part, a variation part, an off-delay part, an overlapping part, and an interval part will be generalized and defined. In the following definitions, an "object" represents "an object used by the substrate processing device 200," and "a physical quantity" represents "a physical quantity of an object."

In other words, the on-delay part is a part that represents a physical quantity until it reaches a target value after the physical quantity of an object increases from start of use or change in a use state of the object in time series data TD1 (the individual time series data TD). The on-delay part represents a delay until a physical quantity of an object reaches a target value when the physical quantity of the object increases toward the target value.

The overshoot part is a part in which a physical quantity of an object passes through and exceeds a target value after it increases from start of use or change in the use state of the object in the time series data TD1 (the individual time series data TD).

The variation part is a part in which a physical quantity of an object upwardly and downwardly varies near a target value in the time series data TD1 (the individual time series data TD).

The off-delay part is a part that represents a physical quantity of an object until it reaches a lower limit target value after the physical quantity decreases from stop of use or change in a use state of the object in the time series data TD1 (the individual time series data TD). The off-delay part represents a delay until the physical quantity of the object reaches the lower limit target value when the physical quantity of the object decreases toward the lower limit target value.

The overlapping part is a part in which physical quantities of two different objects in the time series data TD1 overlap each other with respect to time.

The interval part is a part in which intervals of two different objects in the time series data TD1 come across with respect to time.

Figure 10:
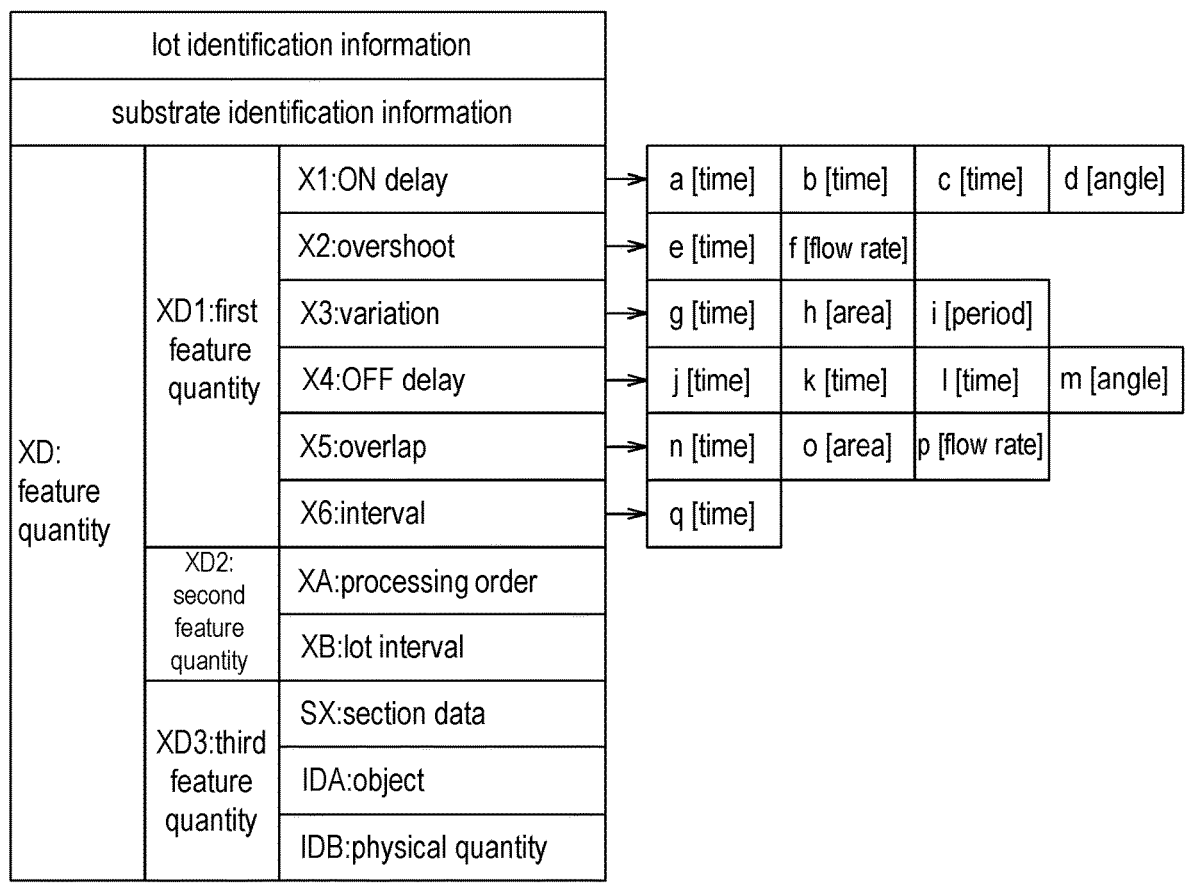
FIG. 10 is a diagram illustrating a feature quantity according to this embodiment.

Next, the feature quantity XD will be described with reference to FIG. 10. FIG. 10 is a diagram illustrating the feature quantity XD. As illustrated in FIG. 10, first feature quantity information XD1 of the feature quantity XD includes at least one of first information X1, second information X2, third information X3, fourth information X4, fifth information X5, and sixth information X6. In the example illustrated in FIG. 10, the first feature quantity information XD1 includes the first information X1, the second information X2, the third information X3, the fourth information X4, the fifth information X5, and the sixth information X6.

The first information X1 exhibits a feature of the time transition of the on-delay part of the time series data TD1. In other words, the first information X1 is information that exhibits a state of a flow rate when the flow rate of the processing fluid increases toward the target value.

The first information X1 includes at least one of information a, information b, information c, and information d. In the example illustrated in FIG. 10, the first information X1 includes the information a to the information d. The information a to the information c are represented using times, and the information d is represented using an angle. Details of the information a to the information d will be described below.

The second information X2 exhibits a feature of the time transition of an overshoot part of the time series data TD1. In other words, the second information X2 is information that exhibits an overshoot of the flow rate of the processing fluid.

The second information X2 includes at least one of information e and information f. In the example illustrated in FIG. 10, the second information X2 includes the information e and the information f. The information e is represented using times, and the information f is represented using a flow rate. Details of the information e and f will be described below.

The third information X3 exhibits a feature of the time transition of the variation part of the time series data TD1. In other words, the third information X3 is information that exhibits variations (variations with respect to time) of the flow rate of the processing fluid.

The third information X3 includes at least one of information g, information h, and information i. In the example illustrated in FIG. 10, the third information X3 includes the information g to the information i. The information g is represented using times, the information h is represented using an area, and the information i is represented using a period. Details of the information g to the information i will be described below.

The fourth information X4 exhibits the feature of the time transition of the off-delay part of the time series data TD1. In other words, the fourth information X4 is information that exhibits the state of the flow rate when the flow rate of the processing fluid decreases from a target value.

The fourth information X4 includes at least one of information j, information k, information 1, and information m. In the example illustrated in FIG. 10, the fourth information X4 includes the information j to the information m. The information j to the information 1 are represented using times, and the information m is represented using an angle. Details of the information j to the information m will be described below.

The fifth information X5 exhibits the feature of the time transition of the overlapping part of the time series data TD1. In other words, the fifth information X5 is, when the substrate processing device 200 uses at least two different processing fluids, information that exhibits an overlap between the flow rate of one processing fluid out of the two processing fluids and the flow rate of the other processing fluid.

The fifth information X5 includes at least one of information n, information o, and information p. In the example illustrated in FIG. 10, the fifth information X5 includes the information n to the information p. The information n is represented using times, the information o is represented using an area, and the information p is represented using a flow rate. Details of the information n to p will be described below.

The sixth information X6 exhibits the feature of the time transition of the interval part of the time series data TD1. In other words, the sixth information X6 is, when the substrate processing device 200 uses at least two different processing fluids, information that exhibits a time interval between one processing fluid out of the two processing fluids and the other processing fluid on a time axis.

The sixth information X6 includes information q. The information q is represented using times. Details of the information q will be described below.

In the description presented with reference to FIG. 10 as above, the first information X1 to the sixth information X6 have been described with "a processing fluid" described as an "object" as an example and "a flow rate" described as a "physical quantity" as an example. Here, the first information X1 to the sixth information X6 can be generalized and defined as below. In other words, in the description of the first information X1 to the sixth information X6 illustrated in FIG. 10, "a processing fluid" can be rephrased with an "object," and "a flow rate" can be rephrased with "a physical quantity." In addition, the lot identification information and the substrate identification information are associated with the feature quantity XD.

The second feature quantity information XD2 includes at least one of the processing order information XA and the lot interval information XB. In the example illustrated in FIG. 10, the second feature quantity information XD2 includes the processing order information XA and the lot interval information XB.

In addition, the third feature quantity information XD3 includes at least one of the section data SX, the object information IDA, and the physical quantity information IDB. In the example illustrated in FIG. 10, the third feature quantity information XD3 includes the section data SX, the object information IDA, and the physical quantity information IDB.

Next, a method of calculating the information a to the information q (FIG. 10) using the feature quantity calculating part 613 (FIG. 8) will be described with reference to FIGS. 11A to 16. In FIGS. 11A to 16, the horizontal axis represents a time, and the vertical axis represents a flow rate of a processing fluid.

Figure 11A:
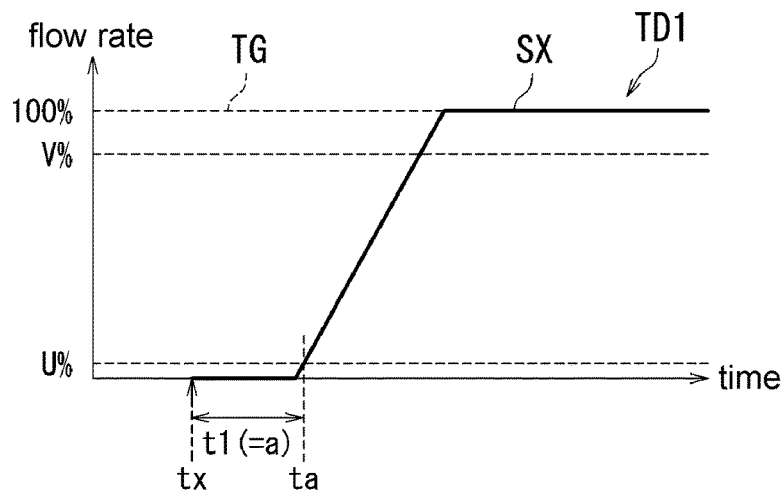
FIG. 11A is a diagram illustrating an example of a method of calculating first information included in first feature quantity information according to this embodiment.
Figure 11B:
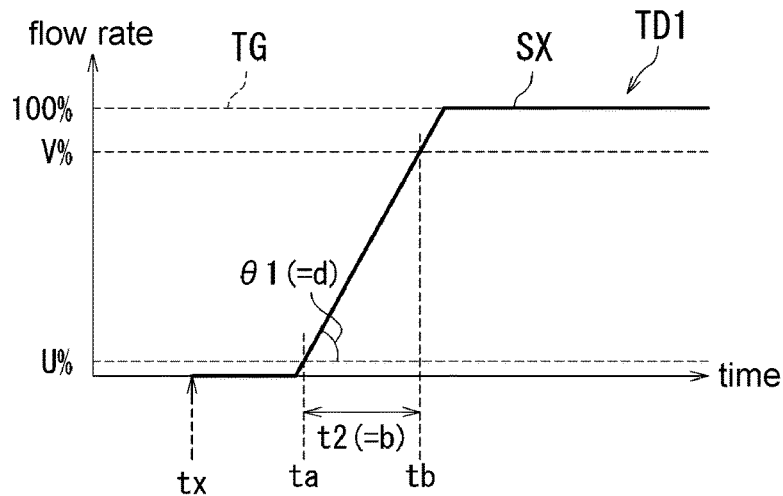
FIG. 11B is a diagram illustrating another example of the method of calculating first information.
Figure 11C:
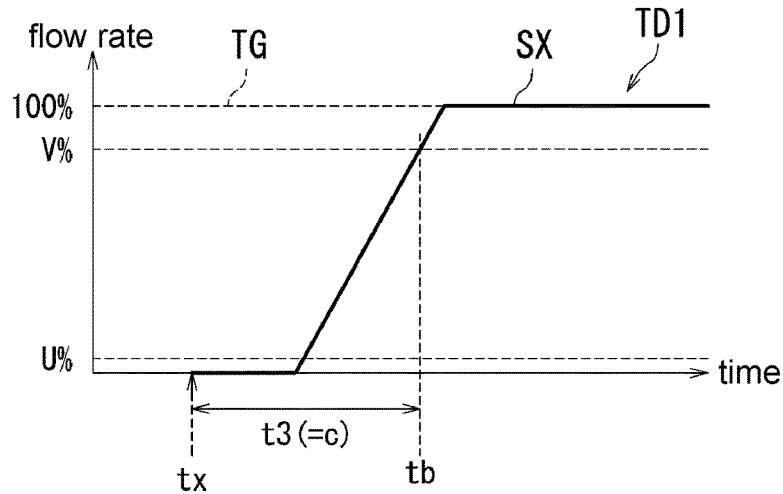
FIG. 11C is a diagram illustrating yet another example of the method of calculating first information.

FIGS. 11A to 11C are diagrams illustrating an example of a method of calculating the first information X1 included in the first feature quantity information XD1.

As illustrated in FIG. 11A, the feature quantity calculating part 613 calculates a time t1 by analyzing section data SX including an on-delay part. The time t1 is information a of the first information X1. The time t1 represents a period from the time tx of start of discharge control of a processing fluid to a rise stat time ta of the flow rate of the processing fluid. The rise start time ta represents a time when the flow rate becomes U % of a target value TG. For example, "U %" represents a value that is equal to or lower than 10%.

As illustrated in FIG. 11B, the feature quantity calculating part 613 calculates a time t2 by analyzing the section data SX including an on-delay part. The time t2 is information b of the first information X1. The time t2 represents a period from the rise start time ta of the flow rate of the processing fluid to the rise time tb of the flow rate of the processing fluid. The rise time tb represents a time when the flow rate becomes close to the target value TG. More specifically, the rise time tb represents a time when the flow rate becomes V % of the target value TG. V % is larger than U %. For example, "V %" represents a value that is equal to or higher than 70% and lower than 100%. The rise time tb can be described also as "a pseudo rise completion time tb."

In addition, the feature quantity calculating part 613 calculates an inclination angle θ1 representing a rise inclination of the flow rate by analyzing the section data SX including an on-delay part. The inclination angle θ1 is information d of the first information X1. For example, the inclination angle θ1 is an inclination angle of a straight line joining a flow rate value at the rise start time ta of the processing fluid and a flow rate value at the rise time tb or an inclination angle of an approximated straight line representing a flow rate value between the rise start time ta of the processing fluid and the rise time tb.

As illustrated in FIG. 11C, the feature quantity calculating part 613 calculates a time t3 by analyzing the section data SX including an on-delay part. The time t3 is information c of the first information X1. The time t3 represents a period from a discharge control start time tx of the processing fluid to the rise time tb of the flow rate of the processing fluid.

As described above with reference to FIGS. 11A to 11C, the times t1 to t3 and the inclination angle θ1 are indexes representing a delay until the flow rate of the processing fluid reaches the target value TG when the flow rate of the processing fluid increases toward the target value TG.

Figure 12:
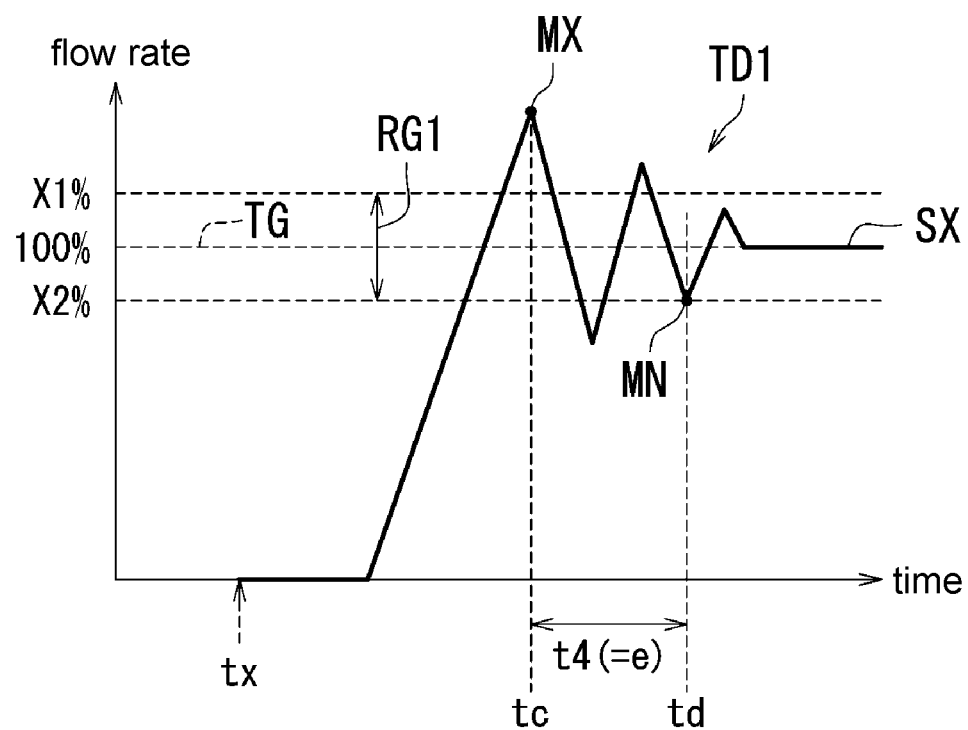
FIG. 12 is a diagram illustrating an example of a method of calculating second information included in the first feature quantity information according to this embodiment.

FIG. 12 is a diagram illustrating an example of a method of calculating the second information X2 included in the first feature quantity information XD1. As illustrated in FIG. 12, the feature quantity calculating part 613 calculates a time t4 by analyzing section data SX including an overshoot part. The time t4 is information e of the second information X2. The time t4 represents a period until a time td when a variation of a flow rate due to an overshoot of the flow rate enters a first predetermined range RG1 from a reference time tc. The reference time tc is set to a certain time from the discharge control start time tx to a time when the flow rate becomes a maximum value MX. The first predetermined range RG1 includes a target value TG of the flow rate.

In the example illustrated in FIG. 12, the reference time tc is a time when the flow rate becomes the maximum value MX. An upper limit value of the first predetermined range RG1 is X1% of the target value TG of the flow rate, and a lower limit value of the first predetermined range RG1 is X2% of the target value TG of the flow rate. For example, specific numerical values of X1% and X2% are set experimentally and/or empirically. For example, a time td when the variation of the flow rate enters the first predetermined range RG1 is a time when a local minimum value MN of the flow rate enters the first predetermined range RG1. The local minimum value MN is a minimum value in a local time section. For example, the time td when the variation of the flow rate enters the first predetermined range RG1 may be a time when a local maximum value of the flow rate enters the first predetermined range RG1. The local maximum value is a maximum value in a local time section.

For example, the time t4 represents a period until the flow rate continuously enters the first predetermined range RG1 after an occurrence of an overshoot.

In addition, the feature quantity calculating part 613 calculates a maximum value MX of the flow rate by analyzing the section data SX including the overshoot part. The maximum value MX of the flow rate is information f of the second information X2.

As described with reference to FIG. 12 above, the time t4 and the maximum value MX are indexes that represent a degree of the overshoot of the flow rate of the processing fluid. An overshoot is a phenomenon in which the flow rate exceeds the first predetermined range RG1 first time and passes through the first predetermined range RG1.

Figure 13:
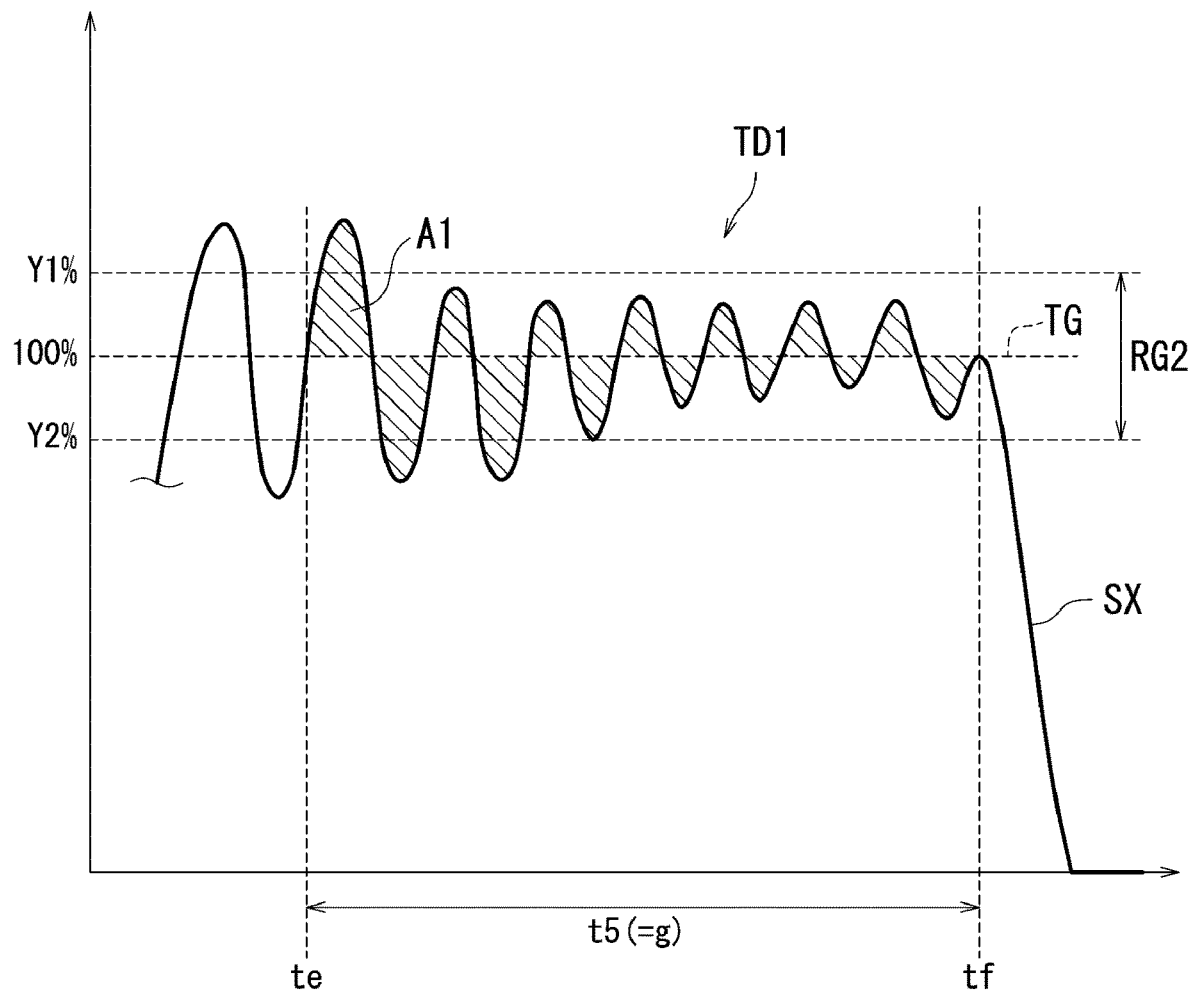
FIG. 13 is a diagram illustrating an example of a method of calculating third information included in the first feature quantity information according to this embodiment.

FIG. 13 is a diagram illustrating an example of a method of calculating the third information X3 included in the first feature quantity information XD1. As illustrated in FIG. 13, the feature quantity calculating part 613 calculates a time t5 by analyzing section data SX including a variation part of the flow rate. The time t5 is information g of the third information X3. The time t5 represents a period until a time tf when the variation of the flow rate comes into a stable state from the reference time te. The stable state represents a state in which the variation of the flow rate continuously enters a second predetermined range RG2 (within the range of Y1% to Y2%). For example, specific numerical values of Y1% and Y2% are set experimentally and/or empirically. For example, the feature quantity calculating part 613 determines that the variation of the flow rate is in a stable state in a case in which a local maximum value of the flow rate continuously enters the second predetermined range RG2 for a predetermined number of times, a case in which a local minimum value of the flow rate continuously enters the second predetermined range RG2 a predetermined number of times, or a case in which a local maximum value and a local minimum value of the flow rate continuously enter the second predetermined range RG2 a predetermined number of times.

The second predetermined range RG2 includes the target value TG. The second predetermined range RG2 is a range that is the same as the first predetermined range RG1 or is narrower than the first predetermined range RG1. The reference time te is set to a certain time until a predetermined time elapses from the discharge control start time tx of the processing fluid.

In a case in which an overshoot of the flow rate occurs, for example, the reference time te is a time when a predetermined time elapses from a time of convergence of the overshoot or a time when the flow rate becomes a maximum value MX. In a case in which an overshoot of the flow rate does not occur, for example, the reference time te is the discharge control start time tx, the rise start time ta of the flow rate, or a rise time tb of the flow rate.

In addition, the feature quantity calculating part 613 calculates an area A1 relating to the flow rate by analyzing section data SX including a variation part of the flow rate. The area A1 relating to the flow rate is information h of the third information X3. The area A1 represents a sum value of areas of parts enclosed by a straight line representing the target value TG of the flow rate and a line representing the flow rate in the section data SX (for example, a sum value of areas of shaded parts illustrated in FIG. 13) until the variation of the flow rate comes into a stable state from the reference time te. The stable state is similar to that of the case in which the time t5 is calculated. The area A1 may represent a sum value of areas of parts enclosed by the straight line representing the target value TG of the flow rate and the line representing the flow rate in the section data SX in a period set in advance.

In addition, the feature quantity calculating part 613 calculates a period T of the flow rate by analyzing section data SX including a variation part of the flow rate. The period T of the flow rate is information i of the third information X3. The period T represents a variation period of the flow rate until the variation of the flow rate comes into a stable state from the reference time te. The stable state is similar to that of the case in which the time t5 is calculated. The period T may represent a variation period of the flow rate in a period set in advance.

A reciprocal of the period T of the flow rate, in other words, a frequency fa of the flow rate may be information i of the first information X1.

As described with reference to FIG. 13 above, the time t5, the area A1, the period T, and the frequency fa are indexes that represent a degree of variations of the flow rate of the processing fluid. In other words, the time t5, the area A1, the period T, and the frequency fa are indexes that represent a degree of stability of the flow rate of the processing fluid.

Figure 14A:
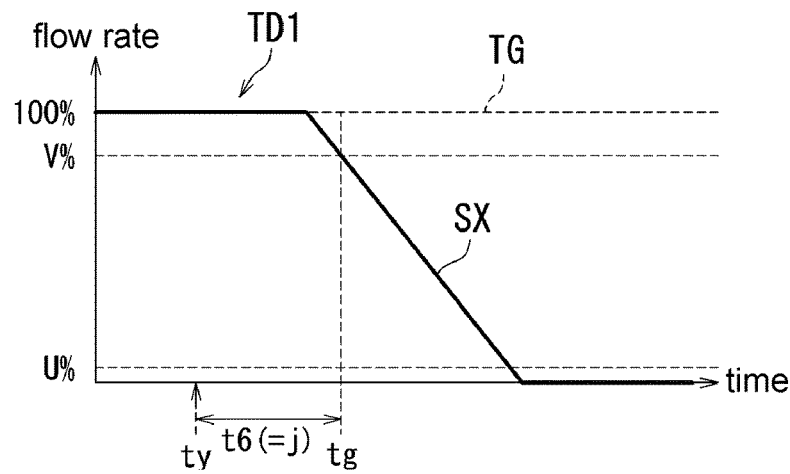
FIG. 14A is a diagram illustrating an example of a method of calculating fourth information included in the first feature quantity information according to this embodiment.
Figure 14B:
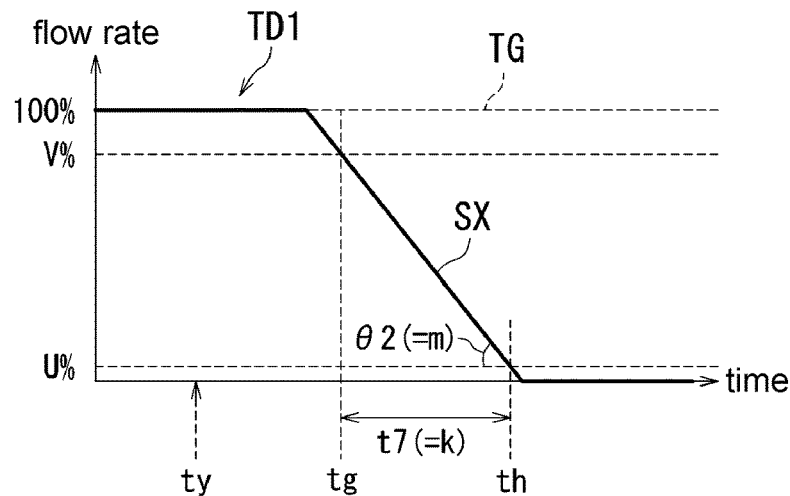
FIG. 14B is a diagram illustrating another example of the method of calculating fourth information.
Figure 14C:
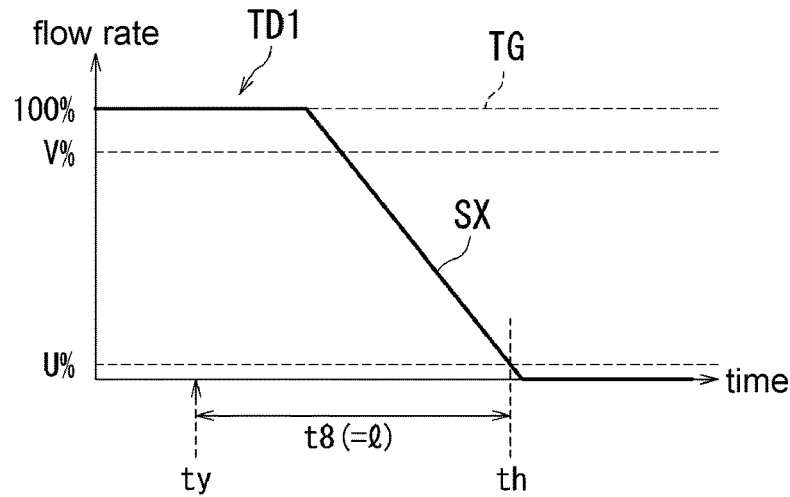
FIG. 14C is yet another example of the method of calculating fourth information.

FIGS. 14A to 14C are diagrams illustrating an example of a method of calculating fourth information X4 included in the first feature quantity information XD1.

As illustrated in FIG. 14A, the feature quantity calculating part 613 calculates a time t6 by analyzing section data SX including an off-delay part. The time t6 is information j of the fourth information X4. The time t6 represents a period from a discharge control stop time ty of the processing fluid to a fall start time tg of the flow rate of the processing fluid. The fall start time tg represents a time when the flow rate becomes V % of the target value TG. For example, "V %" represents a value that is equal to or higher than 70% and lower than 100%.

As illustrated in FIG. 14B, the feature quantity calculating part 613 calculates a time t7 by analyzing section data SX including an off-delay part. The time t7 is information k of the fourth information X4. The time t7 represents a period from the fall start time tg of the flow rate of the processing fluid to a fall time th of the flow rate of the processing fluid. The fall time th represents a time when the flow rate becomes close to a lower limit target value (for example, zero). More specifically, the fall time th represents at time when the flow rate becomes U % of the target value TG. For example, "U %" represents a value that is equal to or lower than 10%. The fall time th may be described as "a pseudo fall completion time th."

In addition, the feature quantity calculating part 613 calculates an inclination angle θ2 representing a fall inclination of the flow rate by analyzing section data SX including an off-delay part. The inclination angle θ2 is information m of the fourth information X4. For example, the inclination angle θ2 is an inclination angle of a straight line joining a flow rate value of the fall start time tg of the processing fluid and a flow rate value of the fall time th or an inclination angle of an approximated straight line representing a flow rate value between the fall start time tg and the fall time th of the processing fluid.

As illustrated in FIG. 14C, the feature quantity calculating part 613 calculates a time t8 by analyzing section data SX including an off-delay part. The time t8 is information l of the fourth information X4. The time t8 represents a period from the discharge control stop time ty of the processing fluid to the fall time th of the flow rate of the processing fluid.

As described with reference to FIGS. 14A to 14C above, the times t6 to t8 and the inclination angle θ2 are indexes that represent a delay until the flow rate of the processing fluid reaches the lower limit target value when the flow rate of the processing fluid decreases toward the lower limit target value (for example, zero).

Figure 15:
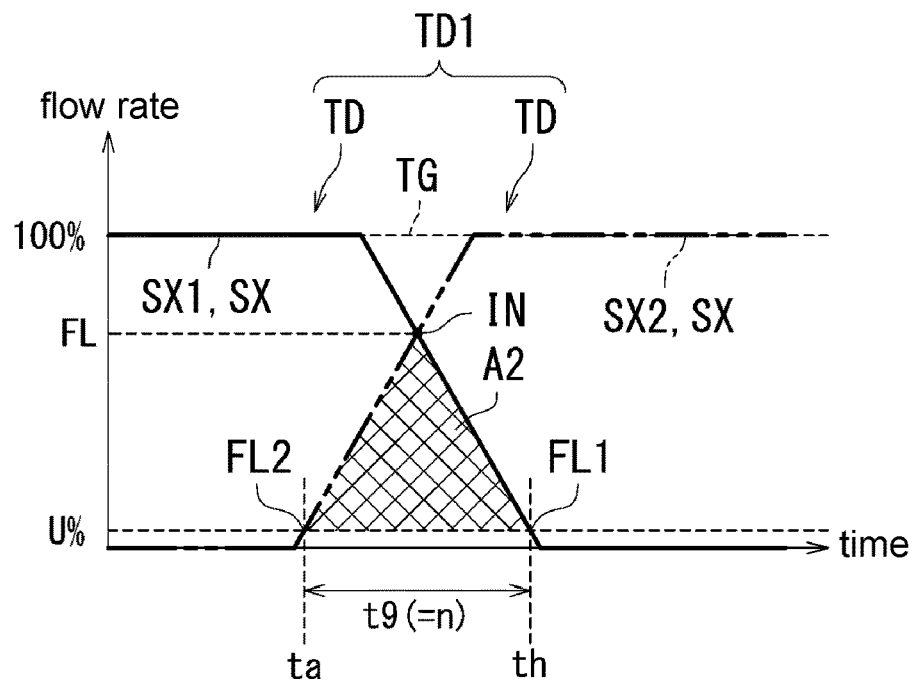
FIG. 15 is a diagram illustrating an example of a method of calculating fifth information included in the first feature quantity information according to this embodiment.

FIG. 15 is a diagram illustrating an example of a method of calculating the fifth information X5 included in the first feature quantity information XD1. As illustrated in FIG. 15, the feature quantity calculating part 613 calculates a time t9 by analyzing section data SX1 and SX2 including an overlapping part. The time t9 is information n of the fifth information X5. The section data SX1 is a part (a rear end part in time) of one piece of individual time series data TD out of pieces of individual time series data TD that are adjacent to each other, and the section data SX2 is a part (a rear end part in time) of the other piece of individual time series data TD. The time t9 represents a period in which the section data SX1 and the section data SX2 overlap each other. In other words, the time t9 represents a period in which the flow rate represented by the section data SX1 and the flow rate represented by the section data SX2 overlap each other. Furthermore, in other words, the time t9 represents a period in which a flow rate of one processing fluid out of different processing fluids and a flow rate of the other processing fluid overlap each other.

For example, the time t9 represents a period from a rise start time ta of the flow rate represented by the section data SX2 to a fall time th of the flow rate represented by the section data SX1 in an overlapping portion of the time series data TD1. In other words, the time t9 represents a time interval from the rise start time ta of the flow rate of one processing fluid out of different processing fluids to the fall time th of the flow rate of the other processing fluid in an overlapping portion of the time series data TD1.

In addition, the feature quantity calculating part 613 calculates an area A2 by analyzing section data SX1 and section data SX2 including an overlapping portion. The area A2 is information o of the fifth information X5. The area A2 represents an area of the overlapping portion between the section data SX1 and the section data SX2. In other words, the area A2 represents an area of an overlapping part between a flow rate of one processing fluid out of different processing fluids and a flow rate of the other processing fluid.

For example, the area A2 represents an area of a part enclosed by a line representing from a flow rate FL2 of the rise start time ta of the flow rate represented by section data SX2 to an intersection IN (a flow rate FL), a line representing from a flow rate FL1 of the fall time th of the flow rate represented by the section data SX1 to the intersection IN (the flow rate FL), and a line from the flow rate FL2 of the rise start time ta to the flow rate FL1 of the fall time th in the overlapping portion of the time series data TD1.

In addition, the feature quantity calculating part 613 calculates the flow rate FL of the intersection IN by analyzing the section data SX1 and the section data SX2 including the overlapping portion. The flow rate FL of the intersection IN is information p of the fifth information X5. The flow rate FL represents a flow rate of the intersection IN between a line representing a flow rate represented by the section data SX1 and a line representing a flow rate represented by the section data SX2. In other words, the flow rate FL represents a flow rate of an intersection IN between a line representing a flow rate of one processing fluid out of different processing fluids and a line representing a flow rate of the other processing fluid.

As described with reference to FIG. 15 above, the time t9, the area A2, and the flow rate FL of the intersection IN are indexes representing a degree of overlap between flow rates of processing fluids.

Figure 16:
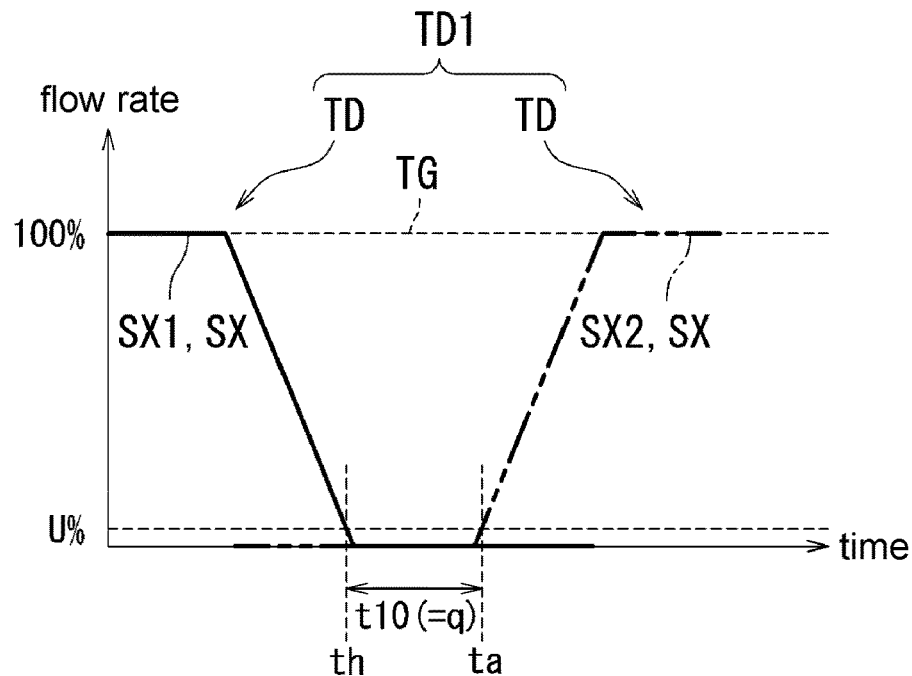
FIG. 16 is a diagram illustrating an example of a method of calculating sixth information included in the first feature quantity information according to this embodiment.

FIG. 16 is a diagram illustrating an example of a method of calculating sixth information X6 included in the first feature quantity information XD1. As illustrated in FIG. 16, the feature quantity calculating part 613 calculates a time t10 by analyzing section data SX1 and section data SX2 including an interval part. The time t10 is information q of the fifth information X5. The time t10 represents a time interval between a flow rate of a processing fluid represented by the section data SX1 and a flow rate of a processing fluid represented by the section data SX2. In other words, the time t10 represents a time interval on a time axis between one processing fluid out of different processing fluids and the other processing fluid.

For example, the time t10 represents a time from a fall time th of the flow rate represented by the section data SX1 to a rise start time ta of the flow rate represented by the section data SX2 in the interval part of the time series data TD1. In other words, the time t10 represents a time from the fall time th of the flow rate of one processing fluid out of different processing fluids to the rise start time ta of the flow rate of the other processing fluid.

As described with reference to FIG. 16 above, the time t10 is an index that presents a degree of an interval between flow rates of the processing fluids.

Here, in the descriptions presented with reference to FIGS. 11A to 16, the information a to the information p of the first feature quantity information XD1 (the times t1 to t10, the inclination angles θ1 and θ2, the maximum value MX, the areas A1 and A2, the period T, and the flow rate FL) have been described with "the flow rate" illustrated as "a physical quantity of an object" as an example. Here, the information a to the information p of the first feature quantity information XD1 can be generalized and defined as below.

In other words, in the descriptions of the first feature quantity information XD1 presented with reference to FIGS. 11A to 16, "a flow rate" can be rephrased with "a physical quantity," "a processing liquid" can be rephrased with "an object," "a discharge control start time" can be rephrased with "a use control start time," and "a discharge control stop time" can be rephrased with "a use control stop time." In such a case, "the use control start time" represents a time when the control part 3A outputs a use start instruction signal for an object to a component of the substrate processing device 200. The use start instruction signal represents a signal that is used for an instruction for starting to use an object. The "use control stop time" represents a time when the control part 3A outputs a use stop instruction signal for an object to a component of the substrate processing device 200. The use stop instruction signal represents a signal that is used for an instruction for stopping to use an object.

As described with reference to FIGS. 8 to 16 above, according to this embodiment, the first feature quantity information XD1 is represented using times. Thus, a feature of the time transition of the section data SX in the time series data TD1 can be extracted with high accuracy in a simple manner. As a result, by performing machine learning of the learning data TND including the first feature quantity information XD1, a learned model LM having high estimation accuracy can be generated.

Particularly, in this embodiment, the first feature quantity information XD1 representing a feature of the time transition is extracted from section data SX that is a part of the time series data TD1. Thus, there is one feature part that is included in the section data SX. As a result, a feature part can be further easily extracted from the time series data TD1. In addition, the first feature quantity information XD1 can be easily labeled with the abnormality factor information YD.

In other words, in this embodiment, the acquisition part 611 acquires the section data SX from the time series data TD1 such that there is one feature part of the time transition.

In addition, in this embodiment, when the time series data TD1 is directly input from the substrate processing device 200 to the learning data generating device 400 as raw data, the learning data generating device 400 calculates a feature quantity XD. Thus, a user of the substrate processing device 200 is not required to analyze and process the time series data TD1. As a result, a user's burden can be reduced.

Next, the abnormality factor information YD will be described with reference to FIG. 17. FIG. 17 is a diagram illustrating the abnormality factor information YD.

First, the first abnormality factor information YD1 of the abnormality factor information YD will be described. As illustrated in FIG. 17, the first abnormality factor information YD1 includes at least one piece of factor information among the first factor information Y101 to the ninth factor information Y109. In the example illustrated in FIG. 17, the first abnormality factor information YD1 includes the first factor information Y101 to the ninth factor information Y109.

The first factor information Y101 is information that represents a degree of a landing defect of a rinse liquid on the chuck member 130 or the learning target substrate W1 due to a defect in the position of the nozzle NZ.

The second factor information Y102 is information that represents a degree of scattering of a processing liquid due to interference between a processing liquid discharged from a nozzle NZ that is a target for switching and a processing liquid discharged from another nozzle NZ when the nozzle NZ that is the target for switching is switched to another nozzle NZ.

The third factor information Y103 is information that represents a degree of instability of a flow rate of a processing fluid (for example, a liquid medicine or a reactance gas).

The fourth factor information Y104 is information that represents a degree of variation of a density of a processing fluid (for example, a liquid medicine or a reactance gas).

The fifth factor information Y105 is information that represents a degree of instability of a flow rate of a mixed fluid when a plurality of processing fluids is mixed using a mixing valve such as the mixing valve V23.

The sixth factor information Y106 is information that represents a degree of the learning target substrate W1 not being covered with a processing liquid when the processing liquid discharged to the learning target substrate W1 spreads on the surface of the learning target substrate W1.

The seventh factor information Y107 is information that represents a degree of the amount of a fallen processing liquid when the processing liquid attached to an outer face of the nozzle NZ falls onto the surface of the learning target substrate W1. For example, there are cases in which, when a nozzle NZ that is a target for switching is switched to another nozzle NZ, a processing liquid discharged from the nozzle NZ that is the target for switching and a processing liquid discharged from another nozzle NZ interfere with each other, and the processing liquid is scattered. In such cases, there is a possibility of the scattered processing liquid being attached to the outer face of the nozzle NZ.

The eighth factor information Y108 is information that represents a degree of mixing of a processing fluid that has been previously discharged to a learning target substrate W1 into a processing fluid discharged later. For example, in a case in which an interval part needs to be secured, a processing fluid that has been previously discharged mixing into a processing fluid discharged later may affect the processing of the learning target substrate W1. In addition, for example, also in a case in which an overlapping portion needs to be secured, a processing fluid that has been previously discharged being excessively mixed into a processing fluid discharged later may affect the processing of the learning target substrate W1.

The ninth factor information Y109 is information that represents a degree of another processing fluid being mixed into a processing fluid that is a collection target when the processing fluid is collected after the learning target substrate W1 is processed. For example, in a case in which an interval part needs to be secured, when a processing fluid that has been previously discharged is mixed into a processing fluid discharged later, in a case in which the processing fluid discharged later is collected and used, it may affect the processing of the learning target substrate W1. In addition, for example, also in a case in which an overlapping portion needs to be secured, when a processing fluid that has been previously discharged is excessively mixed into a processing fluid discharged later, in a case in which the processing fluid discharged later is collected and used, it may affect the processing of the learning target substrate W1.

As described with reference to FIG. 17 above, the first factor information Y101 to the ninth factor information Y109 are information relating to a processing fluid at the time of processing the learning target substrate W1 and represent factors of abnormalities of the learning target substrate W1 after processing using the processing fluid (hereinafter, may be referred to as "abnormality factors"). Each of pieces of the first factor information Y101 to the ninth factor information Y109, for example, may represent the "degree" described above in two levels of "problem" or "no problem" or may represent the "degree" described above in three or more levels.

Next, the second abnormality factor information YD2 of the abnormality factor information YD will be described. As illustrated in FIG. 17, the second abnormality factor information YD2 includes at least one piece of factor information among the first factor information Y201 to the seventh factor information Y207. In the example illustrated in FIG. 17, the second abnormality factor information YD2 includes first factor information Y201 to the seventh factor information Y207.

The first factor information Y201 is information that represents a degree of an operation defect of a flow rate control valve such as the flow rate control valve V11. The flow rate control valve, for example, is a motor needle valve.

The second factor information Y202 is information that represents a degree of an operation defect of valves such as the valves V12, V21, V22, and V23.

The third factor information Y203 is information that represents a degree of an operation defect of a pump such as the pump 55. In addition, the third factor information Y203 may include information that represents a degree of an operation defect of a pulse damper such as the pulse damper 56. Operation defects of the pump and the pulse damper may cause pulsation of the processing liquid.

The fourth factor information Y204 is information that represents a degree of variations of the pressure at the source of the processing fluid supplied to the nozzle NZ.

The fifth factor information Y205 is information that represents an operation defect of the flow rate meter FW.

The sixth factor information Y206 is information that represents a degree of a fault of the recipe information RP.

The seventh factor information Y207 is information that represents a degree of a setting mistake of the parameter information PM.

As described with reference to FIG. 17 above, the first factor information Y201 to the seventh factor information Y207 are information relating to components of the substrate processing device 200 and represent factors of abnormalities (hereinafter, may be referred to "abnormality factor") of the learning target substrate W1 after processing using a processing fluid. In addition, each of the first factor information Y201 to the seventh factor information Y207, for example, may represent the "degree" described above in two levels of "problem" or "no problem" or may represent the "degree" described above in three or more levels.

Next, an example of a correlation between the first abnormality factor information YD1, the second abnormality factor information YD2, and the first feature quantity information XD1 will be described with reference to FIGS. 10 and 17.

For example, due to an abnormality factor represented by at least one of the first factor information Y201, the second factor information Y202, and the fifth factor information Y205 of the second abnormality factor information YD2, there is a possibility that a state in which an on-delay and/or an off-delay of the processing fluid increase or decrease may occur. The on-delay of the processing fluid is represented in the first information X1 of the first feature quantity information XD1, and the off-delay of the processing fluid is represented in the fourth information X4 of the first feature quantity information XD1. Thus, there is a correlation between the first feature quantity information XD1 and the second abnormality factor information YD2.

In addition, there is a possibility that an abnormality factor represented by at least one of the first factor information Y201, the second factor information Y202, and the fifth factor information Y205 of the second abnormality factor information YD2 may cause an abnormality factor represented by at least one of the sixth factor information Y106, the second factor information Y102, and the seventh factor information Y107 of the first abnormality factor information YD1. Thus, also the first abnormality factor information YD1 has a correlation with the first feature quantity information XD1 that has a correlation with the second abnormality factor information YD2.

For example, there is a possibility that an overshoot of the processing fluid may occur due to an abnormality factor represented by at least one of the first factor information Y201 and the second factor information Y202 of the second abnormality factor information YD2. On the other hand, an overshoot of the processing fluid is represented by the second information X2 of the first feature quantity information XD1. Thus, there is a correlation between the first feature quantity information XD1 and the second abnormality factor information YD2.

In addition, there is a possibility that an abnormality factor represented by at least one of the first factor information Y201 and the second factor information Y202 of the second abnormality factor information YD2 may cause an abnormality factor represented by at least one of the first factor information Y101 and the second factor information Y102 of the first abnormality factor information YD1. Thus, also the first abnormality factor information YD1 has a correlation with the first feature quantity information XD1 that has a correlation with the second abnormality factor information YD2.

For example, due to an abnormality factor represented by at least one of the third factor information Y203 and the fourth factor information Y204 of the second abnormality factor information YD2, there is a possibility that a variation of the processing fluid may increase. Meanwhile, the variation of the processing fluid is represented by the third information X3 of the first feature quantity information XD1. Thus, there is a correlation between the first feature quantity information XD1 and the second abnormality factor information YD2.

In addition, there is a possibility that an abnormality factor represented by at least one of the third factor information Y203 and the fourth factor information Y204 of the second abnormality factor information YD2 may cause an abnormality factor represented by at least one of the third factor information Y103, the fourth factor information Y104, and the fifth factor information Y105 of the first abnormality factor information YD1. Thus, also the first abnormality factor information YD1 has a correlation with the first feature quantity information XD1 that has a correlation with the second abnormality factor information YD2.

For example, due to an abnormality factor represented by at least one of the sixth factor information Y206, the seventh factor information Y207, the first factor information Y201, and the second factor information Y202 of the second abnormality factor information YD2, there is a possibility that a state in which an overlap between processing fluids increases or decreases or a state in which an interval between processing fluids increases or decreases may occur. Meanwhile, the overlap between processing fluids is represented by the fifth information X5 of the first feature quantity information XD1, and the interval between processing fluids is represented by the sixth information X6 of the first feature quantity information XD1. Thus, there is a correlation between the first feature quantity information XD1 and the second abnormality factor information YD2.

In addition, there is a possibility that an abnormality factor represented by at least one of the sixth factor information Y206, the seventh factor information Y207, the first factor information Y201, and the second factor information Y202 of the second abnormality factor information YD2 may cause an abnormality factor represented by at least one of the sixth factor information Y106, the second factor information Y102, the eighth factor information Y108, and the ninth factor information Y109 of the first abnormality factor information YD1. Thus, also the first abnormality factor information YD1 has a correlation with the first feature quantity information XD1 that has a correlation with the second abnormality factor information YD2.

Next, an example of a correlation between the abnormality factor information YD and the second feature quantity information XD2 will be described with reference to FIGS. 10 and 17.

For example, depending on a processing order in lots and/or a lot interval, a use time frame and a total use time from a time of a new product of each component of the substrate processing device 200 differ. As a result, there is a possibility that an abnormality factor represented by the abnormality factor information YD may occur. Meanwhile, the second feature quantity information XD2 includes processing order information XA and lot interval information XB. Thus, there is a correlation between the abnormality factor information YD and the second feature quantity information XD2.

Next, an example of a correlation between the abnormality factor information YD and the third feature quantity information XD3 will be described with reference to FIGS. 10 and 17.

For example, section data SX included in the third feature quantity information XD3 includes a feature part of the time transition. An abnormality factor represented by the abnormality factor information YD appears as a feature of the time transition of the section data SX. Thus, there is a correlation between the abnormality factor information YD and the third feature quantity information XD3.

Figure 18:
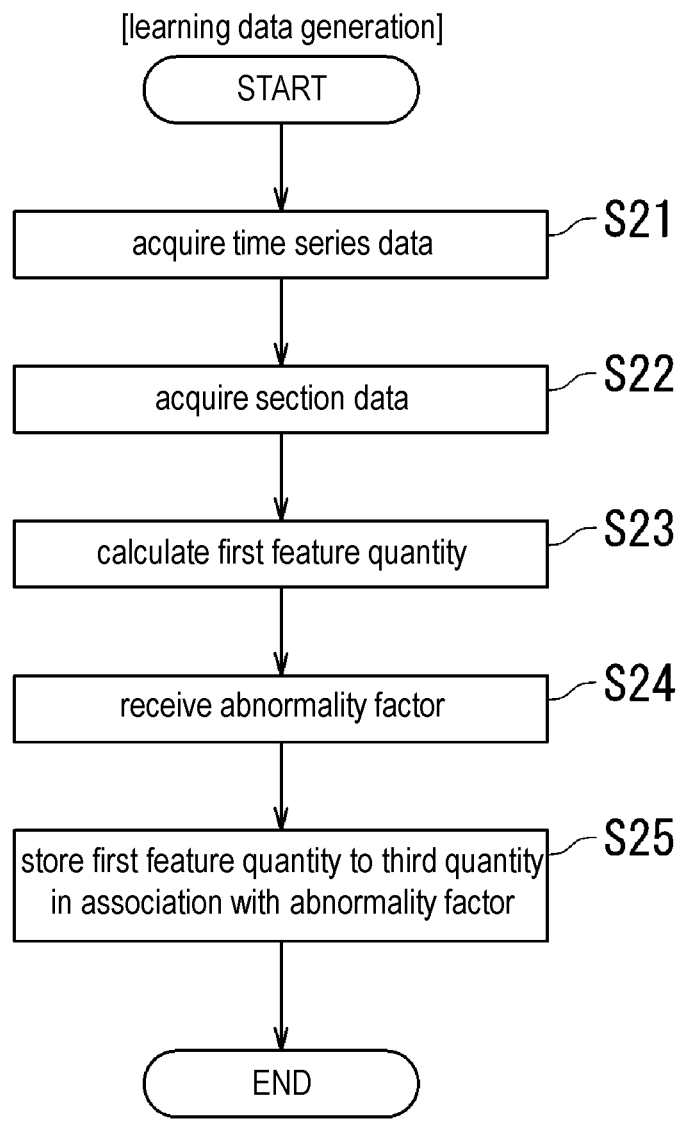
FIG. 18 is a flowchart illustrating a learning data generating method according to this embodiment.

Next, a learning data generating method executed by the learning data generating device 400 will be described with reference to FIGS. 8 and 18. FIG. 18 is a flowchart illustrating the learning data generating method according to this embodiment. As illustrated in FIG. 18, the learning data generating method includes Steps S21 to S24.

As illustrated in FIGS. 8 and 18, in Step S21, the acquisition part 611 of the learning data generating device 400 acquires time series data TD1 from the substrate processing device 200.

Next, in Step S22, the acquisition part 611 acquires at least one piece of section data SX from the time series data TD1. In this embodiment, the acquisition part 611 acquires a plurality of pieces of section data SX from the time series data TD1.

Next, in Step S23, the feature quantity calculating part 613 of the learning data generating device 400 calculates first feature quantity information XD1 on the basis of a plurality of pieces of section data SX. More specifically, the feature quantity calculating part 613 calculates first information X1, second information X2, third information X3, fourth information X4, fifth information X5, or sixth information X6 configuring the first feature quantity information XD1 for each piece of section data SX on the basis of each piece of section data SX.

Next, in Step S24, the acquisition part 611 of the learning data generating device 400 receives abnormality factor information YD through the input part 4D.

Next, in Step S25, the storage control part 63 of the learning data generating device 400 performs control of the storage part 4B such that the first feature quantity information XD1, the second feature quantity information XD2, and the third feature quantity information XD3 are stored in association with the abnormality factor information YD. As a result, the storage part 4B stores the first feature quantity information XD1, the second feature quantity information XD2, and the third feature quantity information XD3 in association with the abnormality factor information YD. In other words, by labeling the first feature quantity information XD1, the second feature quantity information XD2, and the third feature quantity information XD3 with the abnormality factor information YD, learning data TND is generated.

As above, by executing Steps S21 to S24 using the learning data generating device 400, generation of one piece of learning data TND corresponding to one learning target substrate W1 ends.

Figure 19:
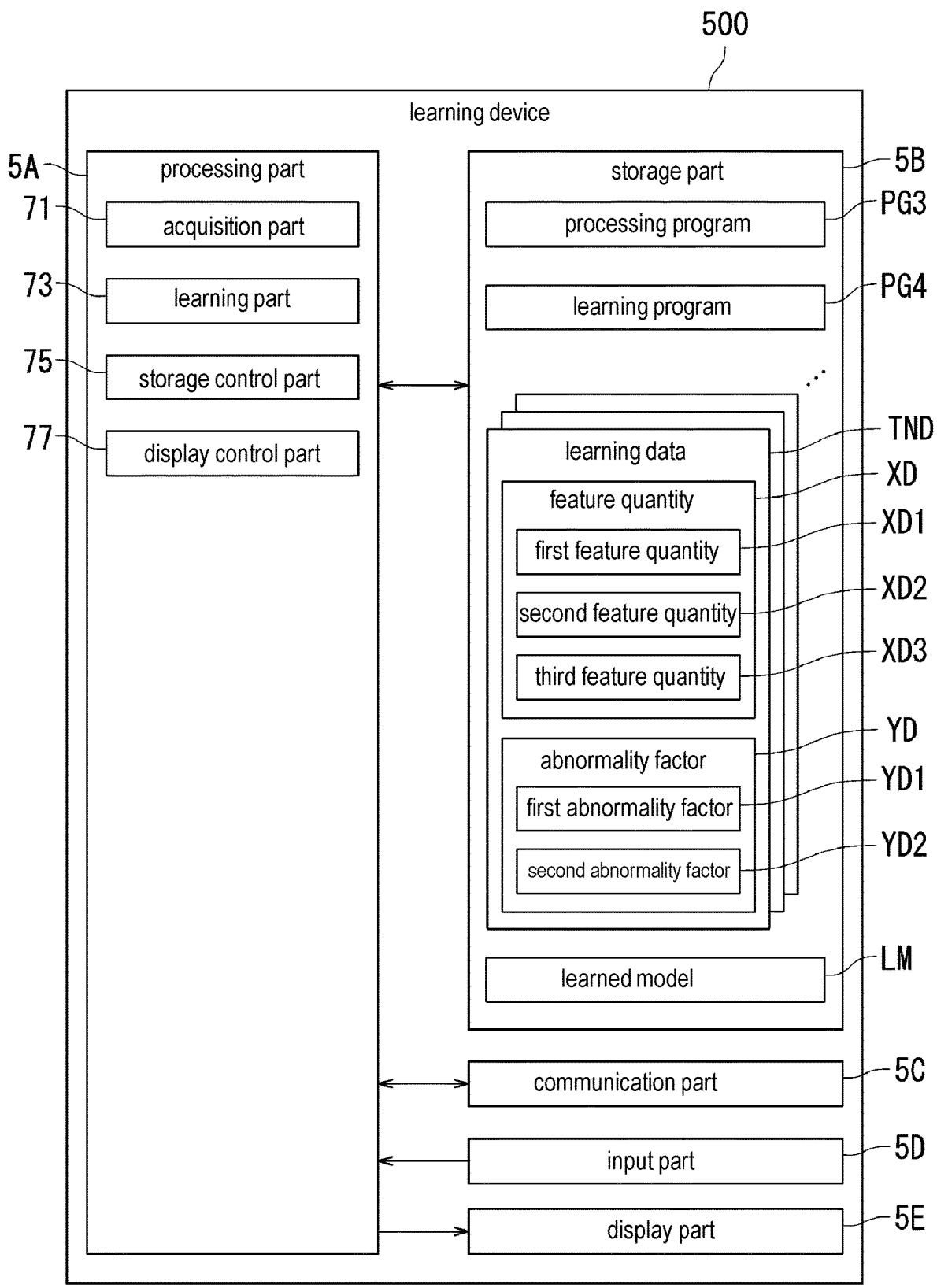
FIG. 19 is a block diagram illustrating a learning device according to this embodiment.

Next, the learning device 500 will be described with reference to FIG. 19. The learning device 500, for example, is a computer. FIG. 19 is a block diagram illustrating the learning device 500. As illustrated in FIG. 19, the learning device 500 includes a processing part 5A, a storage part 5B, a communication part 5C, an input part 5D, and a display part 5E.

The processing part 5A includes processors such as a CPU and a GPU. The storage part 5B includes a storage device and stores data and computer programs. The processor of the processing part 5A executes a computer program stored by the storage device of the storage part 5B and executes various processes. For example, the storage part 5B, similar to the storage part 3B, includes a main storage device and an auxiliary storage device and may include a removable medium. For example, the storage part 5B is a non-transitory computer-readable storage medium.

More specifically, the storage part 5B stores a processing program PG3. The processing part 5A functions as an acquisition part 71, a learning part 73, a storage control part 75, and a display control part 77 by executing the processing program PG3. In other words, the processing part 5A includes the acquisition part 71, the learning part 73, the storage control part 75, and the display control part 77

The communication part 5C is connected to a network and communicates with an external device. The communication part 5C is a communicator and, for example, is a network interface controller.

The input part 5D is an input device that is used for inputting various kinds of information to the processing part 5A. For example, the input part 5D is a keyboard and a pointing device or a touch panel.

The display part 5E displays an image. For example, the display part 5E is a liquid crystal display or an organic electroluminescence display.

Subsequently, the processing part 5A will be described with reference to FIG. 19. The acquisition part 71 of the processing part 5A acquires a plurality of pieces of learning data TND from the learning data generating device 400. For example, the acquisition part 71 acquires a plurality of pieces of learning data TND from the learning data generating device 400 through a network and the communication part 5C.

The storage control part 75 performs control of the storage part 5B such that each of the pieces of learning data TND is stored. As a result, the storage part 5B stores each of the pieces of learning data TND.

The storage part 5B stores a learning program PG4. The learning program PG4 is a program for executing a machine learning algorithm that is used for finding a certain rule in the plurality of pieces of learning data TND and generating a learned model LM expressing the found rule.

The machine learning algorithm is not particularly limited as long as it is supervised learning and, for example, is a decision tree, a nearest neighbor algorithm, a Naive Bayes classifier, a support vector machine, or a neural network. Thus, the learned model LM includes the decision tree, the nearest neighbor algorithm, the Naive Bayes classifier, the support vector machine, or the neural network. In the machine learning for generating the learned model LM, an error back propagation method may be used.

For example, the neural network includes an input layer, one or a plurality of intermediate layers, and an output layer. More specifically, the neural network is a deep neural network (DNN), a recurrent neural network (RNN), or a convolutional neural network (CNN) and performs deep learning. For example, the deep neural network includes an input layer, a plurality of intermediate layers, and an output layer.

The learning part 73 performs machine learning of the plurality of pieces of learning data TND on the basis of the learning program PG4. As a result, a certain rule is found from among the plurality of pieces of learning data TND, and a learned model LM is generated. In other words, the learned model LM is constructed by performing machine learning of the learning data TND. The storage part 5B stores the learned model LM.

More specifically, the learning part 73 finds a certain rule between the feature quantity XD and the abnormality factor information YD included in the learning data TND and generates a learned model LM. The feature quantity XD is an explanatory variable, and the abnormality factor information YD is an objective variable.

More specifically, the learning part 73 calculate a plurality of learned parameters by performing machine learning of the plurality of pieces of learning data TND based on the learning program PG4 and generates a learned model LM including one or more functions to which the plurality of learned parameters are applied. The learned parameters are parameters (coefficients) acquired on the basis of results of machine learning using the plurality of pieces of learning data TND.

The learned model LM causes a computer to function such that input information (hereinafter, it may be referred to as "input information IF1") is input, and output information (hereinafter, it may be referred to as "output information IF2" is output. In other words, the learned model LM receives the input information IF1 as an input and outputs the output information IF2. More specifically, the learned model LM causes a computer to function such that factors of abnormalities of a processing target substrate W2 after processing using a processing fluid are estimated. In other words, the learned model LM estimates factors of abnormalities of the processing target substrate W2 after processing using a processing fluid.

As described with reference to FIG. 19 above, according to this embodiment, the learning device 500 performs machine learning of the learning data TND including the first feature quantity information XD1 in which features of a time transition of section data SX in the time series data TD1 are represented with high accuracy using times. As a result, a learned model LM having high estimation accuracy of factors of abnormalities of the processing target substrate W2 can be generated.

Especially, abnormality factors (FIG. 17) represented by the first abnormality factor information YD1 (the first factor information Y201 to the seventh factor information Y207) and the second abnormality factor information YD2 (the first factor information Y101 to the ninth factor information Y109) may be causes of an occurrence of a particle defect in the substrate W. Thus, by using the learned model LM that is generated by executing machine learning using the abnormality factor information YD (the first abnormality factor information YD1 and the second abnormality factor information YD2) as objective variables corresponding to the output of the learned model LM, an abnormality factor when a particle defect occurs in the processing target substrate W2 can be estimated. Here, the particle defect is a defect of the substrate W that is due to particles such as attachment of particles to the substrate W.

In this embodiment, the first feature quantity information XD1 that is a target for machine learning includes at least one piece of information (FIG. 10) among the first information X1 to the sixth information X6. Thus, machine learning of feature parts of a time transition in the time series data TD1 can be effectively performed.

In this embodiment, the second feature quantity information XD2 that is a target of machine learning includes at least one of the processing order information XA and the lot interval information XB (FIG. 10). For example, depending on a processing order in lots and/or a lot interval, a use time frame and a total use time from a time of a new product of each component of the substrate processing device 200 differ. As a result, there is a possibility that an abnormality factor represented by the abnormality factor information YD may occur. Thus, by performing machine learning of the processing order information XA and/or the lot interval information XB, estimation accuracy of abnormality factors of the learned model LM can be further improved.

Furthermore, in this embodiment, the third feature quantity information XD3 that is a target for machine learning includes section data SX. Thus, machine learning of row data including features of a time transition of the time series data TD1 can be performed. As a result, estimation accuracy of abnormality factors of the learned model LM can be further improved. Particularly, since the section data SX is a part of the time series data TD1, an execution time of machine learning can be shortened more than that of a case in which machine learning of all the time series data TD1 is performed.

The display control part 77 performs control of the display part 5E such that the learning data TND is displayed. As a result, the display part 5E displays the learning data TND.

Figure 20:
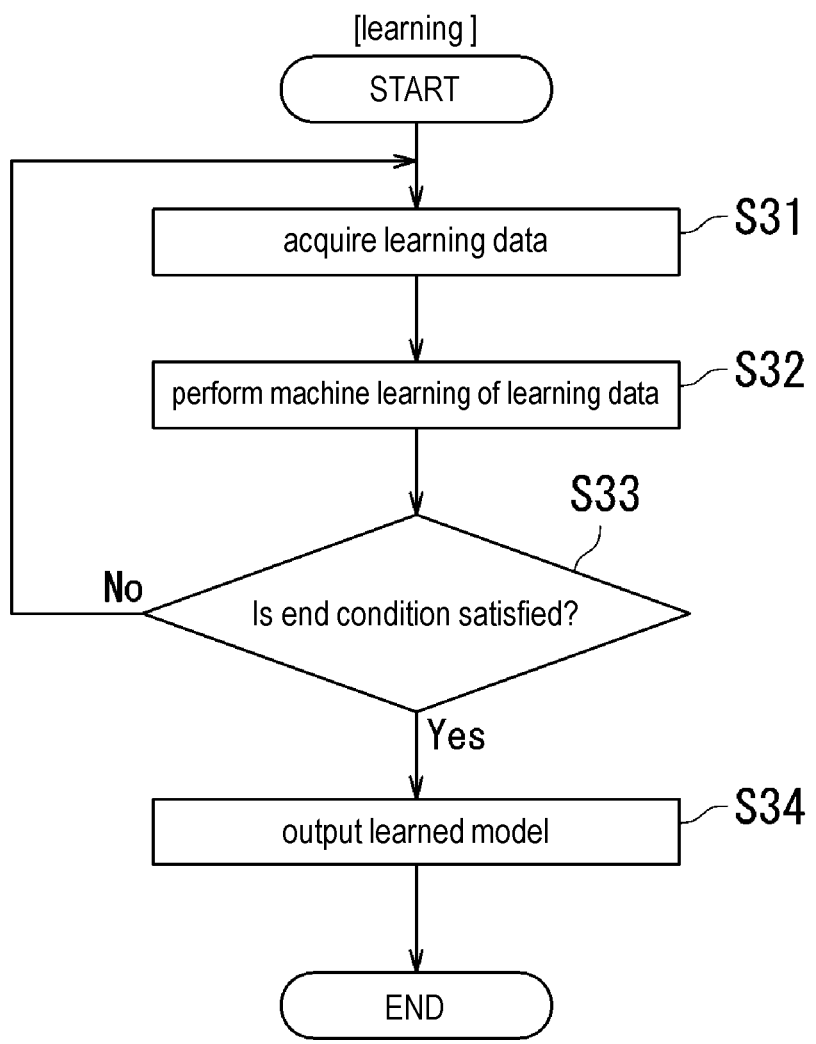
FIG. 20 is a flowchart illustrating a learning method according to this embodiment.

Next, a learning method executed by the learning device 500 will be described with reference to FIGS. 19 and 20. FIG. 20 is a flowchart illustrating a learning method according to this embodiment. As illustrated in FIG. 20, the learning method includes Steps S31 to S34.

As illustrated in FIGS. 19 and 20, in Step S31, the acquisition part 71 of the learning device 500 acquires a plurality of pieces of learning data TND from the learning data generating device 400.

Next, in Step S32, the learning part 73 performs machine learning of the plurality of pieces of learning data TND on the basis of the learning program PG4.

Next, in Step S33, the learning part 73 determines whether or not a learning end condition is satisfied. The learning end condition is a condition set in advance for ending machine learning. For example, the learning end condition is the number of times of repetition reaching a specified number of times.

In a case in which "No" is determined in Step S33, the process proceeds to Step S31. As a result, the machine learning is repeated.

On the other hand, in a case in which "Yes" is determined in Step S33, the process proceeds to Step S34.

In Step S34, the learning part 73 outputs a model (one or more functions) to which a plurality of latest parameters (coefficients), in other words, a plurality of learned parameters (coefficient) are applied as a learned model LM. Then, the storage part 5B stores the learned model LM.

As above, by executing Steps S31 to S34 using the learning device 500, the learned model LM is generated.

Figure 21:
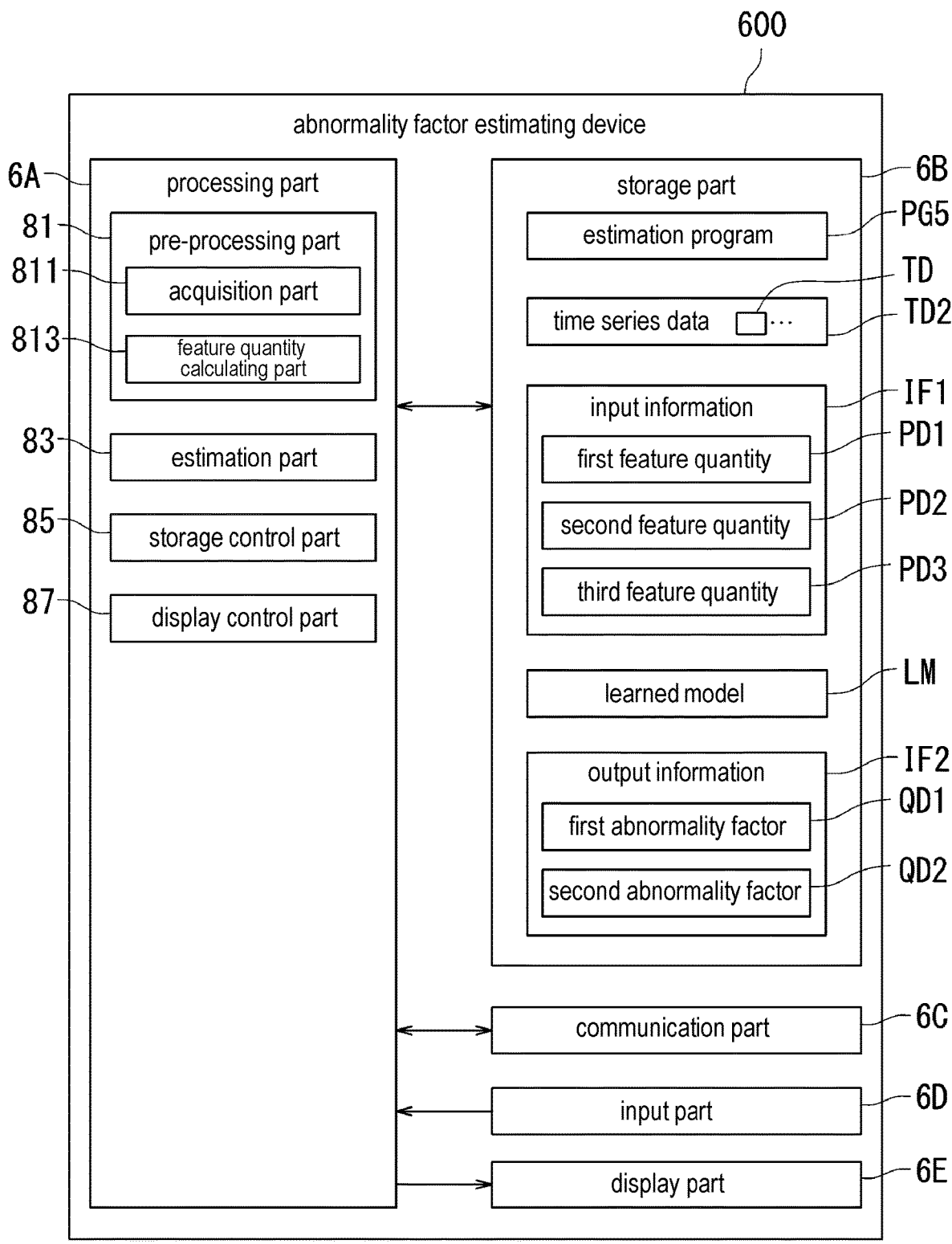
FIG. 21 is a block diagram illustrating an abnormality factor estimating device according to this embodiment.

Next, the abnormality factor estimating device 600 will be described with reference to FIG. 21. For example, the abnormality factor estimating device 600 is a computer. FIG. 21 is a block diagram illustrating the abnormality factor estimating device 600. As illustrated in FIG. 21, the abnormality factor estimating device 600 includes a processing part 6A, a storage part 6B, a communication part 6C, an input part 6D, and a display part 6E.

The processing part 6A includes processors such as a CPU and a GPU. The storage part 6B includes a storage device and stores data and computer programs. The processor of the processing part 6A executes a computer program stored by the storage device of the storage part 6B and executes various processes. For example, the storage part 6B, similar to the storage part 3B, includes a main storage device and an auxiliary storage device and may include a removable medium. For example, the storage part 6B is a non-transitory computer-readable storage medium.

More specifically, the storage part 6B stores an estimation program PG5. The processing part 6A functions as a pre-processing part 81, an estimation part 83, a storage control part 85, and a display control part 87 by executing the estimation program PG5. In other words, the processing part 6A includes the pre-processing part 81, the estimation part 83, the storage control part 85, and the display control part 87. The pre-processing part 81 includes an acquisition part 811 and a feature quantity calculating part 813.

The communication part 6C is connected to a network and communicates with an external device. The communication part 6C is a communicator and, for example, is a network interface controller.

The input part 6D is an input device that is used for inputting various kinds of information to the processing part 6A. For example, the input part 6D is a keyboard and a pointing device or a touch panel.

The display part 6E displays an image. For example, the display part 6E is a liquid crystal display or an organic electroluminescence display.

Subsequently, the processing part 6A will be described with reference to FIG. 21. The pre-processing part 81 of the processing part 6A generates input information IF1 on the basis of time series data TD2. The time series data TD2 represents physical quantities of an object used by the substrate processing device 300. The time series data TD2 includes at least one piece of individual time series data TD. Details of the individual time series data TD is similar to those of the individual time series data TD of the time series data TD1.

Then, the storage control part 85 performs control of the storage part 6B such that the input information IF1 is stored. As a result, the storage part 6B stores the input information IF1 in association with lot identification information and substrate identification information. For example, one piece of input information IF1 is generated for at least one piece of time series data TD2 acquired when one processing target substrate W2 is processed.

The input information IF1 is an explanatory variable. In other words, the input information IF1 is information that is input to the learned model LM. Details of the input information IF1 are similar to those of the feature quantity XD (FIG. 8).

The input information IF1 includes first feature quantity information PD1. The input information IF1 may include second feature quantity information PD2 and/or third feature quantity information PD3. In this embodiment, the input information IF1 includes the first feature quantity information PD1, the second feature quantity information PD2, and the third feature quantity information PD3. The first feature quantity information PD1 corresponds to one example of "first input information." The second feature quantity information PD2 corresponds to one example of "second input information." The third feature quantity information PD3 corresponds to one example of "third input information."

More specifically, the acquisition part 811 of the pre-processing part 81 acquires a plurality of pieces of time series data TD2 from the substrate processing device 300. In this case, lot identification information, substrate identification information, processing order information PA, and lot interval information PB are attached to each piece of time series data TD2. For example, the acquisition part 811 acquires a plurality of pieces of time series data TD2 from the substrate processing device 300 through a network and the communication part 6C. Definitions of the lot identification information, the substrate identification information, the processing order information PA, and the lot interval information PB are similar to those of the lot identification information, the substrate identification information, the processing order information XA, and the lot interval information XB attached to the time series data TD1.

Then, the storage part 6B stores each piece of time series data TD2 in association with the lot identification information, the substrate identification information, the processing order information XA, and the lot interval information XB.

In addition, the acquisition part 811 acquires at least one piece of section data from the time series data TD2. In this embodiment, the acquisition part 811 acquires a plurality of pieces of section data from the time series data TD2. The section data is data of a time section including a period in which a feature part of a time transition of the time series data appears and is a part of the time series data TD1. Hereinafter, the section data may be collectively referred to as "section data SP."

Then, the feature quantity calculating part 813 calculates first feature quantity information PD1 on the basis of the section data SP for each piece of section data SP. The first feature quantity information PD1 represents a feature of the time transition of the section data SP. The first feature quantity information PD1 is represented using times. The operation of the feature quantity calculating part 813 is similar to the operation of the feature quantity calculating part 613 (FIG. 8).

The second feature quantity information PD2 is the processing order information PA that represents an order of processing for a predetermined number of processing target substrates W2 configuring one lot or the lot interval information PB that represents a time interval from the end of processing of a lot to the start of processing of a next lot.

The third feature quantity information PD3 is section data SP, object information (hereinafter, referred to as "object information IDC") or physical quantity information (hereinafter, referred to as "physical quantity information IDD"). The section data SP is section data that is acquired from the time series data TD2 by the acquisition part 811.

The object information IDC is information that is used for identifying an object used by the substrate processing device 300.

The physical quantity information IDD is information that is used for identifying a type of physical quantity of an object used by the substrate processing device 300.

As described with reference to FIG. 21 above, the storage part 6B stores the first feature quantity information PD1, the second feature quantity information PD2, and the third feature quantity information PD3 as input information IF1.

In addition, the storage part 6B stores the learned model LM.

The estimation part 83 inputs the input information IF1 to the learned model LM and acquires output information IF2 from the learned model LM. The output information IF2 represents factors of abnormalities of the processing target substrate W2 after processing using a processing fluid. The output information IF2 is an objective variable. In other words, the output information IF2 is information that is output from the learned model LM. Details of the output information IF2 are similar to those of the abnormality factor information YD (FIG. 8).

More specifically, the output information IF2 includes at least one of first abnormality factor information QD1 and second abnormality factor information QD2. In this embodiment, the output information IF2 includes the first abnormality factor information QD1 and the second abnormality factor information QD2. The first abnormality factor information QD1 corresponds to one example of "first output information," and the second abnormality factor information QD2 corresponds to one example of "second output information."

The first abnormality factor information QD1 is information relating to a processing fluid at the time of processing the processing target substrate W2 using the substrate processing device 300 and is information representing factors of abnormalities of the processing target substrate W2 after processing using the processing fluid. The second abnormality factor information QD2 is information relating to a component of the substrate processing device 300 and is information representing factors of abnormalities of the processing target substrate W2 after processing using the processing fluid.

The display control part 65 performs control of the display part 6E such that the output information IF2 is displayed. As a result, the display part 6E displays the output information IF2.

As described with reference to FIG. 21 above, according to this embodiment, the learned model LM is generated by performing machine learning of the learning data TND including the first feature quantity information XD1 in which a feature of the time transition of the section data SX in the time series data TD1 is expressed with high accuracy using times. As a result, by using the learned model LM, factors of abnormalities of the processing target substrate W2 can be estimated with high accuracy.

In addition, in this embodiment, when the time series data TD2 is directly input from the substrate processing device 300 to the abnormality factor estimating device 600 as raw data, the pre-processing part 81 calculates input information IF1. Thus, a user of the substrate processing device 300 is not required to analyze and process the time series data TD2. As a result, a user's burden can be reduced.

Figure 22:
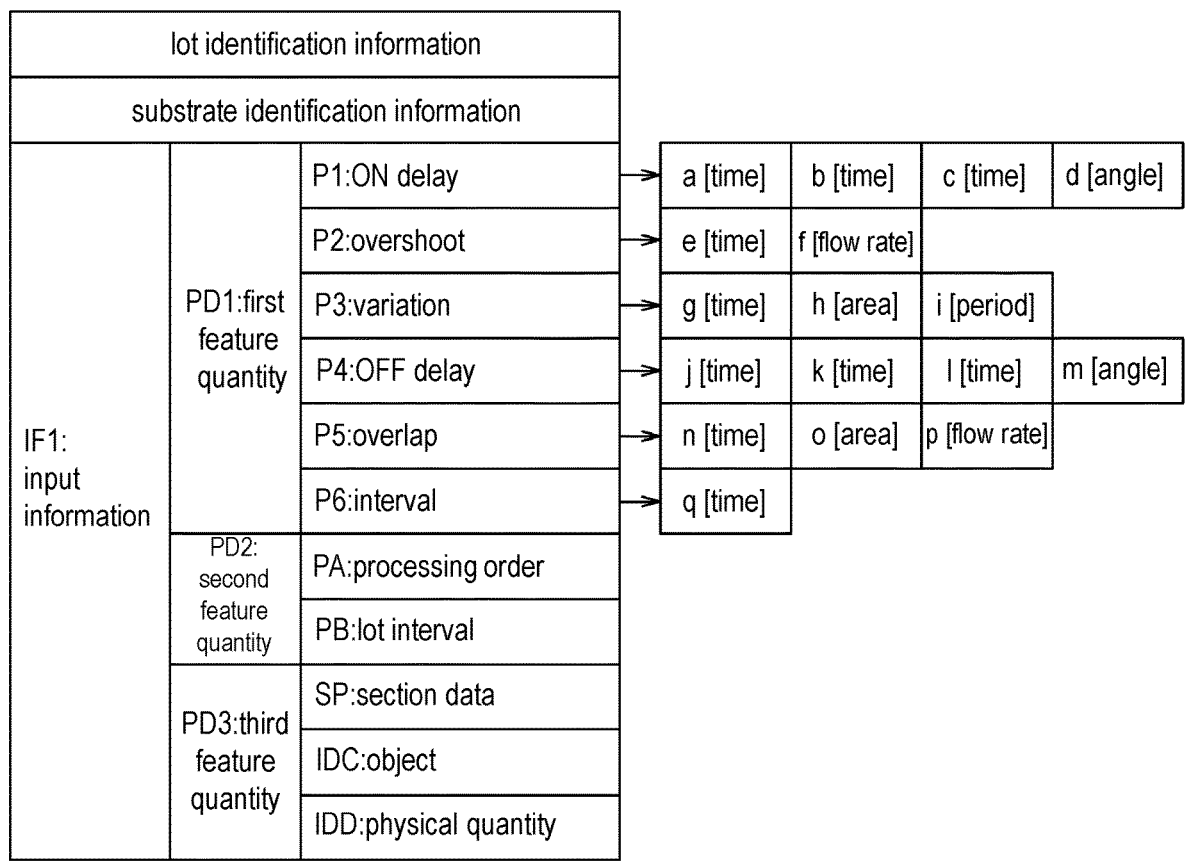
FIG. 22 is a diagram illustrating input information according to this embodiment.

Next, the input information IF1 will be described with reference to FIG. 22. FIG. 22 is a diagram illustrating the input information IF1. As illustrated in FIG. 22, the first feature quantity information PD1 of the input information IF1 includes at least one of first information P1 to sixth information P6. In the example illustrated in FIG. 22, the first feature quantity information PD1 includes the first information P1 to the sixth information P6.

The first information P1 is information representing a state of a physical quantity when the physical quantity increases toward a target value. The first information P1 includes at least one of information a to information d. The second information P2 is information that represents an overshoot of the physical quantity. The second information P2 includes at least one of information e and information f. The third information P3 is information that represents variations of the physical quantity. The third information P3 includes at least one of information g to information i.

The fourth information P4 is information that represents a state of a physical quantity when the physical quantity decreases from a target value. The fourth information P4 includes at least one of information j to information m. The fifth information P5, when the substrate processing device 300 uses at least two different objects, is information that represents an overlap between a physical quantity of one object out of the two objects and a physical quantity of the other object. The fifth information P5 includes at least one of information n to information p. The sixth information P6, when the substrate processing device 300 uses at least two different objects, is information that represents a time interval between one object out of the two objects and the other object on a time axis. The sixth information P6 includes information q.

In the example illustrated in FIG. 22, the first information P1 includes information a to information d. The second information P2 includes information e and information f. The third information P3 includes information g to information i. The fourth information P4 includes information j to information m. The fifth information P5 includes information n to information p.

The second feature quantity information PD2 includes at least one of the processing order information PA and the lot interval information PB. In the example illustrated in FIG. 22, the second feature quantity information PD2 includes the processing order information PA and the lot interval information PB.

The third feature quantity information PD3 includes at least one of section data SP, object information IDC, and physical quantity information IDD. In the example illustrated in FIG. 22, the third feature quantity information PD3 includes the section data SP, the object information IDC, and the physical quantity information IDD.

Here, details of the first feature quantity information PD1 are similar to those of the first feature quantity information XD1. More specifically, details of the first information P1 to the sixth information P6 are respectively similar to the details of the first information X1 to the sixth information X6. Details of the information a to the information q of the first information P1 to the sixth information P6 are respectively similar to the details of the information a to the information q of the first information X1 to the sixth information X6. In addition, details of the second feature quantity information PD2 are similar to the details of the second feature quantity information XD2. More specifically, details of the processing order information PA and the lot interval information PB are similar to the details of the processing order information XA and the lot interval information XB. In addition, details of the third feature quantity information PD3 are similar to the details of the third feature quantity information XD3. More specifically, details of the section data SP, the object information IDC, and the physical quantity information IDD are respectively similar to the details of the section data SX, the object information IDA, and the physical quantity information IDB. In addition, details of the time series data TD2 output by the substrate processing device 300 are similar to the details of the time series data TD1 output by the substrate processing device 200. Furthermore, details of the section data SP are similar to the details of the section data SX.

Thus, in descriptions of the first feature quantity information XD1, the first information X1 to the sixth information X6, the information a to the information q of the first information X1 to the sixth information X6, the second feature quantity information XD2, the processing order information XA, the lot interval information XB, the third feature quantity information XD3, the section data SX, the object information IDA, the physical quantity information IDB, the time series data TD1, and the section data SX (FIGS. 8 to 17), by appropriately rephrasing the acquisition part 611 with the acquisition part 811, rephrasing the feature quantity calculating part 613 with the feature quantity calculating part 813, rephrasing the storage control part 63 with the storage control part 85, rephrasing the storage part 4B with the storage part 6B, rephrasing the substrate processing device 200 with the substrate processing device 300, and rephrasing the learning target substrate W1 with the processing target substrate W2, descriptions of the first feature quantity information PD1, the first information P1 to the sixth information P6, the information a to the information q of the first information P1 to the sixth information P6, the processing order information PA, the lot interval information PB, the section data SP, the object information IDC, the physical quantity information IDD, the time series data TD2, the section data SP, the acquisition part 811, the feature quantity calculating part 813, the storage control part 85, and the storage part 6B can be provided.

Next, the output information IF2 will be described with reference to FIG. 23. FIG. 23 is a diagram illustrating the output information IF2. As illustrated in FIG. 23, the first abnormality factor information QD1 of the output information IF2 includes at least one of first factor information Q101 to ninth factor information Q109. In the example illustrated in FIG. 23, the first abnormality factor information QD1 includes the first factor information Q101 to the ninth factor information Q109.

The second abnormality factor information QD2 includes at least one of first factor information Q201 to seventh factor information Q207. In the example illustrated in FIG. 23, the second abnormality factor information QD2 includes the first factor information Q201 to the seventh factor information Q207.

Here, details of the first abnormality factor information QD1 are similar to the details of the first abnormality factor information YD1. More specifically, details of the first factor information Q101 to the ninth factor information Q109 are respectively similar to the details of the first factor information Y101 to the ninth factor information Y109 (FIG. 17). In addition, details of the second abnormality factor information QD2 are similar to the details of the second abnormality factor information YD2. More specifically, details of the first factor information Q201 to the seventh factor information Q207 are respectively similar to the details of the first factor information Y201 to the seventh factor information Y207 (FIG. 17).

Thus, in descriptions of the first abnormality factor information YD1, the first factor information Y101 to the ninth factor information Y109, the second abnormality factor information YD2, and the first factor information Y201 to the seventh factor information Y207 (FIGS. 8 to 17), by appropriately rephrasing the substrate processing device 200 with the substrate processing device 300 and rephrasing the learning target substrate W1 with the processing target substrate W2, descriptions of the first abnormality factor information QD1, the first factor information Q101 to the ninth factor information Q109, the second abnormality factor information QD2, and the first factor information Q201 to the seventh factor information Q207 can be provided.

In addition, similar to the case in which there are correlations between the first abnormality factor information YD1 and the second abnormality factor information YD2 and the first feature quantity information XD1, there are also correlations between the first abnormality factor information QD1 and the second abnormality factor information QD2 and the first feature quantity information PD1.

Figure 24:
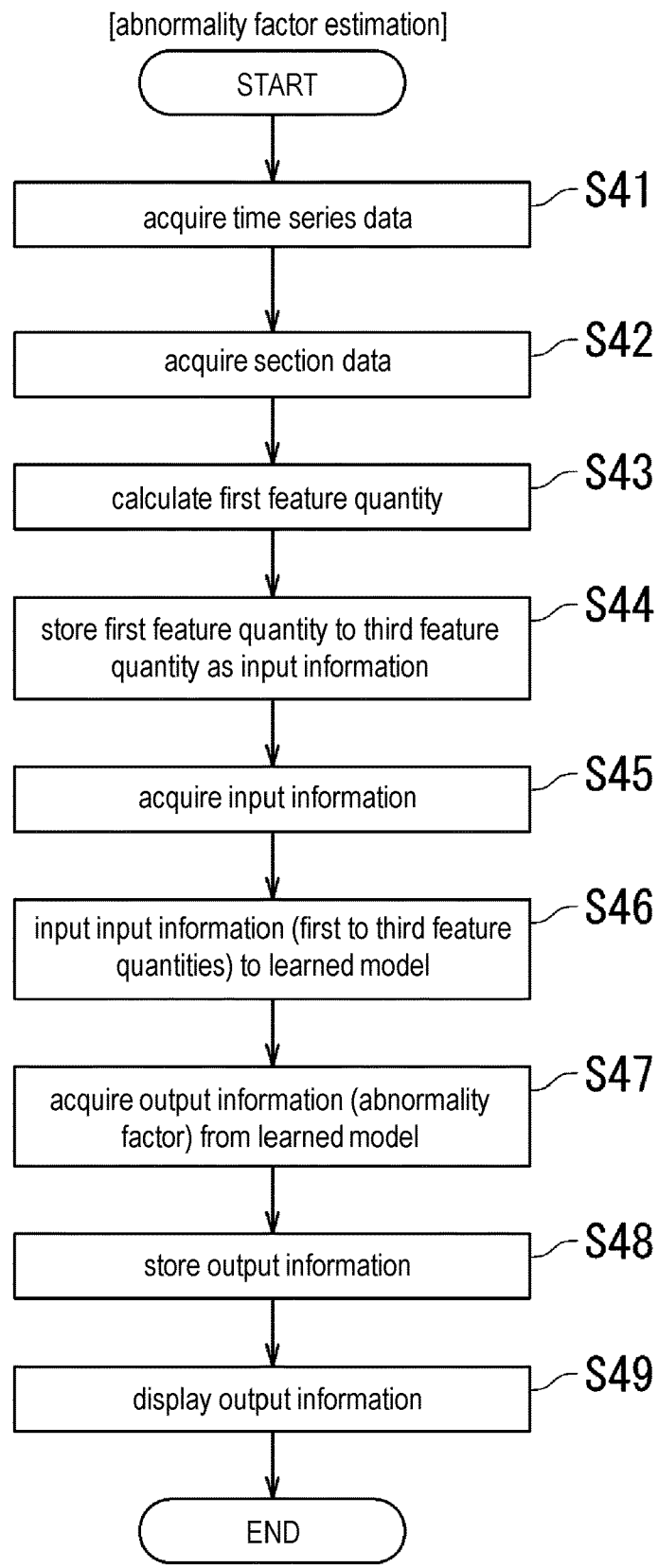
FIG. 24 is a flowchart illustrating an abnormality factor estimating method according to this embodiment.

Next, an abnormality factor estimating method executed by the abnormality factor estimating device 600 will be described with reference to FIGS. 21 and 24. FIG. 24 is a flowchart illustrating the abnormality factor estimating method according to this embodiment. As illustrated in FIG. 24, the abnormality factor estimating method includes Steps S41 to S49.

As illustrated in FIGS. 21 and 22, in Step S41, the acquisition part 811 of the abnormality factor estimating device 600 acquires time series data TD2 from the substrate processing device 300.

Next, in Step S42, the acquisition part 811 acquires at least one piece of section data SP from the time series data TD2. In this embodiment, the acquisition part 811 acquires a plurality of pieces of section data SP from the time series data TD2.

Next, in Step S43, the feature quantity calculating part 813 of the abnormality factor estimating device 600 calculates first feature quantity information PD1 on the basis of the plurality of pieces of section data SP. More specifically, the feature quantity calculating part 813 calculates first information P1, second information P2, third information P3, fourth information P4, fifth information P5, or sixth information P6 configuring the first feature quantity information PD1 for each piece of section data SP on the basis of each piece of section data SP.

Next, in Step S44, the storage control part 85 of the abnormality factor estimating device 600 performs control of the storage part 6B such that the first feature quantity information PD1, the second feature quantity information PD2, and the third feature quantity information PD3 are stored as input information IF1. As a result, the storage part 6B stores the first feature quantity information PD1, the second feature quantity information PD2, and the third feature quantity information PD3 as the input information IF1.

Next, in Step S45, the estimation part 83 acquires the input information IF1 from the storage part 6B.

Next, in Step S46, the estimation part 83 inputs the input information IF1 to the learned model LM. As a result, the learned model LM estimates factors of abnormalities of the processing target substrate W2 after processing using a processing fluid and outputs output information IF2.

Preferably, the learned model LM outputs the first factor information Q101 to the ninth factor information Q109 and the first factor information Q201 to the seventh factor information Q207 configuring the output information IF2 in order of highest to lowest likelihood.

Next, in Step S47, the estimation part 83 acquires the output information IF2 from the learned model LM. The output information IF2 represents factors of abnormalities of the processing target substrate W2 after processing using a processing fluid.

Next, in Step S48, the storage control part 85 performs control of the control part 6B such that the output information IF2 is stored. As a result, the storage part 6B stores the output information IF2.

Next, in Step S49, the display control part 87 performs control of the display part 6E such that the output information IF2 is displayed. As a result, the display part 6E displays the output information IF2.

Preferably, the display control part 87 performs control of the display part 6E such that the first factor information Q101 to the ninth factor information Q109 and the first factor information Q201 to the seventh factor information Q207 configuring the output information IF2 are displayed in order of highest to lowest likelihood. As a result, the display part 6E displays the first factor information Q101 to the ninth factor information Q109 and the first factor information Q201 to the seventh factor information Q207 in order of highest to lowest likelihood.

As above, by executing Steps S41 to S49 using the abnormality factor estimating device 600, one piece of output information IF2 corresponding to one processing target substrate W2 is output, and the process ends.

In the description presented above, as a typical example of a physical quantity of an object, the flow rate of the processing fluid has been mainly described. Hereinafter, other examples of a physical quantity of an object will be described.

[Object: Processing Fluid, Physical Quantity: Temperature]

In a case in which time series data TD1 output by the substrate processing device 200 represents a temperature of a processing fluid detected by the temperature sensor TS, the first feature quantity information XD1, for example, includes at least one of the first information X1 to the fourth information X4. In this case, in the definitions of the first information X1 to the fourth information X4 described with reference to FIG. 10 and the like, the processing fluid is rephrased with a temperature. By generating a learned model LM through machine learning by employing a temperature as the time series data TD1, an abnormal factor in a case in which an etching defect occurs in a substrate W can be estimated using the learned model LM. The reason for this is that the temperature of a processing fluid has an influence on etching.

Similar to the first feature quantity information XD1 of a learning stage, the first feature quantity information PD1 in a use stage, for example, includes at least one of the first information P1 to the fourth information P4, and the processing fluid is rephrased with a temperature.

[Object: Processing Fluid, Physical Quantity: Density]

In a case in which time series data TD1 output by the substrate processing device 200 represents a density of a processing fluid detected by the sensor SN, the first feature quantity information XD1, for example, includes the third information X3. In this case, in the definitions of the third information X3 described with reference to FIG. 10 and the like, the processing fluid is rephrased with a density. By generating a learned model LM through machine learning by employing a density as the time series data TD1, an abnormal factor in a case in which an etching defect occurs in a substrate W can be estimated using the learned model LM. The reason for this is that, particularly, the density of a processing fluid has an influence on etching.

Similar to the first feature quantity information XD1 of a learning stage, the first feature quantity information PD1 in a use stage, for example, also includes the third information P3, and the processing fluid is rephrased with a density.

[Object: Spin Chuck 13, Physical Quantity: Number of Revolutions]

In a case in which time series data TD1 output by the substrate processing device 200 represents the number of revolutions of the spin chuck 13 detected by the sensor SN, the first feature quantity information XD1, for example, includes at least one of the first information X1 to the fourth information X4. In this case, in the definitions of the first information X1 to the fourth information X4 described with reference to FIG. 10 and the like, the processing fluid is rephrased with the spin chuck 13, and the flow rate is rephrased with the number of revolutions. By generating a learned model LM through machine learning by employing the number of revolutions as the time series data TD1, an abnormal factor in a case in which a particle defect occurs in a substrate W can be estimated using the learned model LM.

Similar to the first feature quantity information XD1 of a learning stage, the first feature quantity information PD1 in a use stage, for example, also includes at least one of the first information P1 to the fourth information P4, the processing fluid is rephrased with the spin chuck 13, and the flow rate is rephrased with the number of revolutions.

[Object: Blocking Plate 291, Physical Quantity: Position, Displacement, Number of Revolutions]

In a case in which time series data TD1 output by the substrate processing device 200 represents a position, a displacement, or the number of revolutions of the blocking plate 291 detected by the sensor SN, the first feature quantity information XD1, for example, is represented by a time that can be calculated from the position or the displacement of the blocking plate 291 at the time of raising/lowering or is represented by the number of revolutions of the blocking plate 291 at the time of rotation. This similarly applies also to the first feature quantity information PD1.

[Object: Arm AM, Physical Quantity: Position, Displacement]

In a case in which time series data TD1 output by the substrate processing device 200 represents a position or a displacement of the arm AM detected by the sensor SN, the first feature quantity information XD1, for example, is represented by a time that can be calculated from the position or the displacement of the arm AM at the time of executing a scanning process. This similarly applies also to the first feature quantity information PD1.

[Object: Guard 33, Physical Quantity: Position, Displacement]

In a case in which time series data TD1 output by the substrate processing device 200 represents a position or a displacement of the guard 33 detected by the sensor SN, the first feature quantity information XD1, for example, is represented by a time that can be calculated from the position or the displacement of the guard 33 at the time of raising/lowering the guard 33. This similarly applies also to the first feature quantity information PD1.

[Object: Valve VB, Physical Quantity: Degree of Opening]

In a case in which time series data TD1 output by the substrate processing device 200 represents a degree of opening of the valve VB detected by the sensor SN, the first feature quantity information XD1, for example, is represented by a change of the degree of opening of the valve VB with respect to time at the time of opening/closing the valve VB. This similarly applies also to the first feature quantity information PD1.

Next, a case in which an object used by the substrate processing devices 200 and 300 is a processing fluid, and a physical quantity of the object represents a physical quantity of the processing fluid inside a discharge pipe P7 discharging the processing fluid will be described.

[Flow Rate Meter FW3 of Discharge Pipe P7]

In a case in which time series data TD1 output by the substrate processing device 200 is a flow rate of a processing fluid detected by a flow rate meter FW3 interposed in the discharge pipe P7 illustrated in FIG. 5, the first feature quantity information XD1 is information representing a feature part of a time transition of the flow rate using times. This similarly applies also to the first feature quantity information PD1.

[Temperature Sensor TS7 of Discharge Pipe P7]

In a case in which time series data TD1 output by the substrate processing device 200 is a temperature of a processing fluid detected by a temperature sensor TS7 disposed in the discharge pipe P7 illustrated in FIG. 5, the first feature quantity information XD1 is information representing a feature part of a time transition of the temperature using times. This similarly applies also to the first feature quantity information PD1.

Here, FIG. 1 may represent either the physical configuration or the logical configuration of the substrate processing device 200, the substrate processing device 300, the learning data generating device 400, the learning device 500, and the abnormality factor estimating device 600. Thus, some or all of the substrate processing device 200, the substrate processing device 300, the learning data generating device 400, the learning device 500, and the abnormality factor estimating device 600 may be configured as one device.

For example, the substrate processing device 200 may include the learning data generating device 400. In such a case, for example, the control part 3A and the storage part 3B of the substrate processing device 200 function as the processing part 4A and the storage part 4B of the learning data generating device 400.

For example, the substrate processing device 200 may include the learning data generating device 400 and the learning device 500. In such a case, for example, the control part 3A and the storage part 3B of the substrate processing device 200 function as the processing part 4A and the storage part 4B of the learning data generating device 400 and the processing part 5A and the storage part 5B of the learning device 500.

For example, the substrate processing device 200 may include the learning data generating device 400, the learning device 500, and the abnormality factor estimating device 600. In such a case, for example, the control part 3A and the storage part 3B of the substrate processing device 200 function as the processing part 4A and the storage part 4B of the learning data generating device 400, the processing part 5A and the storage part 5B of the learning device 500, and the processing part 6A and the storage part 6B of the abnormality factor estimating device 600.

Similarly, the substrate processing device 200 may include the learning data generating device 400, may include the learning data generating device 400 and the learning device 500, or may include the learning data generating device 400, the learning device 500, and the abnormality factor estimating device 600.

For example, the abnormality factor estimating device 600 may include the learning device 500. For example, the abnormality factor estimating device 600 may include the learning device 500 and the learning data generating device 400. In such a case, duplicate functions of the pre-processing part 81 and the learning data generating part 61 can be omitted. For example, the learning device 500 may include the learning data generating device 400.

For example, a server or a host computer may receive the output information IF2 from the abnormality factor estimating device 600 through a network and display the output information IF2 in a display device.

For example, two or more of the learning data generating device 400, the learning device 500, and the abnormality factor estimating device 600 may be combined, and a device acquired through the combination may be configured by a server.

For example, at least one of the learning data generating device 400, the learning device 500, and the abnormality factor estimating device 600 may be configured by a server.

For example, the substrate processing device 200 that processes the learning target substrate W1 may function as the substrate processing device 300 that processes the processing target substrate W2, and vice versa.

For example, the pre-processing part 81 and the estimation part 83 of the abnormality factor estimating device 600 may be configured as separate devices.

As above, the embodiments of the present disclosure have been described with reference to the drawings. However, the present disclosure is not limited to the embodiments described above and can be performed in various forms in a range not departing from the scope or spirit thereof. In addition, a plurality of constituent elements disclosed in the embodiments described above may be appropriately altered. For example, a certain constituent element among all the constituent elements illustrated in a certain embodiment may be added to the constituent elements of another embodiment, or several constituent elements may be removed from a certain embodiment among all the constituent elements illustrated in the embodiment.

In the drawings, each constituent element is schematically illustrated as a subject for easy understanding, and a thickness, a length, the number, an interval, and the like of each constituent element illustrated in the drawings may be different from those of an actual case due to situations of generation of the drawings. In addition, the configuration of each constituent element illustrated in each of the embodiments described above is an example and is not particularly limited, and it is apparent that various changes can be made in a range not substantially departing from the effects of the present disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A learned model generating method comprising:
acquiring learning data; and
generating a learned model for estimating a factor of an abnormality of a processing target substrate after processing using a processing fluid by performing machine learning of the learning data,
wherein the learning data comprises a feature quantity and abnormality factor information,
wherein the abnormality factor information represents a factor of an abnormality of a learning target substrate after processing using the processing fluid,
wherein the feature quantity comprises first feature quantity information representing a feature of a time transition of section data in time series data representing a physical quantity of an object used by a substrate processing device that processes the learning target substrate using the processing fluid,
wherein the first feature quantity information is represented using times,
wherein the first feature quantity information comprises at least one of first information, second information, third information, fourth information, fifth information, and sixth information,
wherein the first information is information representing a state of the physical quantity when the physical quantity increases toward a target value,
wherein the second information is information representing an overshoot of the physical quantity,
wherein the third information is information representing variations of the physical quantity,
wherein the fourth information is information representing the state of the physical quantity when the physical quantity decreases from the target value,
wherein, when the substrate processing device uses at least two different objects, the fifth information is information representing an overlap between the physical quantity of one object out of the two objects and the physical quantity of the other object, and
wherein the sixth information is information representing a time interval on a time axis between the one object and the other object.

2. The learned model generating method according to claim 1,
wherein the abnormality factor information comprises at least one of first abnormality factor information and second abnormality factor information,
wherein the first abnormality factor information is information relating to the processing fluid at the time of processing the learning target substrate using the substrate processing device, and
wherein the second abnormality factor information is information relating to a component of the substrate processing device.

3. The learned model generating method according to claim 1,
wherein the object is the processing fluid, and
wherein the physical quantity represents a physical quantity of the processing fluid inside a discharge pipe that discharges the processing fluid.

4. The learned model generating method according to claim 1,
wherein the object is the processing fluid, and
wherein the physical quantity represents a flow rate of the processing fluid, a temperature of the processing fluid, or a density of the processing fluid.

5. The learned model generating method according to claim 1,
wherein the object is a substrate holding part that rotates the learning target substrate, an arm that moves a nozzle discharging the processing fluid toward the learning target substrate, a guard that receives the processing fluid scattered from the learning target substrate, or a valve that controls a flow of the processing fluid,
wherein, in a case in which the object is the substrate holding part, the physical quantity represents a quantity relating to an operation and/or a state of the substrate holding part,
wherein, in a case in which the object is the arm, the physical quantity represents a quantity relating to an operation and/or a state of the arm,
wherein, in a case in which the object is the guard, the physical quantity represents a quantity relating to an operation and/or a state of the guard, and
wherein, in a case in which the object is the valve, the physical quantity represents a quantity relating to an operation and/or a state of the valve.

6. The learned model generating method according to claim 1,
wherein the object comprises a blocking plate that covers an upper face of the learning target substrate with a gap interposed therebetween, and
wherein, in a case in which the object is the blocking plate, the physical quantity represents a quantity relating to an operation and/or a state of the blocking plate.

7. The learned model generating method according to claim 1,
wherein the feature quantity further comprises second feature quantity information, and
wherein the second feature quantity information is processing order information representing an order of processing for a predetermined number of learning target substrates configuring one lot or lot interval information representing a time interval from the end of processing of a lot to the start of processing of a next lot.

8. An abnormality factor estimating device that estimates a factor of an abnormality of a processing target substrate after processing using a processing fluid, the abnormality factor estimating device comprising:
a storage part configured to store a learned model that is constructed by performing machine learning of learning data; and
an estimation part configured to input input information to the learned model and acquire output information from the learned model,
wherein the learning data comprises a feature quantity and abnormality factor information,
wherein the abnormality factor information represents a factor of an abnormality of the learning target substrate after processing using the processing fluid,
wherein the feature quantity comprises first feature quantity information representing a feature of a time transition of section data in time series data representing a physical quantity of an object used by a substrate processing device that processes the learning target substrate using the processing fluid,
wherein the first feature quantity information is represented using times,
wherein the input information comprises first input information representing a feature of a time transition of section data in the time series data representing a physical quantity of an object used by the substrate processing device that processes the processing target substrate using the processing fluid,
wherein the first input information is represented using times,
wherein the output information represents a factor of an abnormality of the processing target substrate after processing using the processing fluid,
wherein each of the first feature quantity information and the first input information comprises at least one of first information, second information, third information, fourth information, fifth information, and sixth information,
wherein the first information is information representing a state of the physical quantity when the physical quantity increases toward a target value,
wherein the second information is information representing an overshoot of the physical quantity,
wherein the third information is information representing variations of the physical quantity,
wherein the fourth information is information representing the state of the physical quantity when the physical quantity decreases from the target value,
wherein, when the substrate processing device uses at least two different objects, the fifth information is information representing an overlap between the physical quantity of one object out of the two objects and the physical quantity of the other object, and
wherein the sixth information is information representing a time interval on a time axis between the one object and the other object.

9. The abnormality factor estimating device according to claim 8,
wherein the abnormality factor information comprises at least one of first abnormality factor information and second abnormality factor information,
wherein the first abnormality factor information is information relating to the processing fluid at the time of processing the learning target substrate using the substrate processing device,
wherein the second abnormality factor information is information relating to a component of the substrate processing device that processes the learning target substrate,
wherein the output information comprises at least one of first output information and second output information,
wherein the first output information is information relating to the processing fluid at the time of processing the processing target substrate using the substrate processing device, and
wherein the second output information is information relating to a component of the substrate processing device that processes the processing target substrate.

10. The abnormality factor estimating device according to claim 8,
   wherein the object is the processing fluid, and
   wherein the physical quantity represents a physical quantity of the processing fluid inside a discharge pipe that discharges the processing fluid.

11. The abnormality factor estimating device according to claim 8,
   wherein the object is the processing fluid, and
   wherein the physical quantity represents a flow rate of the processing fluid, a temperature of the processing fluid, or a density of the processing fluid.

12. The abnormality factor estimating device according to claim 8,
   wherein the object used by the substrate processing device that processes the learning target substrate is a substrate holding part that rotates the learning target substrate, an arm that moves a nozzle discharging the processing fluid toward the learning target substrate, a guard that receives the processing fluid scattered from the learning target substrate, or a valve that controls a flow of the processing fluid,
   wherein the object used by the substrate processing device that processes the processing target substrate is a substrate holding part that rotates the processing target substrate, an arm that moves a nozzle discharging the processing fluid toward the processing target substrate, a guard that receives the processing fluid scattered from the processing target substrate, or a valve that controls a flow of the processing fluid,
   wherein, in a case in which the object is the substrate holding part, the physical quantity represents a quantity relating to an operation and/or a state of the substrate holding part,
   wherein, in a case in which the object is the arm, the physical quantity represents a quantity relating to an operation and/or a state of the arm,
   wherein, in a case in which the object is the guard, the physical quantity represents a quantity relating to an operation and/or a state of the guard, and
   wherein, in a case in which the object is the valve, the physical quantity represents a quantity relating to an operation and/or a state of the valve.

13. The abnormality factor estimating device according to claim 8,
   wherein the object used by the substrate processing device that processes the learning target substrate comprises a blocking plate that covers an upper face of the learning target substrate with a gap interposed therebetween,
   wherein the object used by the substrate processing device that processes the processing target substrate comprises a blocking plate that covers an upper face of the processing target substrate with a gap interposed therebetween, and
   wherein, in a case in which the object is the blocking plate, the physical quantity represents a quantity relating to an operation and/or a state of the blocking plate.

14. The abnormality factor estimating device according to claim 8,
   wherein the feature quantity further comprises second feature quantity information,
   wherein the second feature quantity information is processing order information representing an order of processing for a predetermined number of learning target substrates configuring one lot or lot interval information representing a time interval from the end of processing of a lot to the start of processing of a next lot,
   wherein the input information further comprises second input information relating to the processing target substrate, and
   wherein the second input information is processing order information representing an order of processing for a predetermined number of processing target substrates configuring one lot or lot interval information representing a time interval from the end of processing of a lot to the start of processing of a next lot.

15. A substrate processing device comprising:
   the abnormality factor estimating device according to claim 8; and
   a processing device configured to process a substrate.

16. An abnormality factor estimating method for estimating a factor of an abnormality of a processing target substrate after processing using a processing fluid, the abnormality factor estimating method comprising:
   acquiring input information; and
   inputting the input information to a learned model that is constructed by performing machine learning of learning data and acquiring output information from the learned model,
   wherein the learning data comprises a feature quantity and abnormality factor information,
   wherein the abnormality factor information represents a factor of an abnormality of a learning target substrate after processing using the processing fluid,
   wherein the feature quantity comprises feature quantity information representing a feature of a time transition of section data in time series data representing a physical quantity of an object used by a substrate processing device that processes the learning target substrate using the processing fluid,
   wherein the feature quantity information is represented using times,
   wherein the input information comprises information representing a feature of a time transition of section data in the time series data representing the physical quantity of the object used by the substrate processing device that processes the processing target substrate using the processing fluid,
   wherein the information is represented using times,
   wherein the output information represents a factor of an abnormality of the processing target substrate after processing using the processing fluid,
   wherein each of the feature quantity information and the input information comprises at least one of first information, second information, third information, fourth information, fifth information, and sixth information,
   wherein the first information is information representing a state of the physical quantity when the physical quantity increases toward a target value,
   wherein the second information is information representing an overshoot of the physical quantity,
   wherein the third information is information representing variations of the physical quantity,
   wherein the fourth information is information representing the state of the physical quantity when the physical quantity decreases from the target value,
   wherein, when the substrate processing device uses at least two different objects, the fifth information is information representing an overlap between the physical quantity of one object out of the two objects and the physical quantity of the other object, and wherein the sixth information is information representing a time interval on a time axis between the one object and the other object.

17. A learning method comprising:
acquiring learning data; and
performing machine learning of the learning data,
wherein the learning data comprises a feature quantity and abnormality factor information,
wherein the abnormality factor information represents a factor of an abnormality of a learning target substrate after processing using a processing fluid,
wherein the feature quantity comprises feature quantity information representing a feature of a time transition of section data in time series data representing a physical quantity of an object used by a substrate processing device that processes the learning target substrate using the processing fluid,
wherein the feature quantity information is represented using times,
wherein the feature quantity information comprises at least one of first information, second information, third information, fourth information, fifth information, and sixth information,
wherein the first information is information representing a state of the physical quantity when the physical quantity increases toward a target value,
wherein the second information is information representing an overshoot of the physical quantity,
wherein the third information is information representing variations of the physical quantity,
wherein the fourth information is information representing the state of the physical quantity when the physical quantity decreases from the target value,
wherein, when the substrate processing device uses at least two different objects, the fifth information is information representing an overlap between the physical quantity of one object out of the two objects and the physical quantity of the other object, and
wherein the sixth information is information representing a time interval on a time axis between the one object and the other object.

18. A learning device comprising:
a storage part configured to store learning data; and
a learning part configured to performing machine learning of the learning data,
wherein the learning data comprises a feature quantity and abnormality factor information,
wherein the abnormality factor information represents a factor of an abnormality of a learning target substrate after processing using a processing fluid,
wherein the feature quantity comprises feature quantity information representing a feature of a time transition of section data in time series data representing a physical quantity of an object used by a substrate processing device that processes the learning target substrate using the processing fluid,
wherein the feature quantity information is represented using times,
wherein the feature quantity information comprises at least one of first information, second information, third information, fourth information, fifth information, and sixth information,
wherein the first information is information representing a state of the physical quantity when the physical quantity increases toward a target value,
wherein the second information is information representing an overshoot of the physical quantity,
wherein the third information is information representing variations of the physical quantity,
wherein the fourth information is information representing the state of the physical quantity when the physical quantity decreases from the target value,
wherein, when the substrate processing device uses at least two different objects, the fifth information is information representing an overlap between the physical quantity of one object out of the two objects and the physical quantity of the other object, and
wherein the sixth information is information representing a time interval on a time axis between the one object and the other object.

19. A learning data generating method comprising:
acquiring at least one piece of section data from time series data representing a physical quantity of an object used by a substrate processing device that processes a learning target substrate using a processing fluid;
calculating feature quantity information representing a feature of a time transition of the section data; and
performing control of a storage part such that the feature quantity information is stored in association with abnormality factor information,
wherein the abnormality factor information represents a factor of an abnormality of the learning target substrate after processing using the processing fluid,
wherein the feature quantity information is represented using times,
wherein the feature quantity information and the abnormality factor information configure learning data that is a target for machine learning,
wherein the feature quantity information comprises at least one of first information, second information, third information, fourth information, fifth information, and sixth information,
wherein the first information is information representing a state of the physical quantity when the physical quantity increases toward a target value,
wherein the second information is information representing an overshoot of the physical quantity,
wherein the third information is information representing variations of the physical quantity,
wherein the fourth information is information representing the state of the physical quantity when the physical quantity decreases from the target value,
wherein, when the substrate processing device uses at least two different objects, the fifth information is information representing an overlap between the physical quantity of one object out of the two objects and the physical quantity of the other object, and
wherein the sixth information is information representing a time interval on a time axis between the one object and the other object.

* * * * *